United States Patent
Leahy et al.

(10) Patent No.: US 11,697,582 B2
(45) Date of Patent: Jul. 11, 2023

(54) MEMS TRANSDUCER

(71) Applicant: Soundskrit Inc., Montreal (CA)

(72) Inventors: Stephane Leahy, Montreal (CA);
Wan-Thai Hsu, Saline, MI (US);
Mohsin Nawaz, Ann Arbor, MI (US);
Carly Stalder, Montreal (CA); Sahil Gupta, Montreal (CA); Meysam Daeichin, Sunnyvale, CA (US)

(73) Assignee: Soundskrit Inc., Montreal (CA)

( * ) Notice: Subject to any disclaimer, the term of this patent is extended or adjusted under 35 U.S.C. 154(b) by 0 days.

(21) Appl. No.: 17/840,131

(22) Filed: Jun. 14, 2022

(65) Prior Publication Data
US 2022/0396470 A1 Dec. 15, 2022

Related U.S. Application Data

(60) Provisional application No. 63/280,003, filed on Nov. 16, 2021, provisional application No. 63/210,183, filed on Jun. 14, 2021.

(51) Int. Cl.
*B81B 3/00* (2006.01)
*B81B 7/02* (2006.01)
*H04R 19/04* (2006.01)

(52) U.S. Cl.
CPC ........... *B81B 3/0021* (2013.01); *B81B 7/02* (2013.01); *H04R 19/04* (2013.01); *B81B 2201/0257* (2013.01); *B81B 2203/0118* (2013.01); *B81B 2203/0127* (2013.01); *B81B 2203/0136* (2013.01); *B81B 2203/0172* (2013.01); *B81B 2203/056* (2013.01); *B81B 2203/06* (2013.01); *H04R 2201/003* (2013.01)

(58) Field of Classification Search
CPC ................. H04R 19/04; B81B 2201/0257
See application file for complete search history.

(56) References Cited

U.S. PATENT DOCUMENTS

| | | | |
|---|---|---|---|
| 2005/0024165 A1 | 2/2005 | Hsu | |
| 2013/0140655 A1* | 6/2013 | Yeh | H04R 31/006 438/51 |
| 2015/0304777 A1* | 10/2015 | Xu | H04R 29/004 381/58 |

FOREIGN PATENT DOCUMENTS

| | | |
|---|---|---|
| JP | 106237143 A | 8/1994 |
| JP | 2000312126 A | 11/2000 |
| WO | 2019226958 A1 | 11/2019 |

OTHER PUBLICATIONS

International Search Report and Written Opinion of the International Searching Authority in International Patent Application No. PCT/US2022/033439, dated Sep. 23, 2022, 9 pages.

(Continued)

*Primary Examiner* — Moazzam Hossain
(74) *Attorney, Agent, or Firm* — Lempia Summerfield Katz LLC

(57) ABSTRACT

A microelectromechanical system (MEMS) transducer includes a substrate and a pair of electrodes supported by the substrate. The pair of electrodes are configured as a bias electrode-sense electrode couple. A moveable electrode of the pair of electrodes is configured for vibrational movement in a first direction during excitation of the moveable electrode. The pair of electrodes are spaced apart from one another by a gap in a second direction perpendicular to the first direction. The moveable electrode includes a cantilevered end, the cantilevered end being warped to exhibit a resting deflection along the first direction.

30 Claims, 33 Drawing Sheets

(56) References Cited

OTHER PUBLICATIONS

Miles et al., "A flow-sensing velocity microphone", 2019, 4 pages.
R.N. Miles et al., "Sound-Induced Motion of a Nanoscale Fiber", Journal of Vibrations and Acoustics, 2017, 7 pages.
R.N. Miles, "A compliant capacitive sensor for acoustics: Avoiding electrostatic forces at high bias voltages", IEEE Sensors Journal, 2018, 8 pages.
Zhou et al., "Sensing fluctuating airflow with spider silk", PNAS, Nov. 14, 2017, pp. 12120-12125, vol. 114, No. 46.

* cited by examiner

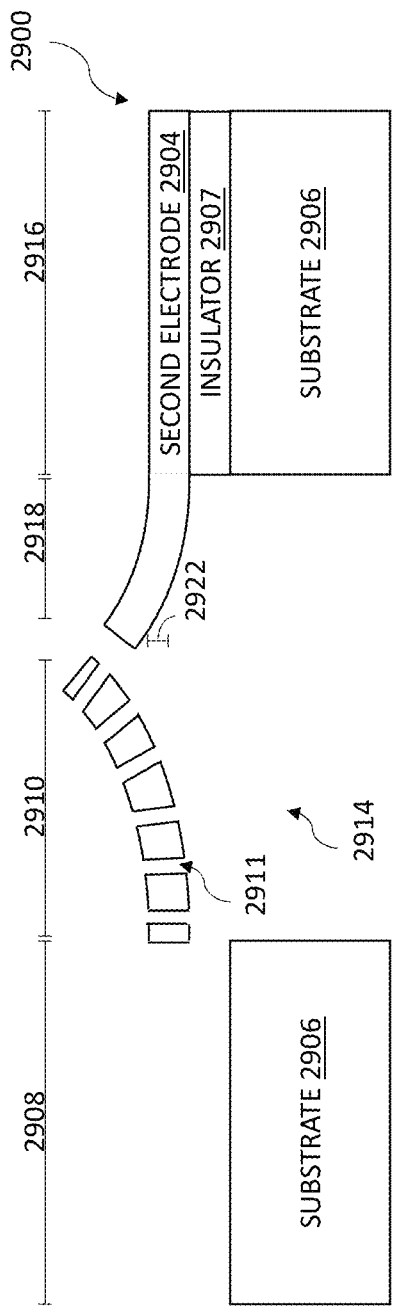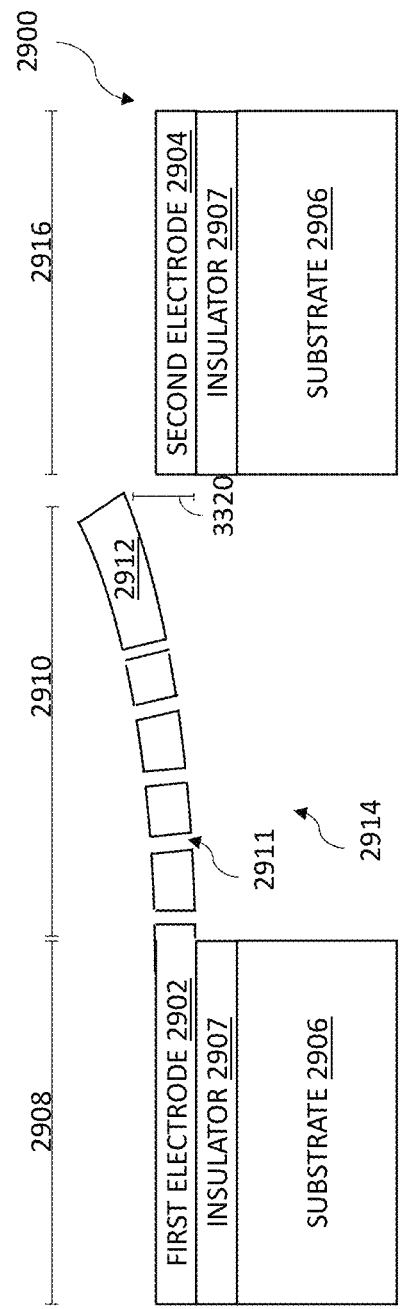

MEMS TRANSDUCER

CROSS-REFERENCES TO RELATED APPLICATIONS

This application claims the benefit of U.S. provisional application entitled "MEMS Flow-Based Microphone," filed Jun. 14, 2021, and assigned Ser. No. 63/210,183, as well as U.S. provisional application entitled "MEMS Flow-Based Microphone," filed Nov. 16, 2021, and assigned Ser. No. 63/280,003, the entire disclosures of which are hereby expressly incorporated by reference.

BACKGROUND OF THE DISCLOSURE

Field of the Disclosure

The disclosure relates generally to microelectromechanical system (MEMS) microphones.

Brief Description of Related Technology

Directional microphones are designed to have high sensitivity to sound travelling in one direction and low sensitivity to sound travelling in another direction. In this manner, directional microphones have a selectivity towards sounds emanating from a certain direction. When combined with further processing capabilities, directionality allows acoustic sensing devices to localize and separate sound sources based on their direction.

Traditional directional microphones respond to the pressure of incoming sound waves. A transducer, or membrane, that moves in response to incoming sound is encapsulated in a package. The membrane partitions the package into two air volumes, a front volume and a back volume. The microphone package further has two sound ports. A first sound port couples the front volume of air to the outside ambient air at a first location. A second sound port couples the back volume of air to the outside ambient air at a second location spaced at some distance from the first location. As a sound wave travels past the microphone, the sound wave creates a first local pressure at the location of the first sound port and a second local pressure at the location of the second sound port. The difference in the first pressure and second pressure exerts a force on the membrane and cause the membrane to vibrate. The vibrations of the membrane are then converted to an electrical signal through one of a variety of transduction mechanisms such as capacitive, piezoelectric, optical, or piezoresistive readout.

In a typical MEMS capacitive transducer, a fixed electrode, or backplate, is disposed above or below a MEMS membrane, or moving electrode, creating a parallel plate capacitance arrangement with the membrane. As the membrane vibrates in response to pressure differences across opposing sides of its surface, the gap between the fixed electrode and moving membrane decreases and increases in an oscillatory manner. This corresponds to a changing capacitance that can be sensed and amplified as an electrical signal using an application specific circuit (ASIC).

In some parallel plate capacitor cases, there may be a second fixed electrode, or backplate, so that the membrane has a backplate both above and below its surface. In this case, the transducer has two capacitances that change in opposite directions from one another as the membrane vibrates. The difference between the two changing capacitances can be used to provide a signal corresponding to the captured sound wave. In still other cases, the transducer has a single fixed electrode sandwiched between two moving membranes that vibrate synchronously when excited by an external stimulus. Again, two opposing capacitances are created as the moving membranes vibrate.

SUMMARY OF THE DISCLOSURE

In accordance with one aspect of the disclosure, a microelectromechanical system (MEMS) transducer includes a substrate and a pair of electrodes supported by the substrate, the pair of electrodes being configured as a bias electrode-sense electrode couple. A moveable electrode of the pair of electrodes is configured for vibrational movement in a first direction during excitation of the moveable electrode. The pair of electrodes are spaced apart from one another by a gap in a second direction perpendicular to the first direction. The moveable electrode includes a cantilevered end, the cantilevered end being warped to exhibit a resting deflection along the first direction.

In accordance with another aspect of the disclosure, a MEMS transducer includes a substrate and a conductive layer supported by the substrate. The conductive layer includes a pair of electrodes disposed alongside one another, the pair of electrodes being configured as a bias electrode-sense electrode couple. A moveable electrode of the pair of electrodes is configured for vibrational movement in a direction perpendicular to a planar portion of the conductive layer during excitation of the moveable electrode. The moveable electrode includes a cantilevered end, the cantilevered end being warped to exhibit a resting deflection relative to the planar portion.

In accordance with yet another aspect of the disclosure, a MEMS transducer includes a substrate and a pair of electrodes supported by the substrate, the pair of electrodes being configured as a bias electrode-sense electrode couple. A moveable electrode of the pair of electrodes is configured for vibrational movement in a first direction during excitation of the moveable electrode. A further electrode of the pair of electrodes is spaced apart from the moveable electrode by a gap in a second direction perpendicular to the first direction. Each of the pair of electrodes includes a cantilevered end, the cantilevered end being warped to exhibit a resting deflection along the first direction.

In accordance with still another aspect of the disclosure, a MEMS transducer includes a substrate and a pair of electrodes supported by the substrate, the pair of electrodes being configured as a bias electrode-sense electrode couple for the measurement. A moveable electrode of the pair of electrodes is configured for vibrational movement in a first direction during excitation of the moveable electrode. A further electrode of the pair of electrodes is spaced apart from the moveable electrode by a gap in a second direction perpendicular to the first direction. The moveable electrode includes a cantilevered end, the cantilevered end being warped to exhibit a resting deflection along the first direction. The further electrode is shorter than the moveable electrode in the second direction.

In connection with any one of the aforementioned aspects, the transducers described herein may alternatively or additionally include or involve any combination of one or more of the following aspects or features. A fixed electrode of the pair of electrodes has a cantilevered end, the cantilevered end being warped to exhibit a resting deflection along the first direction. The resting deflection is such that the cantilevered end does not reach or cross a midpoint of a fixed electrode of the pair of electrodes during operation in a linear regime. Each electrode of the pair of electrodes includes a respective set of comb fingers, the respective sets of comb fingers being interleaved in a side-by-side arrangement. The moveable electrode includes a porous plate. Each electrode of the pair of electrodes includes a respective set of spaced apart beams, the respective sets of spaced apart beams being disposed in an alternating arrangement. The resting deflection is greater than the vibrational movement of the moveable electrode. The resting deflection corresponds with an equilibrium position attained via application of a bias voltage between the pair of electrodes. The MEMS transducer further includes a conductive layer supported by the substrate, the conductive layer being patterned to define the pair of electrodes. A further electrode of the pair of electrodes is sufficiently shorter than the moveable electrode in the second direction such that the further electrode is effectively not moveable during the excitation of the moveable electrode. The resting deflection is greater than the gap. A fixed electrode of the pair of electrodes has a cantilevered end, the cantilevered end being warped to exhibit a resting deflection along the first direction. The resting deflection is such that the cantilevered end does not reach or cross a midpoint of a fixed electrode of the pair of electrodes during operation in a linear regime. Each electrode of the pair of electrodes includes a respective set of comb fingers, the respective sets of comb fingers being interleaved in a side-by-side arrangement. The planar portion of the moveable electrode includes a porous plate. The MEMS transducer further includes first and second insulator layers, the conductive layer being disposed between the first and second insulator layers. A further electrode of the pair of electrodes is sufficiently shorter than the moveable electrode such that the further electrode is effectively not moveable during the excitation of the moveable electrode. The resting deflection is greater than a thickness of the conductive layer. The pair of electrodes are disposed in a side-by-side arrangement. The resting deflections of the pair of electrodes are different. The resting deflection of the moveable electrode is such that the cantilevered end of the moveable electrode does not reach or cross a midpoint of the further electrode of the pair of electrodes during operation in a linear regime. Each electrode of the pair of electrodes includes a respective set of comb fingers, the respective sets of comb fingers being interleaved in a side-by-side arrangement. The moveable electrode includes a porous plate. The further electrode is sufficiently shorter than the moveable electrode in the second direction such that the further electrode is effectively not moveable during the excitation of the moveable electrode. The resting deflections are greater than the vibrational movement of the moveable electrode. Each electrode of the pair of electrodes includes a respective set of comb fingers. The respective sets of comb fingers being interleaved in a side-by-side arrangement. The moveable electrode includes a porous plate. The resting deflection is greater than the vibrational movement of the moveable electrode, and the further electrode is sufficiently short such that the further electrode is effectively not moveable during the excitation of the moveable electrode.

BRIEF DESCRIPTION OF THE DRAWING FIGURES

For a more complete understanding of the disclosure, reference should be made to the following detailed description and accompanying drawing figures, in which like reference numerals identify like elements in the figures.

FIG. 29B is a side view of a portion B of the MEMS transducer of FIG. 29A.

FIG. 29C is a side view of a portion C of the MEMS transducer of FIG. 29A.

Figure 1:
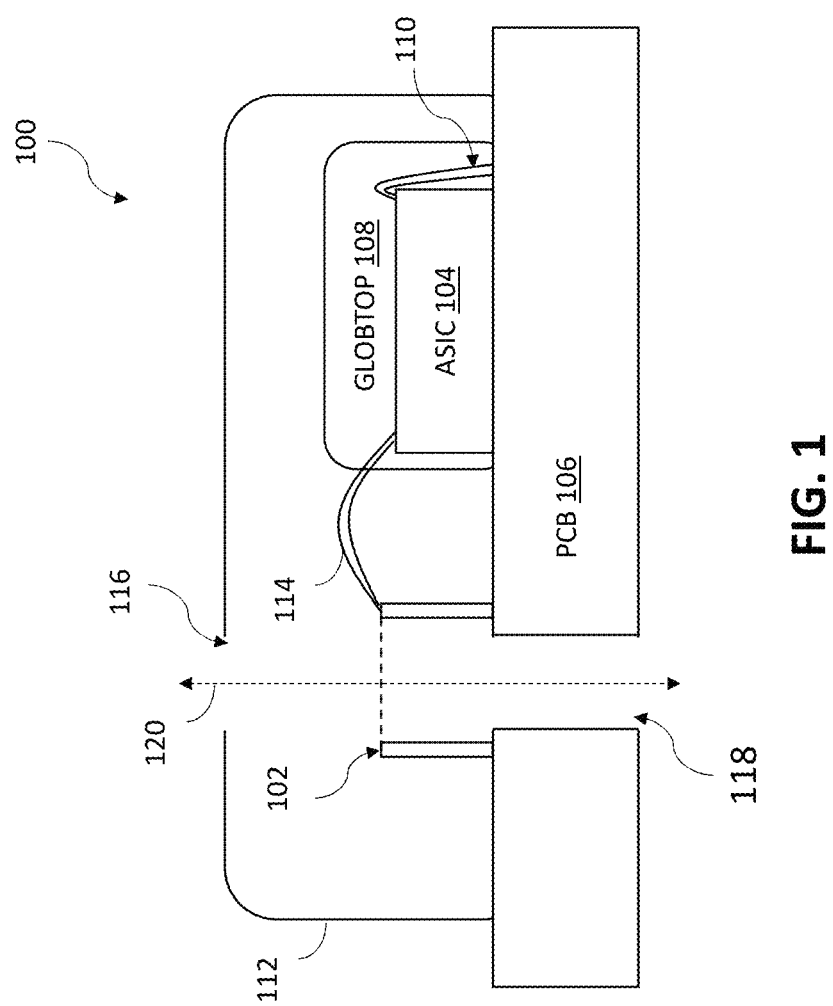
FIG. 1 is a cross-sectional, schematic view of a MEMS transducer in accordance with one example

The embodiments of the disclosed devices may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Transducers having a pair of electrodes for measurement of a viscous medium are described. The pair of electrodes may be disposed alongside one another as a bias electrode-sense electrode couple for the measurement. As described below, one or both of the pair of electrodes has a resting deflection. For instance, a cantilevered end of a moveable electrode of the pair of electrodes may be warped to exhibit a resting deflection. In some cases, a fixed electrode of the pair of electrodes also has a cantilevered end that exhibits a resting deflection. The fixed electrode may be fixed in the sense that the fixed electrode is effectively unmovable by the surrounding medium, e.g., due to being sufficiently shorter than the moveable electrode. In some cases, the transducer includes a conductive layer in which each electrode of the pair of electrodes is formed or disposed.

In some cases, movement of one of the electrodes is driven (e.g., partially driven) by forces due to the flow of the viscous medium past the electrode. For instance, the transducer may respond to acoustic excitation or air flow (e.g., a microphone). The transducer may be oriented such that sound propagating through air flows through its moving (or moveable) element. As the air flows across the moving element, the air flow induces a viscous drag force (e.g., friction) that excites the element and, in some cases, dominates the motion of the element. This type of behavior may be obtainable using small microstructures constructed through MEMS fabrication techniques. Because the moving element will move in the same direction as the air flow, or drag force, the transducer, or sensor, is inherently directional. Air that flows in other directions (i.e., that is not through the moving element) will not excite a response, or at least the response will be substantially attenuated.

In accordance with another aspect, the disclosed transducers may avoid the use of backplates commonly employed by capacitive sensors. The absence of backplates may minimize or lower the acoustic losses experienced by certain capacitive sensors.

The disclosed transducers may be useful in a wide variety of microphone applications and contexts, including, for instance, various consumer devices such as smartphones, laptops, and earbuds. The configuration of the disclosed transducers may be useful in connection with any device in which there is an interest in listening to sound originating from a specific direction with greater sensitivity than sound originating from other directions.

Although described in connection with microphones, the disclosed transducers may be used in other applications and contexts. For instance, the disclosed transducers are useful in connection with accelerometers, gyroscopes, inertial sensors, pressure sensors, gas sensors, etc. In these examples, as the sensor experiences a vibratory event (e.g., an acceleration), the transducer vibrates, and the signal captured by the sensor then serves as an approximation of the motion seen by the sensor. The disclosed transducers are described in the context of excitation by sound waves. However, alternative or additional stimuli may excite the disclosed transducers in other contexts.

Turning now to FIG. 1, a sensor 100 in accordance with one example is depicted. A microelectromechanical (MEMS) transducer, or sensing element, 102 is mounted or otherwise supported by a printed circuit board (PCB) 106. The PCB 106 may include one or multiple layers. The sensor 100 further includes an application-specific integrated circuit (ASIC) 104. The ASIC 104 is configured to read out the electrical signal from the MEMS transducer 102 and covered by a protective glob top 108. The ASIC 104 is also attached to the PCB 106 and may be electrically connected to conductive traces on the PCB 106 by wire bonds 110. Both the MEMS 102 and the ASIC 104 are encapsulated by a lid or other enclosure 112. The lid may be composed of, or otherwise include, a metal, plastic, ceramic, or other material. The MEMS 102 and ASIC 104 may be electrically connected by wire bonds 114, either to each other, or directly to the PCB 106. The MEMS 102, ASIC 104, and lid 112 may also be attached using other methods known to those skilled in the art. In another instance, the MEMS 102 may be attached to the PCB 106 using flip chip techniques. Sensor 100 also has two openings, or ports, 116 and 118. In one example, a first port 116 may sit on the lid 112 and a second port 118 may be embedded in the PCB 106. In another example, the first and second port 116 and 118 may sit on the same surface (e.g., PCB 106 or lid 112). In one example, the sensor 100 is configured to respond to acoustic stimulus (e.g., as a microphone).

Figure 2:
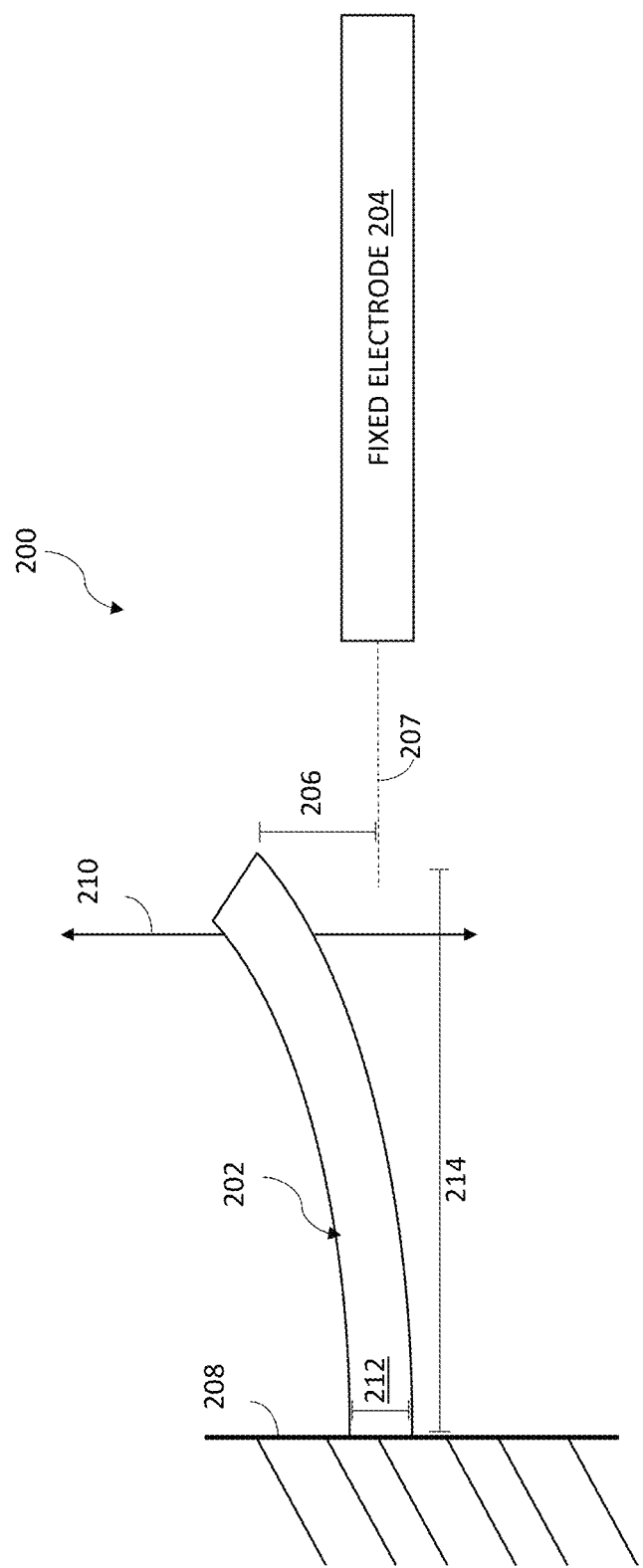
FIG. 2 is a cross-sectional (or side), schematic view of a MEMS transducer in accordance with one example.

FIG. 2 is a cross-sectional (or side) view of the working principle of a MEMS transducer 200 in accordance with one example. The MEMS transducer 200 includes a moving element (or electrode) 202 and a fixed electrode 204. The moving element 202 is anchored on at least on side 208 and free to vibrate along the direction 210. The fixed electrode 204 is constructed such that the fixed electrode exhibits no, or reduced, motion along the direction 210 relative to moving electrode 202 when subject to the same external stimulus. Thus, the position of the moving element 202 along the direction 210 relative to the fixed electrode 204 changes in response to a sound wave along direction 210. The moving element 202 has a thickness 212. The thickness 212 may be sufficiently small such that the motion of the moving element 202 is primarily dominated by the surrounding medium in which the moving element vibrates (e.g., the moving element is driven by the movement of air around the moving element). In some examples, the thickness of the moving element 212 may be less than 2 microns (um) or less than 3 um. The moving element 202 and fixed electrode 204 have at least one conductive layer each such that a capacitance is established between the moving element 202 and fixed electrode 204. Unlike parallel plate capacitors where the two electrodes are typically positioned above one another, the moving element, or moving electrode, 202 is positioned to the side of the fixed electrode 204. The electrodes 202 and 204 may accordingly be referred to herein as side-by-side.

The moving electrode 202 includes a number of portions. Some or all of the portions may be cantilevered or suspended. The portions may be characterized in terms of position relative to an anchor. In this example, the moving electrode 202 includes a proximate portion and a distal portion extending outward from the proximate portion. The distal portion defines a gap between the moving and fixed electrodes to establish a capacitance indicative of the vibrational movement. Other portions of the moving electrode 202 may contribute to the capacitance, including, for instance, the proximate portion. Thus, and as shown in connection with a number of examples described herein, the gap may be considered to establish a capacitance regardless of the extent to which other portions of the moving electrode 202 also contribute to the capacitance. The length of the distal portion of the moving electrode 202 may be set such that it maintains a specific ratio compared to the length proximate portion. For example, the length of the distal portion may be equal to, two times, or three times the length of the proximate portion. The length of the proximate portion may be about 50 um to about 250 um and the length of the distal portion may be about 50 um to about 500 um, but other amounts may be used.

The distal portion of the moving electrode 202 has a resting warping or other deflection relative to the proximate portion. In this example, the fixed electrode 204 has a midpoint 207 in the direction of the movement (e.g., equidistant between outer—upper and lower—surfaces of the fixed electrode). Moving electrode 202 has an initial or otherwise resting deflection 206 relative to the fixed electrode 204 and midpoint 207. In the example of FIG. 2, the initial deflection is between a tip of the moving electrode and the midpoint. In some cases, the resting deflection may arise from warping of the moving electrode 202 during fabrication. When the transducer 200 is not subject to any sound and is at equilibrium, the moving electrode 202 is offset by deflection 206. The resting deflection may correspond with the position attained after application of a bias voltage, but without excitation by the medium. In some cases, the moving electrode 202 has an initial deflection 206 above the midpoint 207. In other cases, the moving electrode 202 has an initial deflection 206 below the midpoint 207. The initial deflection 206 may be greater than the height of the fixed electrode 204. In some examples, the initial deflection 206 may fall in a range from about 5 um to about 50 um, but other amounts may be used.

A capacitance is formed between the moving electrode 202 and the fixed electrode 204. As the moving electrode 202 experiences motion along the direction 210, the capacitance between the moving electrode 202 and fixed electrode 204 may change. As the moving electrode 202 approaches the fixed electrode 204 and midpoint 207, the capacitance increases. As the moving electrode 202 moves away from the fixed electrode 204 and midpoint 207, the capacitance decreases. The changes in capacitance between the moving electrode 202 and fixed electrode 204 can then be converted into an electronic signal that represents the motion of the moving electrode 202.

The initial deflection may be such that the distal portion of the moving electrode 202 does not reach or cross the fixed electrode 204 (e.g., the midpoint 207), or any other bias or sense electrode of the transducer, in the direction of the vibrational movement during operation in a linear regime of the measurement. In the example of FIG. 2, during operation in the linear regime, the tip of the moving electrode 202 does not cross the midpoint 207. In other words, the initial deflection 206 remains non-zero during operation of transducer 200. The linear regime may correspond with sound waves having certain one or more characteristics that fall within a certain range, including, for instance, a pressure (e.g., about 20 uPa to about 1 Pa) and a frequency (e.g., about 20 Hz to about 20 kHz). The specific ranges of sound waves that correspond to the linear regime may vary based on the transducer and/or the application in which the transducer is used. For instance, the transducer may operate in the linear regime when subject to sound waves in typical acoustic environments (e.g., in a home, outside, in an office room, in a vehicle, etc.). Sound waves in a typical acoustic environment may include human speech, noise from a speaker or TV, noise from a vehicle, noise from home appliances, etc. In some scenarios where the transducer is placed close to a loudspeaker (e.g., in a smart speaker, conference phone, TV, etc.), the linear regime may correspond to sound waves with a sound pressure level above 1 Pa. In some cases, the linear regime may correspond with sound waves having a frequency above 100 Hz or above 300 Hz. When the sound waves fall outside one or more of the above-identified ranges, then, in some cases, the transducer may operate in a non-linear regime in which the moving electrode reaches and/or crosses the fixed electrode. When the moving electrode reaches and/or crosses the fixed electrode, distortion may be present in the output of the microphone. It may be acceptable for the transducer to operate in a non-linear regime when subject to sound waves with a large sound pressure level. The initial deflection of the transducer and corresponding bias voltage used are set such that the distortion of the transducer when subject to loud sound pressures in minimized or otherwise reduced. For example, the transducer may operate in a non-linear regime when subject to a sound wave with a sound pressure level of 10 Pa such that the output maintains a total harmonic distortion between 1%-5% or less.

The electrode 202 may be warped or initially deflected above or below the fixed electrode 204. For instance, the initial deflection may be either away from (positive) or toward (negative) a substrate by which the electrode 202 is supported along the direction 210. Each of the examples described herein may exhibit such positive or negative warping.

A fixed bias voltage may be placed on one of the electrodes 202 or 204. As the moving electrode 202 moves along direction 210, this may result in a change in the charge and/or voltage seen at the electrode 202 or 204 on which there is no bias voltage placed. In one example, a bias voltage is placed on the moving electrode 202 and the fixed electrode 204 is connected to a voltage amplifier that holds the charge on the fixed electrode 204 constant and amplifies the voltage change seen on the fixed electrode as the moving electrode 202 vibrates. The fixed electrode 204 may be instead connected to a charge amplifier that holds the voltage on the fixed electrode 204 constant and amplifies the charge change seen at on the fixed electrode as the moving electrode 202 vibrates. In another example, a bias voltage is placed on the fixed electrode 204 and the moving electrode 202 is connected to a voltage amplifier that holds the charge on the moving electrode 202 constant and amplifies the voltage change seen on it as the moving electrode vibrates. The moving electrode 202 may be instead connected to a charge amplifier that holds the voltage on the moving electrode 202 constant and amplifies the charge change seen on the moving electrode as the moving electrode vibrates. The bias voltage used may have a positive or negative value. The bias voltage may further have a DC and/or an AC component. In some examples, as a bias voltage is placed on electrode 202 or 204, the initial deflection 206 may reflect the equilibrium position attained via application of the bias voltage (e.g., the deflection may increase or decrease relative to the fixed electrode 204). The initial deflection 206 experienced may thus be dependent on the amplitude of the bias voltage and/or mechanical properties of the electrodes 202 and 204.

The moving element 202 has a length 214, thickness 212, and width that extends through the page of the drawing. In some examples the fixed electrode 204 may surround all sides of the moving element 202 and element 202 may experience an electrostatic force in the directional perpendicular to the direction of motion 210. Since the element 202 is anchored at edge 208, the element is made stiff along the direction parallel to its length 214 to not be significantly affected by the electrostatic force in that direction. Additionally, the element 202 may be constructed so that the element 202 is stiff along the direction parallel to its width to not be significantly affected by an electrostatic force in that direction. For example, the element 202 may have a length 214 greater than its width and/or thickness 212. Additionally, element 202 may had a width similar to or greater than its thickness 212. In some examples, the moving element 202 is constructed such that only the electrostatic force generated in the direction 210 when placed under bias affects the equilibrium position of the element 202.

As described herein, the initial deflection 206 of the moving electrode 202 may be sufficiently large such that the deflection 206 is always greater than zero (or always less than zero) as the moving structure 202 vibrates during operation. For example, for sound waves propagating with a frequency between 20 Hz-20 kHz and with a sound pressure level approximately and sometimes greater than 120 dB, the deflection 206 of the moving electrode 202 may always remain positive such that the moving electrode does not align with fixed electrode 204. In some examples, the initial deflection 206 may be between 10 um-50 um.

When a bias voltage is placed on either the moving electrode 202 or fixed electrode 204, the initial deflection 206 may change. For example, the initial deflection 206 may reduce with the presence of an electrical potential between the moving electrode 202 and fixed electrode 204. A bias voltage may be used such that the initial deflection 206 remains nonzero and moving electrode 202 is not aligned with fixed electrode 204. In some examples, a bias voltage between 1V-50V may be used.

Figure 3:
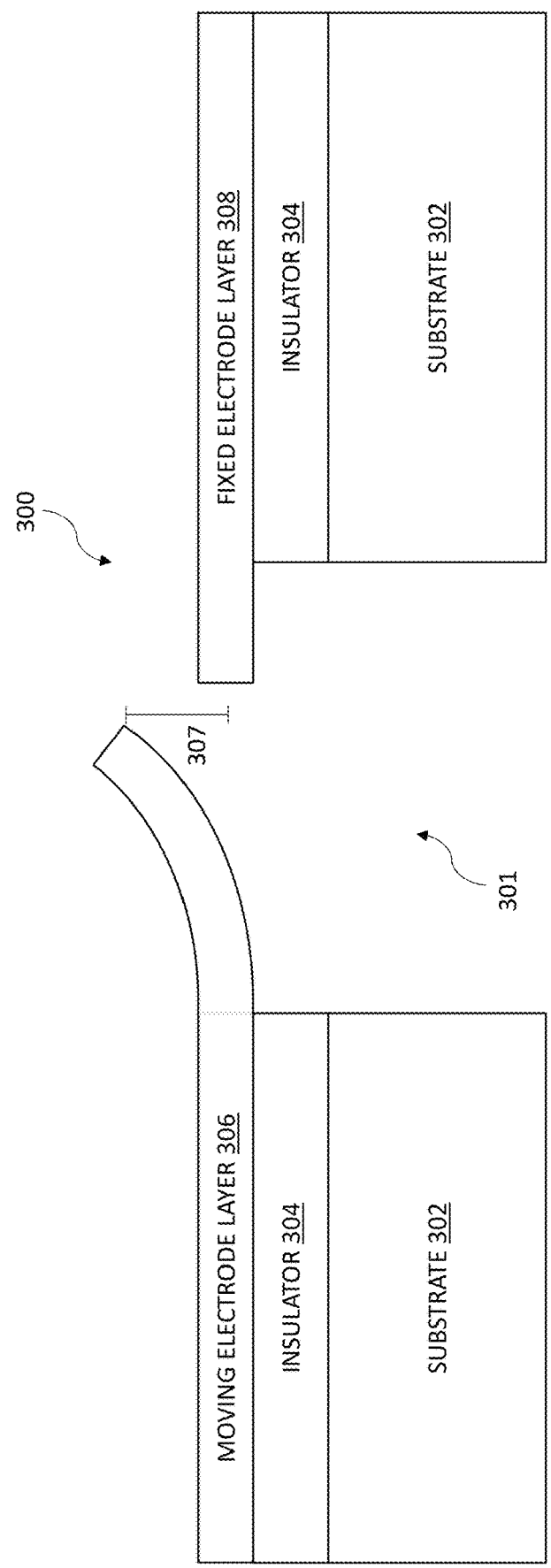
FIG. 3 is a cross-sectional (or side) view of a MEMS transducer in accordance with one example.

FIG. 3 depicts a cross-sectional (or side) view of a transducer 300 in accordance with one example. The transducer 300 may operate in a manner similar to the example of FIG. 2. Transducer 300 includes a moving electrode layer 306 with initial deflection 307 relative to fixed electrode layer 308. The moving electrode layer 306 and fixed electrode layer 308 are anchored to a substrate 302 through insulator 304 on at least one side. The fixed electrode 308 is constructed so that the fixed electrode exhibits less motion when subject to an external stimulus relative to the moving electrode 306. The external stimulus may be, in some examples, a sound wave. The substrate 302 may be composed of, or otherwise include, silicon, glass, or other material. The insulator 304 may include one or multiple layers including any combination of silicon, oxide, nitride, or a polymer. For example, insulator 304 may be composed of, or otherwise include, a thermal oxide. The moving electrode layer 306 and fixed electrode layer 308 may include of one or multiple layers. The moving electrode layer 306 and fixed electrode layer 308 may be conductive and be composed of, or otherwise include, any combination of silicon, oxide, nitride, or a polymer. For example, the moving electrode layer 306 and/or fixed electrode layer 308 may be composed of, or otherwise include, silicon, doped silicon, polysilicon, amorphous silicon, or include a metal such as aluminum, copper, gold, or tungsten. In some examples, the moving electrode layer 306 and fixed electrode layer 308 are deposited during the same manufacturing step as a single layer (e.g., polysilicon). In one example, the moving electrode layer 306 and fixed electrode layer 308 may have a thickness falling in a range from about 50 nm to about 1000 nm, but other thicknesses may be used. The thickness of the moving electrode layer 306 and the fixed electrode layer 308 may be the same or different.

In one example, the moving electrode layer 306 is given a bias voltage that may have a DC and/or an AC component. The bias voltage may be positive or negative. The fixed electrode layer 308 is connected to an amplifier. In another example, the fixed electrode layer 308 is given a bias voltage that may be positive or negative and have a DC and/or an AC component and the moving electrode layer 306 is connected to an amplifier. As the moving electrode layer 306 vibrates and the distance from the fixed electrode layer 307 varies, a signal is generated and amplified by the amplifier.

Figure 4:
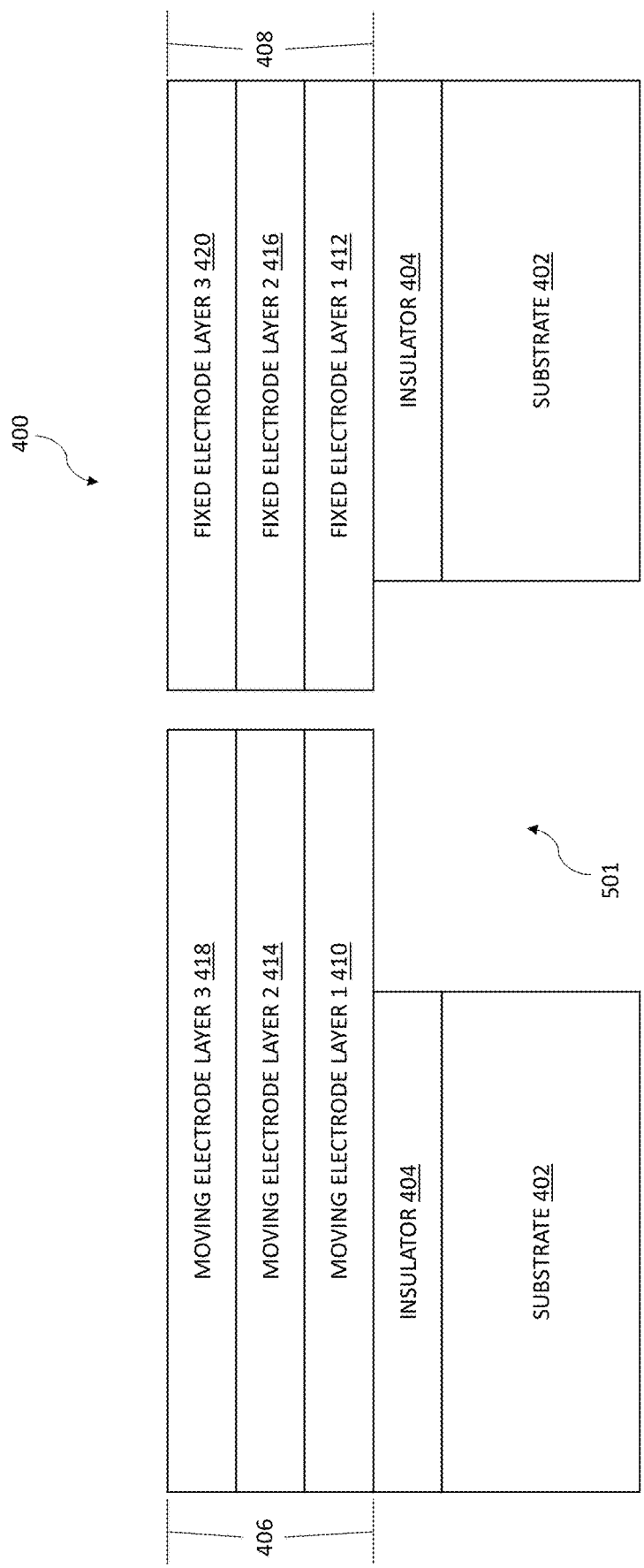
FIG. 4 is a cross-sectional (or side) view of a MEMS transducer in accordance with another example.

FIG. 4 depicts a cross-sectional (or side) view of a transducer 400 in accordance with one example. The transducer 400 may operate in a manner similar to the example of FIG. 2. Transducer 400 includes at least one moving electrode 406 and at least one fixed electrode 408 that exhibits less motion when subject to an external stimulus relative to the moving electrode 406. The external stimulus may be, in some examples, the flow of air through a cavity 401 in the substrate 402. The moving electrode 406 is anchored on at least one side to substrate 402 through insulating layer 404 and is configured to vibrate along the axis transverse to its length. As described above, the insulator 404 may include one or multiple layers including any combination of silicon, oxide, nitride, or a polymer. For example, insulator 404 may be composed of, or otherwise include, a thermal oxide. In some examples, the substrate 402 may be composed of, or otherwise include, silicon.

In the example of FIG. 4, the moving electrode 406 is configured as a composite layer. In this example, the moving electrode 406 includes multiple layers with at least one conductive layer. In the example shown, the moving electrode 406 includes three layers 410, 414, and 418, although additional or alternative layers may be included. In one example, the first moving electrode layer 410 and third moving electrode layer 418 are conductive, separated by a nonconductive, or insulating, second moving electrode layer 414. The second moving electrode layer 414 may include one or multiple layers including any combination of silicon, oxide, nitride, or a polymer. The first moving electrode layer 410 and third moving electrode layer 418 may include one or multiple layers including any combination of silicon, doped silicon, polysilicon, amorphous silicon, or a metal such as aluminum, gold, or tungsten. In another example, the first moving electrode 410 and the third moving electrode layer 418 are insulating, and the second moving electrode layer 414 is conductive, and disposed between the insulating layers.

In one example, the first moving electrode layer 410 may be electrically connected or tied to the third moving electrode layer 418 and the second moving electrode layer 414 may be an insulator. In some cases, a cavity may be etched in the second moving electrode layer 414 and filled by the third moving electrode layer 418 to contact the first moving electrode layer 410. In another example, the first moving electrode layer 410 and third moving electrode layer 418 may both be nonconductive (e.g., insulators) while the second moving electrode layer 414 is conductive. In yet another example, all the moving electrode layers 410, 414, and 418 may be conductive and electrically connected.

The thickness of the first moving electrode layer 410 may fall in a range from about 50 nm to about 1000 nm, but other thicknesses may be used. The thickness of the second moving electrode layer 414 may fall in a range from about 50 nm to about 1000 nm, but other thicknesses may be used. The thickness of the third moving electrode layer 418 may fall in a range from about 50 nm to about 1000 nm, but other thicknesses may be used. The thickness of the first moving electrode layer 410, second moving electrode layer 414, and/or third moving electrode layer 418 may be the same or different. In some examples, the first moving electrode layer 410 is the same thickness as the third moving electrode layer 418. The moving electrode 406 may have an initial deflection as described herein.

The fixed electrode 408 is anchored on at least one side to substrate 402 through insulating layer 404 and configured such that its motion is reduced relative to the moving electrode 406 when subject to the same external stimulus (e.g., a sound wave). In some examples, the fixed electrode 406 maybe be anchored on multiple sides. The fixed electrode 408 may include one or multiple layers with at least one layer being conductive. In one example, the fixed electrode includes at least three layers 412, 416, and 420. The first fixed electrode layer 412 and third fixed electrode layer 420 may be conductive and separated by a nonconductive, or insulating, second fixed electrode layer 416. The second fixed electrode layer 416 may include one or multiple layers including any combination of silicon, oxide, nitride, or a polymer. The first fixed electrode layer 412 and third fixed electrode layer 420 may include one or multiple layers including any combination of silicon, doped silicon, polysilicon, amorphous silicon, or a metal such as aluminum, gold, or tungsten.

In one example, the first fixed electrode layer 412 may be electrically connected to the third fixed electrode layer 420 and the second fixed electrode layer 416 may be an insulator. In some cases, a cavity may be etched in the second fixed electrode layer 416 and filled by the third fixed electrode layer 420 to contact the first fixed electrode layer 412. In another example, the first fixed electrode layer 412 and third fixed electrode layer 420 may both be nonconductive (e.g., insulators) while the second fixed electrode layer 416 is conductive. In yet another example, all the moving fixed layers 412, 416, and 420 may be conductive and electrically connected.

As described above, the moving electrode 406 and fixed electrode 408 may be configured such that the constituent layers (or portions) of each electrode hold only one electrical potential, as in FIG. 2. In one example, the moving electrode 406 is given a bias voltage that may be positive or negative and may have a DC and/or an AC component. The fixed electrode 408 may then be connected to an amplifier. In another example, the fixed electrode 408 is given a bias voltage that may be positive or negative and may have a DC and/or an AC component. The moving electrode 406 may then be connected to an amplifier.

One or more of the conductive layers may include both the moving electrode and the fixed electrode. In some examples, one or multiple layers in the moving electrode 406 and fixed electrode 408 may be formed in the same layer (e.g., deposited during the same manufacturing step). For example, the first moving electrode layer 410 and the first fixed electrode layer 412 may be the same layer. Alternatively or additionally, the moving electrode layers 414 and 418 may be the same layers as the fixed electrode layers 416 and 420, respectively.

The examples in FIGS. 3 and 4 are depicted merely for illustrative purposes and by no means exclude alternative implementations of MEMS transducers that operate as described in FIG. 2. The moving and fixed electrodes may include of any number of layers made of any combination of materials and biased in any number of configurations.

Described below are a number of examples of transducers having an arrangement of moving and fixed electrodes configured as described above. While the layouts and arrangements of the moving and fixed electrodes vary, the electrodes and portions thereof may nonetheless be configured as described above. For instance, the views depicted in FIGS. 2-4 may correspond with a simplified view of a section or portion of the electrode arrangements of the examples described below.

The following figures describe various examples of MEMS transducers respond to acoustic excitation of one or more moving electrodes with an initial deflection. Furthermore, the electrodes are configured in a side-by-side configuration.

Figure 5:
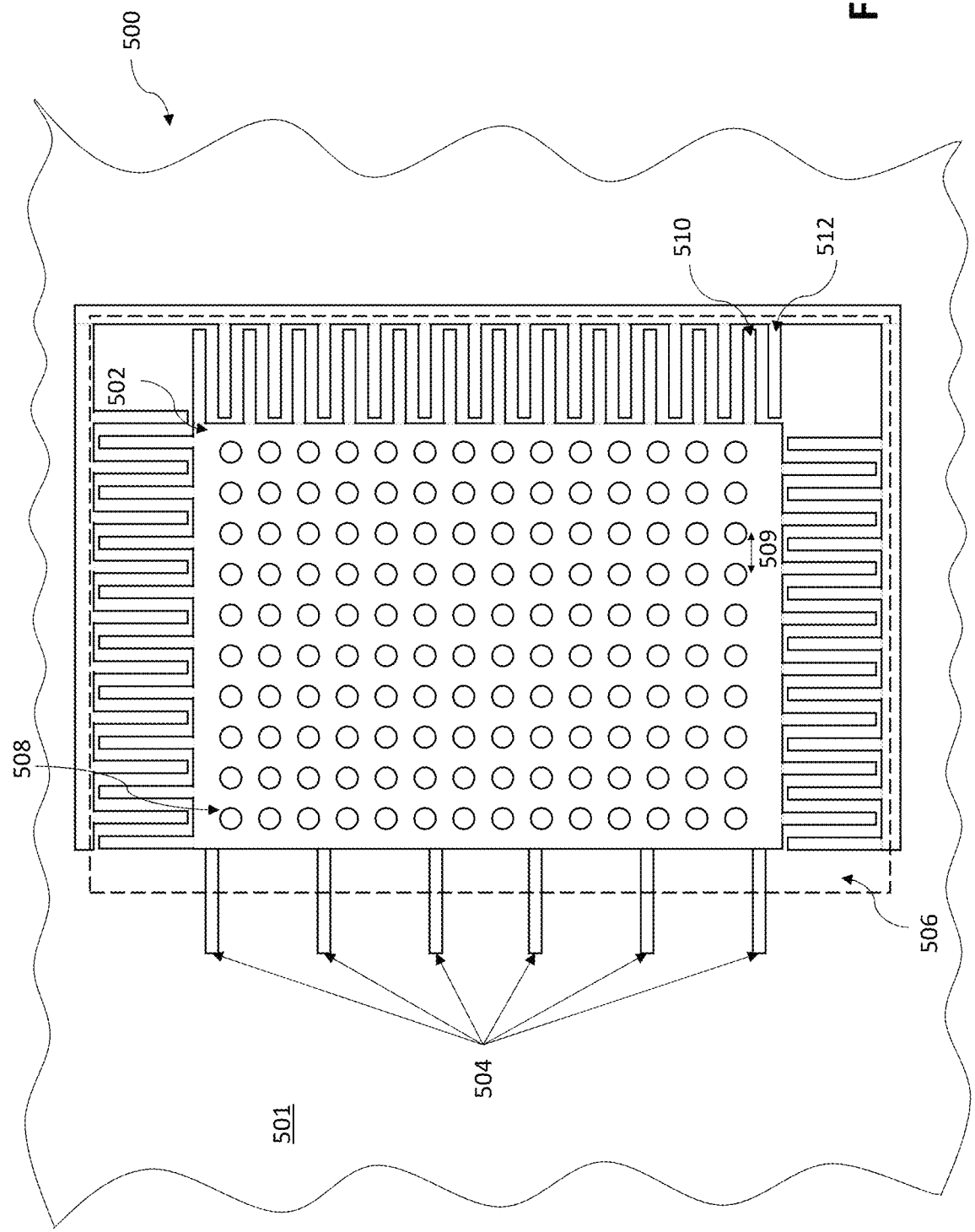
FIG. 5 is a top view schematic of a MEMS transducer with a plate-like diaphragm in accordance with one example.

FIG. 5 depicts a top, schematic view of a transducer 500 with a plate-like diaphragm in accordance with one example. The transducer 500 includes a diaphragm 502 that is attached to a surrounding substrate 501 on one end by one or more anchors 504. The substrate 501 has a cavity 506 above which the diaphragm 502 is positioned. The cavity 506 may be formed through various microfabrication practices, including, for instance, deep reactive ion etching (DRIE). The diaphragm, or plate, 502 includes one or more holes 508. The holes have a spacing 509 between them. In this manner, the diaphragm 502 may be configured as a porous plate. Attached to the free edges of diaphragm 502 are one or more fingers 510. The fingers 510 are configured so that the fingers move with the diaphragm 502. The diaphragm 502 and fingers 510 may thus be considered a single composite moving structure, or electrode. The moving electrode includes at least one conductive layer.

The transducer 500 includes a fixed electrode having fingers 512 fixed to the substrate 501. As the transducer 500 is excited by a sound wave, the fixed fingers 512 do not move, or move relatively less than fingers 510. Fingers 512 include at least one conductive layer such that a capacitance is formed between fingers 510 and 512. As diaphragm 502 vibrates, the gap between fingers 510 and 512 changes. This creates a change in capacitance between fingers 510 and 512 that can be converted into an electronic signal as described in connection with the examples shown in other figures.

The anchors 504 may be configured as, or otherwise include, a single anchor that extends across the width of diaphragm 502, a single anchor with a width less than that of diaphragm 502, or multiple anchors with widths less than diaphragm 502. The top view profile of the anchors 502 may be rectangular, elliptical, triangular, or any other geometrical shape. In some examples, one or more of the anchors 504 may include fillets, or curved corners, at the connection point between the anchor 504 and diaphragm 502 and/or the connection between the anchor 502 and surrounding substrate 501. In some examples, the thickness of the anchors 504 may be greater than the thickness of the diaphragm 502. Similarly, one or more of the anchors 504 may have different thicknesses and/or widths from one another.

The transducer 500 may be designed such that the transducer has a first resonant frequency in the audio band. For example, the first resonant frequency of the transducer 500 may be fall in a range from about 500 Hz to about 5 kHz. Additionally, the transducer 500 may have a second resonant frequency that is close to the end of or outside of the audio band (e.g., greater than 16 kHz).

The diaphragm 502 is illustrated as a rectangle for ease of illustration. The diaphragm 502 may have a top profile that is rectangular, circular, elliptical, triangular, or any other geometrical shape. Similarly, the cavity 506 may have a top profile that is rectangular, circular, elliptical, triangular, or any other geometrical shape. The fingers 510 may cover the entire perimeter of the free ends of the diaphragm 502 or one or more smaller subsections. The fingers 510 may have a thickness that is different than the thickness of diaphragm 502 and/or fingers 512. The fingers 510 and/or 512 may have a top profile that is rectangular, circular, elliptical, triangular, or any other geometrical shape. In some examples, the gap between the fingers 510 and 512 may fall in a range from about 1 um to about 8 um, the length of fingers 510 and 512 may fall in a range from about 50 um to about 250 um, and the width of fingers 510 and 512 may fall in a range from about 1 um to about 20 um. In other examples, the length and/or width of fingers 510 and/or 512 may vary relative to one another. For example, the fingers 510 and/or 512 on at least one of the free sides of diaphragm may have a different length than the remaining sides. In some examples, the gap of at least one set of fingers 510 and 512 along the perimeter of diaphragm 502 may be different than that of another set of fingers. In some examples, the diaphragm 502 may include two or more diaphragms that are coupled electrically and/or mechanically.

In some examples, the spacing 509 between each of the holes 508 may be equal to the diameter of the holes 508. In other examples, the spacing 509 between each of the holes 508 may be less than or greater than the diameter of the holes 508. The spacing 509 may be determined as a ratio of the diameter of the holes 508. For example, the spacing 509 may be half, twice, three times, or four times the diameter of the holes 508. In some examples, the holes 508 may have a diameter between 2 um-60 um and the spacing 509 may be between 2 um and 100 um. In one example, the holes 508 have a diameter of 4 um and the spacing 509 between the holes is 8 um. In yet another example, the holes 508 may vary in size and/or spacing from one another. For example, at least one of the holes 508 may be smaller than another hole on diaphragm 502. The holes 508 may cover the entire surface of diaphragm 502 or one or multiple subsections of diaphragm 502. Furthermore, the holes 508 may have a profile that is rectangular, circular, elliptical, triangular, hexagonal, or any other geometrical shape. In some cases, the diaphragm 502 may not have any holes (e.g., hole-free or non-porous) and, thus, be entirely or completely solid.

Figure 6:
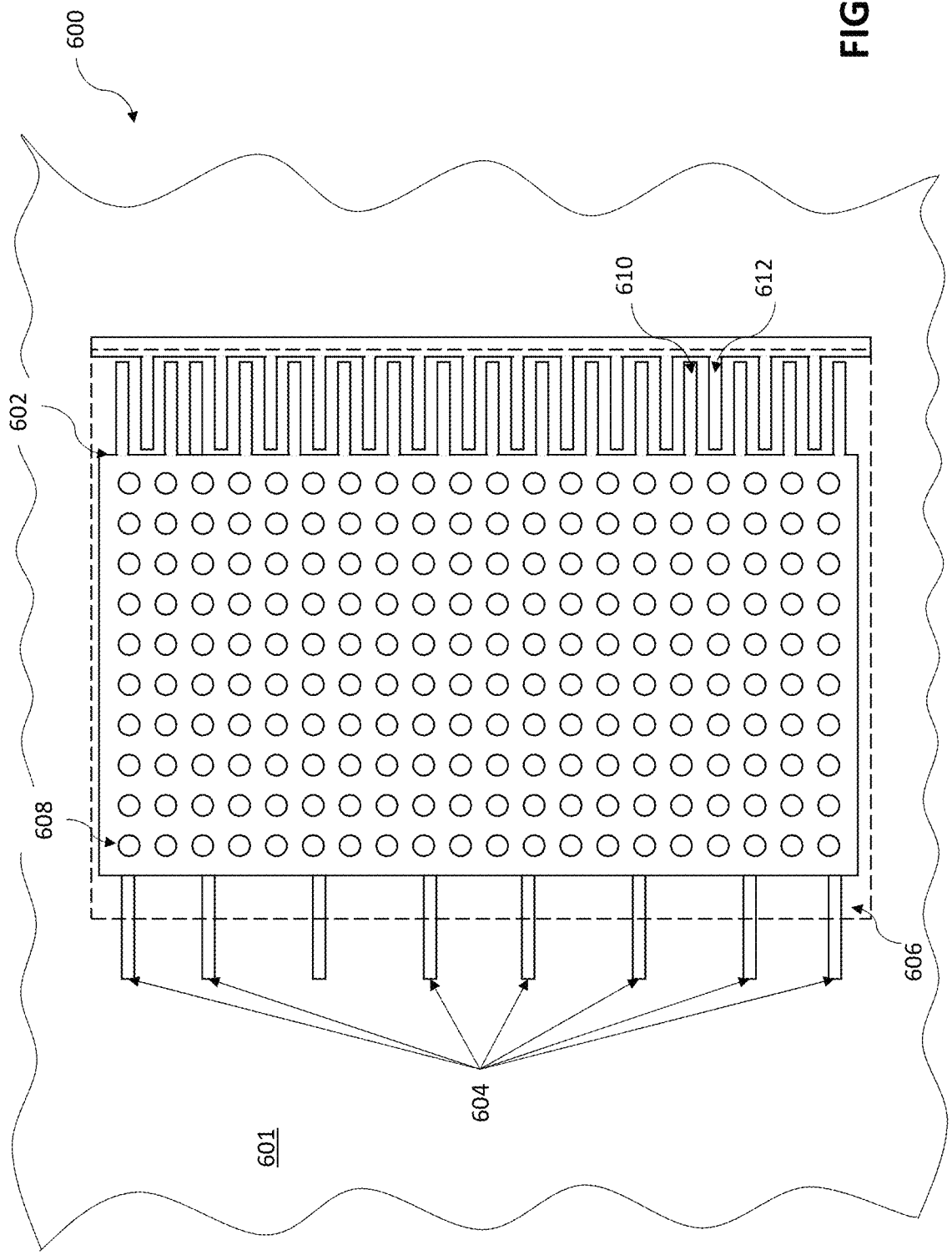
FIG. 6 is a top view schematic of a MEMS transducer with a plate-like diaphragm in accordance with another example.

FIG. 6 depicts a top, schematic view of a transducer 600 in which fingers are only placed along one edge of a plate-like diaphragm in accordance with one example. The transducer 600 includes a diaphragm 602 that is attached to a surrounding substrate 601 on one end by one or more anchors 604. The substrate 601 has a cavity 606 above which the diaphragm 602 is positioned. The diaphragm 602 has one or more holes 608. Fingers 610 are attached to the diaphragm 602 at the free edge opposing the anchors 604 and form a capacitance with fixed fingers 612. In some examples, the diaphragm 602 may have a length between about 100 um and about 250 um, while the fingers 610 have a length between about 100 um and about 250 um. In some examples, the fingers may occupy between 45-60% of the overall length of the transducer.

Figure 7:
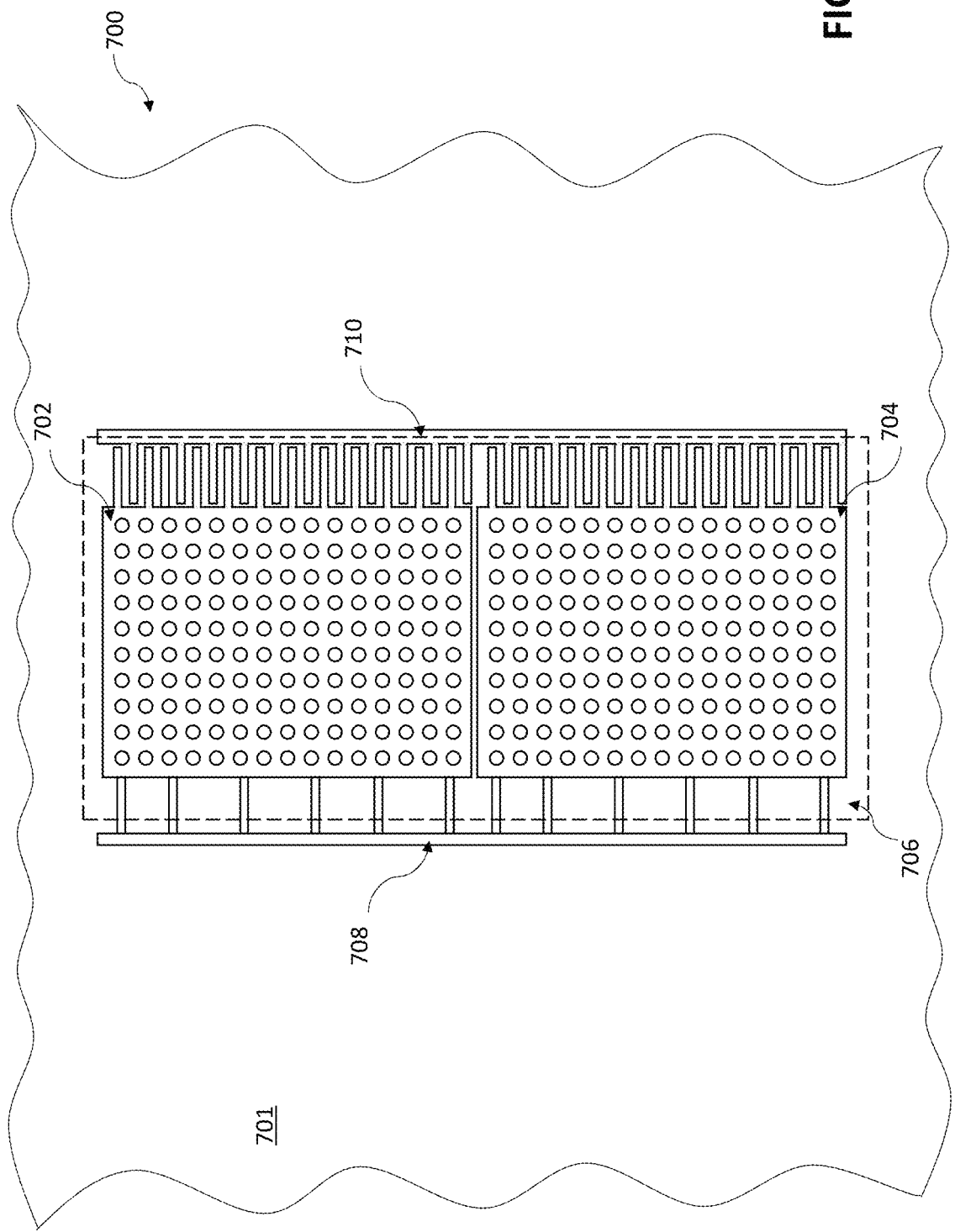
FIG. 7 is a top view schematic of a MEMS transducer with a plate-like diaphragm in accordance with yet another example.

FIG. 7 depicts a top, schematic view of a transducer 700 that includes multiple plate-like diaphragms. Transducer 700 includes at least two diaphragms 702 and 704 suspended over a cavity 706 in a substrate 701. The diaphragms 702 and 704 are electrically coupled by conductive trace 708 and fixed fingers are coupled by conductive trace 710. In some examples, transducer 700 may include more than two diaphragms. The diaphragms may have equal dimensions, or at least one diaphragm may have different dimensions than the rest. For example, at least one diaphragm of transducer 700 may have a different resonant frequency than the rest. Conductive traces 708 and/or 710 may also be separated such that each diaphragm of sensor 700 is biased and/or amplified independently or connected externally.

Figure 8:
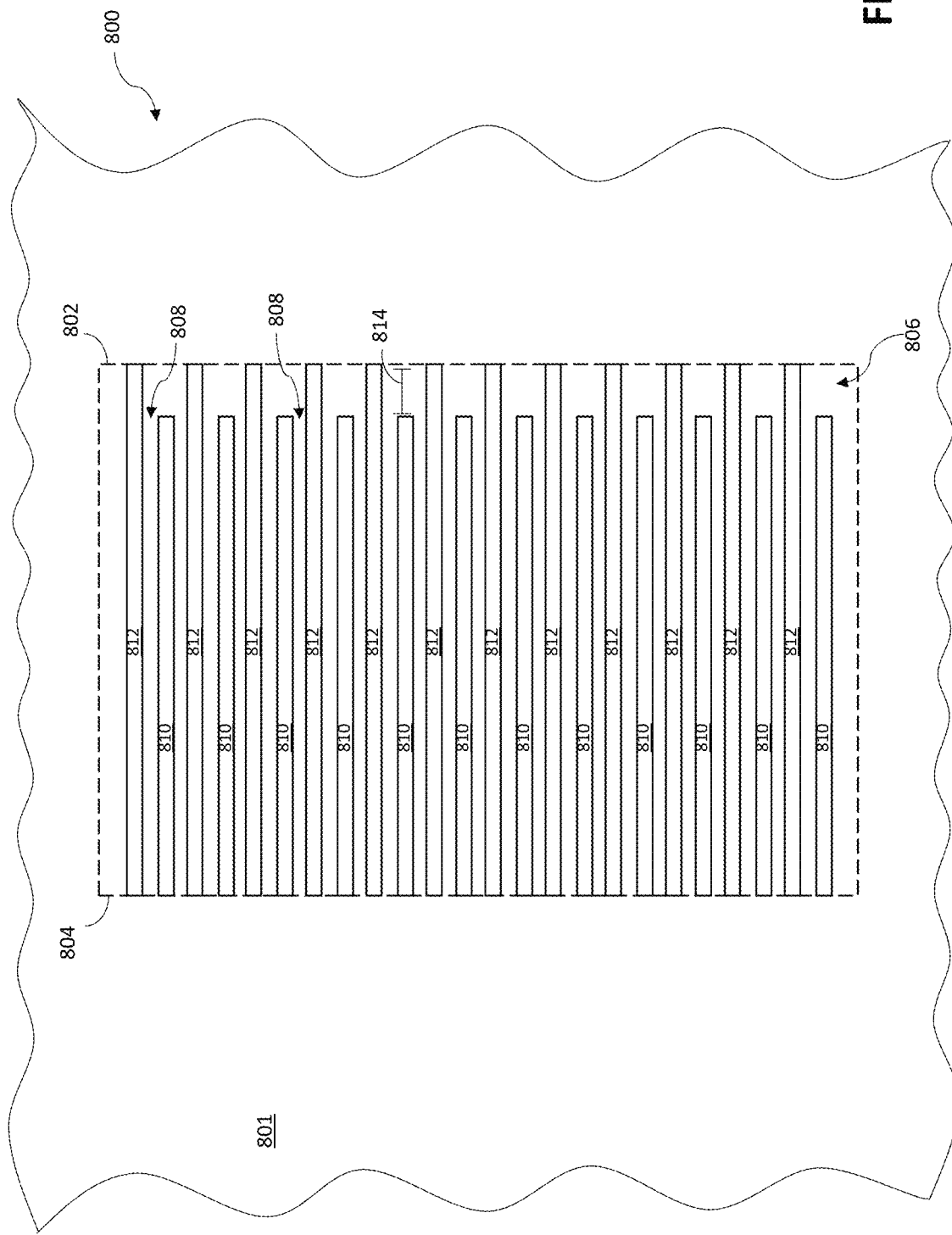
FIG. 8 is a top view schematic of a MEMS transducer with an array of beams in accordance with one example.

In some examples, the length of fingers 710 and 712 of transducer 700 may be increased to increase the capacitance present between them. FIG. 8 can be considered an extension of the transducer 700 in which the fingers extend completely through the diaphragm 702.

FIG. 8 depicts a top, schematic view of a transducer 800 using an array of beams in accordance with one example. Transducer 800 includes an array of one or more beams 810 interleaved between beams 812. The array of the transducer 800 is supported by substrate 801 with cavity 806 over which the beams 810 and 812 are suspended. Cavity 806 has edges 802 and 804. In one example, the beams 810 are cantilevers attached to the substrate on edge 804 and terminate at a distance 814 from the opposing edge 802 of the cavity 806 such that there is an air gap between the beams 810 and edge 802. The cantilever beams are accordingly referred to as fixed-free beams. Between the cantilever beams 810 are beams 812 that are anchored to the substrate on both edge 802 and edge 804. Beams 812 are accordingly referred to as fixed-fixed beams. The fixed-free beams 810 and fixed-fixed beams 812 have air gaps 808 in between them. The beams 810 and 812 each have at least one conductive layer such that there is a capacitance established between the beams as described herein. The transducer 800 is configured such that, as air or another viscous medium (e.g., a gas), passes through cavity 806, fixed-free beams 810 experience more motion than fixed-fixed beams 812. As the fixed-free beams vibrate, the gap 808 changes, creating a change in capacitance that can be converted into an electronic signal as described herein.

In some examples, the length of the beams 810 and 812 may fall in a range from about 50 um to about 1000 um, the width of the beams 810 and 812 may fall in a range from about 1 um to about 20 um, and the gap 808 may fall in a range from about 1 um to about 20 um, but other lengths, widths, and gap sizes may be used. In another example, the length, width, and/or thickness of at least one of the fixed-free beams 810 of transducer 800 may be different than at least one other of the fixed-free beams. In another example, the length, width, and/or thickness of at least one of the fixed-fixed beams 812 of transducer 800 may be different than at least one other of the fixed-fixed beams. In yet another example, the length, width, and/or thickness of at least one of the fixed-free beams 810 of transducer 800 may be different than at least one the fixed-fixed beams 812. In yet another example, at least one of the gaps 808 may be larger than one of the other gaps in transducer 800. The beams 810 and/or 812 may have a top view profile that is rectangular, circular, elliptical, triangular, or any other geometrical shape.

In other cases, the fixed-free beams 810 may instead be fixed-fixed and attached to substrate 801 on both edges 802 and 804 of cavity 806. The beams 810 are configured such that they are more compliant than beams 812. For example, beams 812 may have a greater thickness than beams 810.

Figure 9:
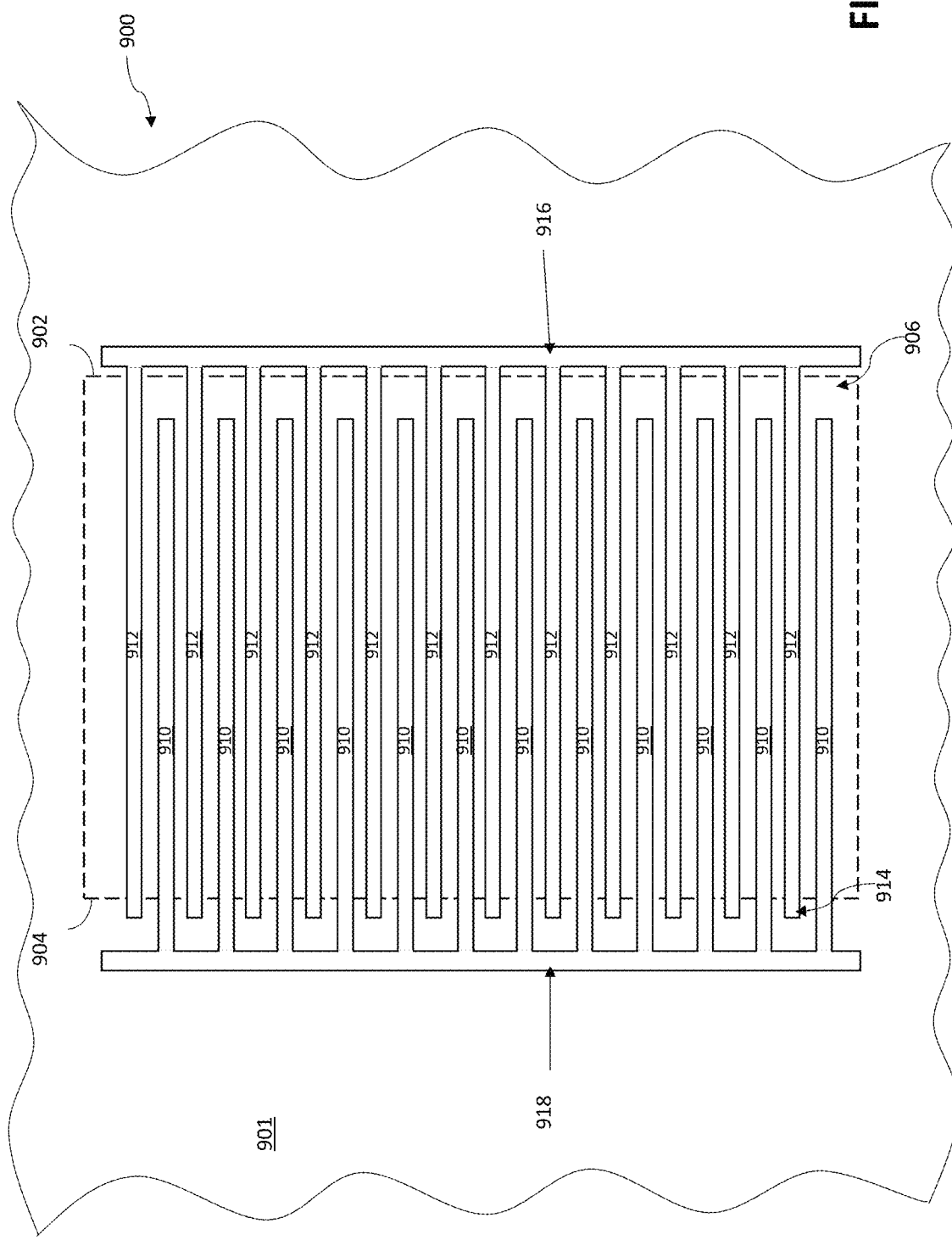
FIG. 9 is a top view schematic of a MEMS transducer with an array of beams in accordance with another example.

FIG. 9 depicts a top, schematic view of a transducer 900 using an array of beams in accordance with another example. Beams 910 and 912 are suspended over a cavity 906 in a substrate 901. Tips 914 of the fixed-fixed beams 912 extend over edge 904 of the cavity 906 and are anchored on top of the substrate 901. The distance between edge 904 and tip 914 may be set such that any over-etch of the cavity 906 that extends past edge 904 does not reach the tip 914. Each of the fixed-fixed beams 912 are electrically connected through a conductive trace 916 that is fixed to the substrate 901. Similarly, each of the fixed-free beams 910 are electrically connected through a conductive trace 918 that is fixed to the substrate 901. Conductive traces 916 and 918 may be further connected to a bond pads through which external connection can be made (e.g. through wire bonds).

Figure 10:
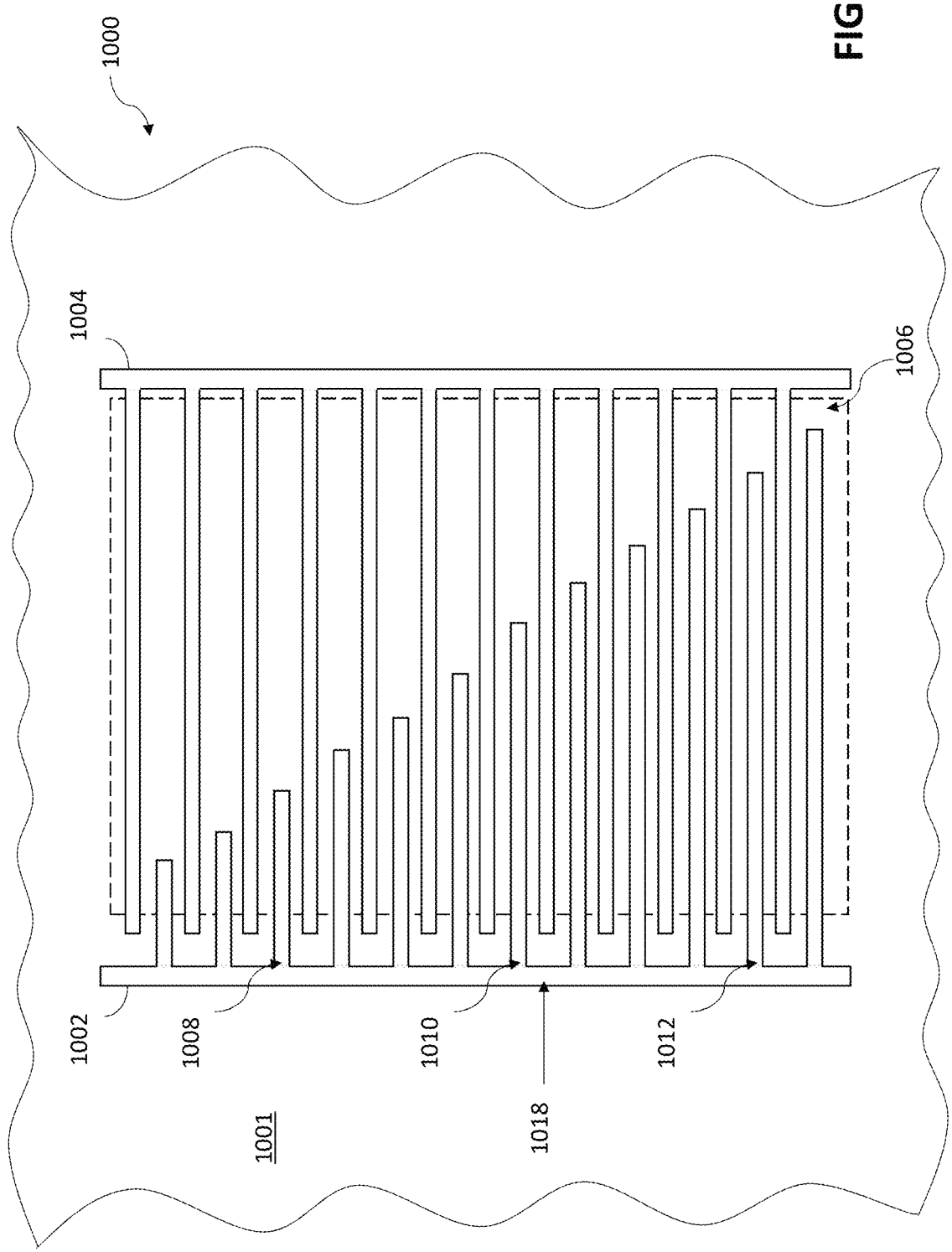
FIG. 10 is a top view schematic of a MEMS transducer with an array of beams of different lengths in accordance with one example.

FIG. 10 depicts a top, schematic view of a transducer 1000 that includes an array of beams with different lengths in accordance with one example. The transducer 1000 includes a set of fixed-free beams 1002 and fixed-fixed beams 1004 suspended over a cavity 1006 in a substrate 1001. Cantilever array 1002 may include at least one beam 1008 that is shorter in length than another beam 1010. Alternatively or additionally, cantilever array 1002 may include at least one beam 1012 that is longer in length than beam 1010. In one example, cantilever array 1002 may include a set of fixed-free beams that are increasing (e.g., monotonically increasing) in length. The incremental increase in length of each cantilever beam relative to the beam before the cantilever beam may be equal or different. The length of each cantilever beam may be tuned to exhibit a specific resonant frequency. In another example, the incremental changes in length of the beams may be randomized. Each beam in the cantilever array 1002 may be connected electrically through a conductive trace 1018 such that the change in capacitance seen by transducer 1000 when excited by is an average of all the cantilever beams 1002. In some examples, the beams of transducer 1000 may vary in length and fall in a range from about 50 um to about 1000 um, but other lengths may be used.

Figure 11:
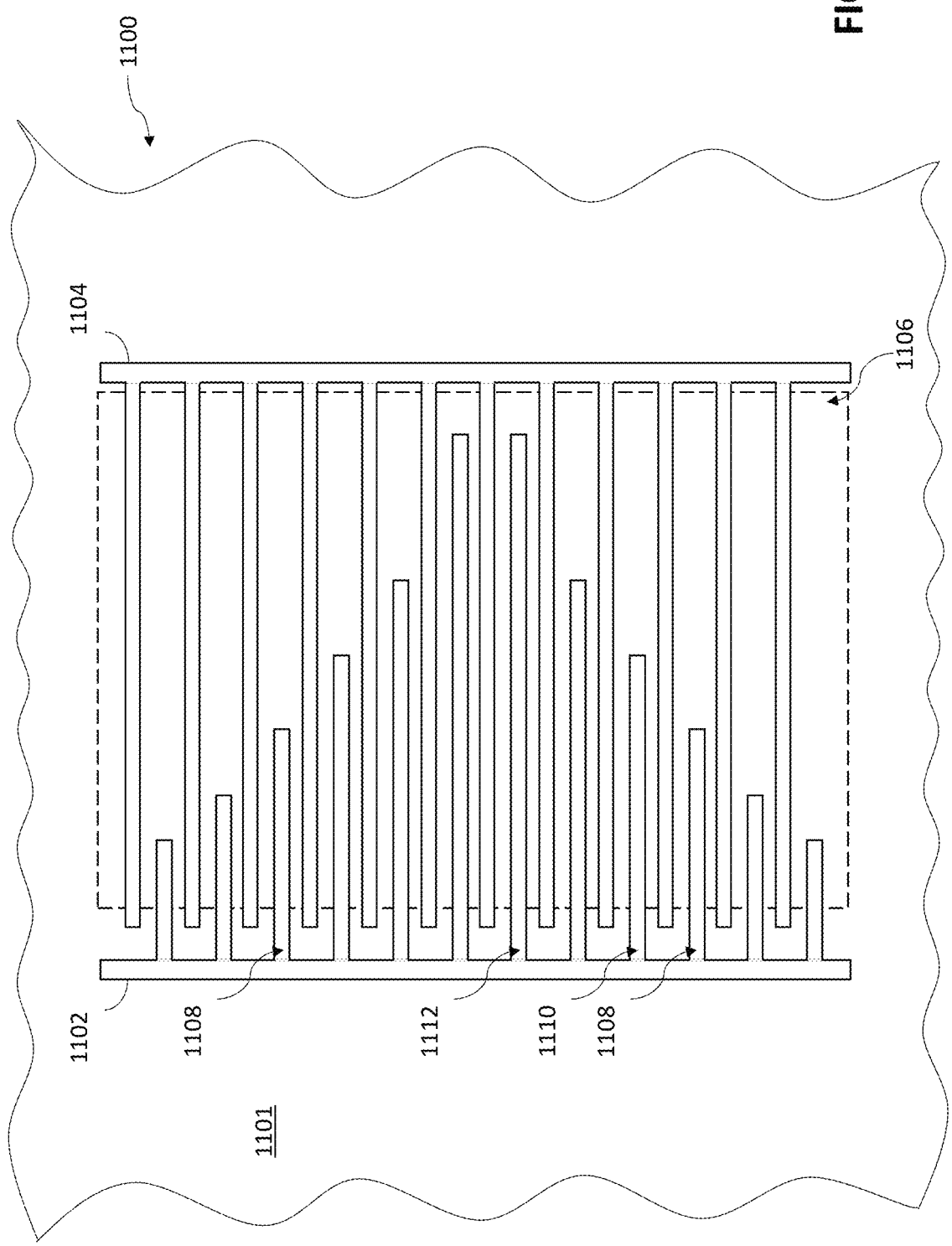
FIG. 11 is a top view schematic of a MEMS transducer with an array of beams of different lengths in accordance with another example.

FIG. 11 depicts a top, schematic view of a transducer 1100 that includes an array of beams with different lengths in accordance with another example. The transducer 1100 includes a set of fixed-free beams 1102 and fixed-fixed beams 1104 suspended over a cavity 1106 formed through a substrate 1101. Cantilever array 1102 includes at least one beam 1108 that is shorter in length than beam 1110 and at least one beam 1112 that is longer in length than beam 1110. In some examples, the longest beams may be positioned in the interior of the cavity 1106 with the shortest beams at the edges or exterior. The beams 1108 symmetrically opposing the center beam 1112 may be equal in length. The beams from the top edge of the cavity 1106 may increase in length until the beams are disposed in the middle of the cavity 1106, and then proceed to decrease in length as the approach the other edge of cavity 1106. In some examples, acoustic excitation at higher frequencies may be greatest near the edges of the cavity 1106 and acoustic excitation at lower frequencies may be greatest near the middle of the cavity 1106. The length of each beam in array 1102 may be set such that the resonance of each beam matches the frequency that passes through that position in the cavity 1106 with greatest sensitivity.

Figure 12:
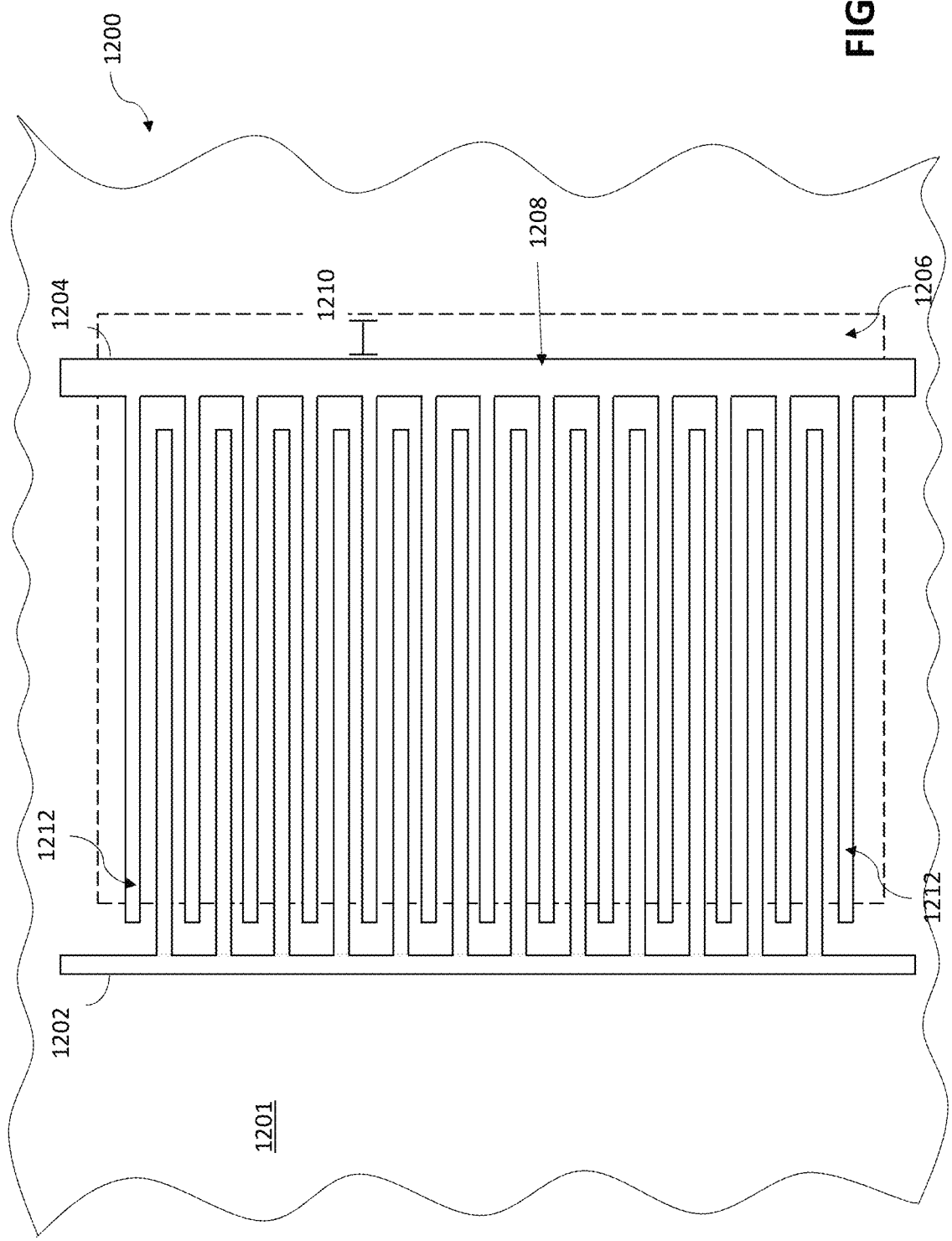
FIG. 12 is a top view schematic of a MEMS transducer with an array of beams in accordance with yet another example.

FIG. 12 depicts a top, schematic view of a transducer 1200 that includes an array of beams in accordance with yet another example. The transducer 1200 includes a set of fixed-free beams 1202 and fixed-fixed beams 1204 suspended over a cavity 1206 formed through a substrate 1201. In this example, the anchor 1208 of the fixed-fixed beams 1204 is suspended over the cavity 1206. The anchor 1208 is configured such that the anchor is sufficiently stiff and does not move significantly relative to the fixed-free beams 1202 when subject to the same external stimulus. For example, the anchor 1208 may be constructed with a greater width and/or thickness than that of the beams 1202 and 1204. The anchor 1208 is positioned at a distance 1210 from the edge of the cavity 1206. The distance 1210 is chosen such that the anchor 1208 is sufficiently far from the corners of the cavity 1206 and does not experience excessive stresses or forces during the microfabrication process.

Yet another feature of transducer 1200 is the use of fixed-fixed beams 1212 at the outer positions in the array of beams. In some examples, the electrostatic force distributed across the array of beams of transducer 1200 is nonuniform. The outer beams 1212 in the array may experience a stronger electrostatic force than the other, inner beams. And thus, it may be useful to make the outer beams stiffer than the other, inner beams in the array. In some cases, the outer beams 1212 are fixed-fixed beams. In other cases, the fixed-fixed beams 1212 may further have a larger width and/or thickness than the rest of the beams in the array 1202 and/or 1204. In yet another example, the outer beams of the array 1212 may be a fixed-free beam with a shorter length than the other beams in the array.

Figure 13:
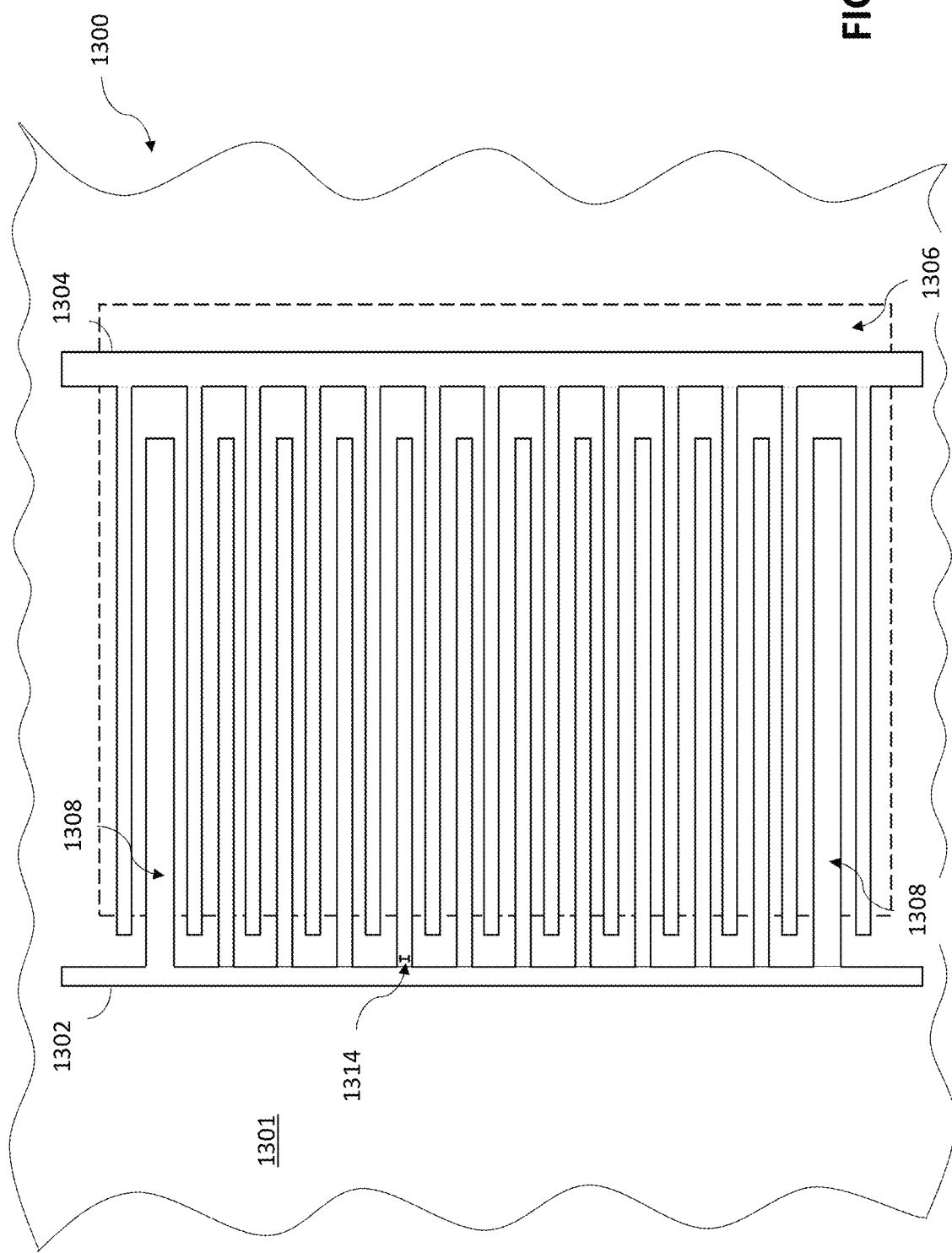
FIG. 13 is a top view schematic of a MEMS transducer with an array of beams in accordance with yet another example.

FIG. 13 depicts a top, schematic view of a transducer 1300 that includes an array of beams in accordance with yet another example. The transducer 1300 includes a set of fixed-free beams 1302 with width 1314 and fixed-fixed beams 1304 suspended over a cavity 1306 formed through a substrate 1301. The array of fixed-free beams 1302 includes a first and last fixed-free beam 1308. The width of beams 1308 is greater than the width 1314 of the rest of the fixed-free beams in the array 1302. In another example, the beams 1308 may have a different length and/or thickness than the rest of the fixed-free beams in the array 1302.

Figure 14:
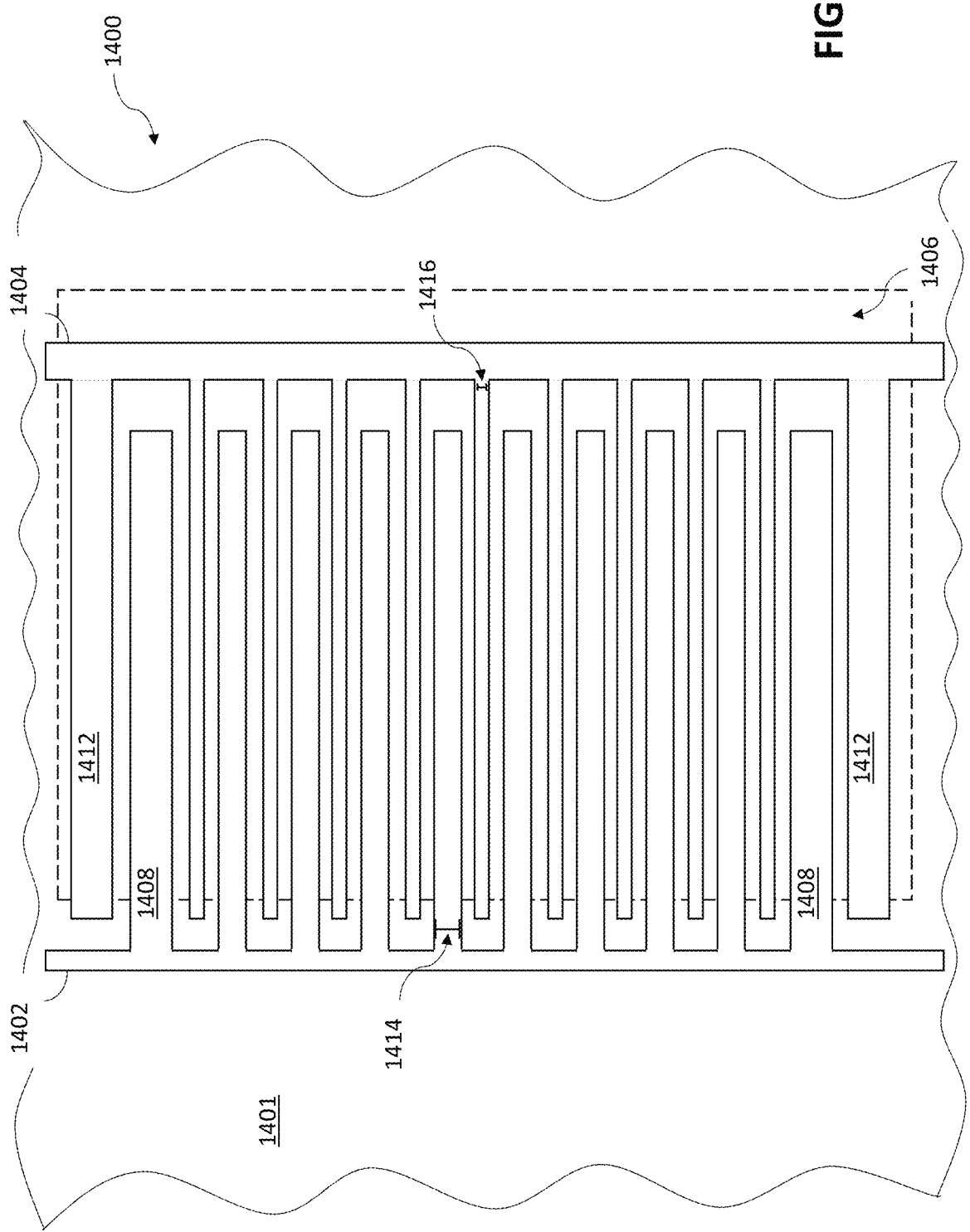
FIG. 14 is a top view schematic of a MEMS transducer with an array of beams in accordance with yet another example.

FIG. 14 depicts a top, schematic view of a transducer 1400 that includes an array of beams in accordance with yet another example. The transducer 1400 includes a set of fixed-free beams 1402 with width 1414 and fixed-fixed beams 1404 with width 1416 suspended over a cavity 1406 formed through a substrate 1401. In this embodiment, the width of the fixed-free beams 1414 is greater than the width of the fixed-fixed beam 1416. For example, the width of the fixed-free beams 1414 may be one, two, three, or four times the width of the fixed-fixed beams 1416. Additionally or alternatively, the thickness of the fixed-free beams in array 1402 may be greater than the thickness of the fixed-fixed beams in array 1404. The fixed-free beam array 1402 has a first and last beam 1408. In one example, the width of beams 1408 is greater than width 1414. Similarly, the fixed-fixed beam array 1404 has a first and last beam 1412. In one example, the width of beams 1412 is greater than width 1416.

Figure 15:
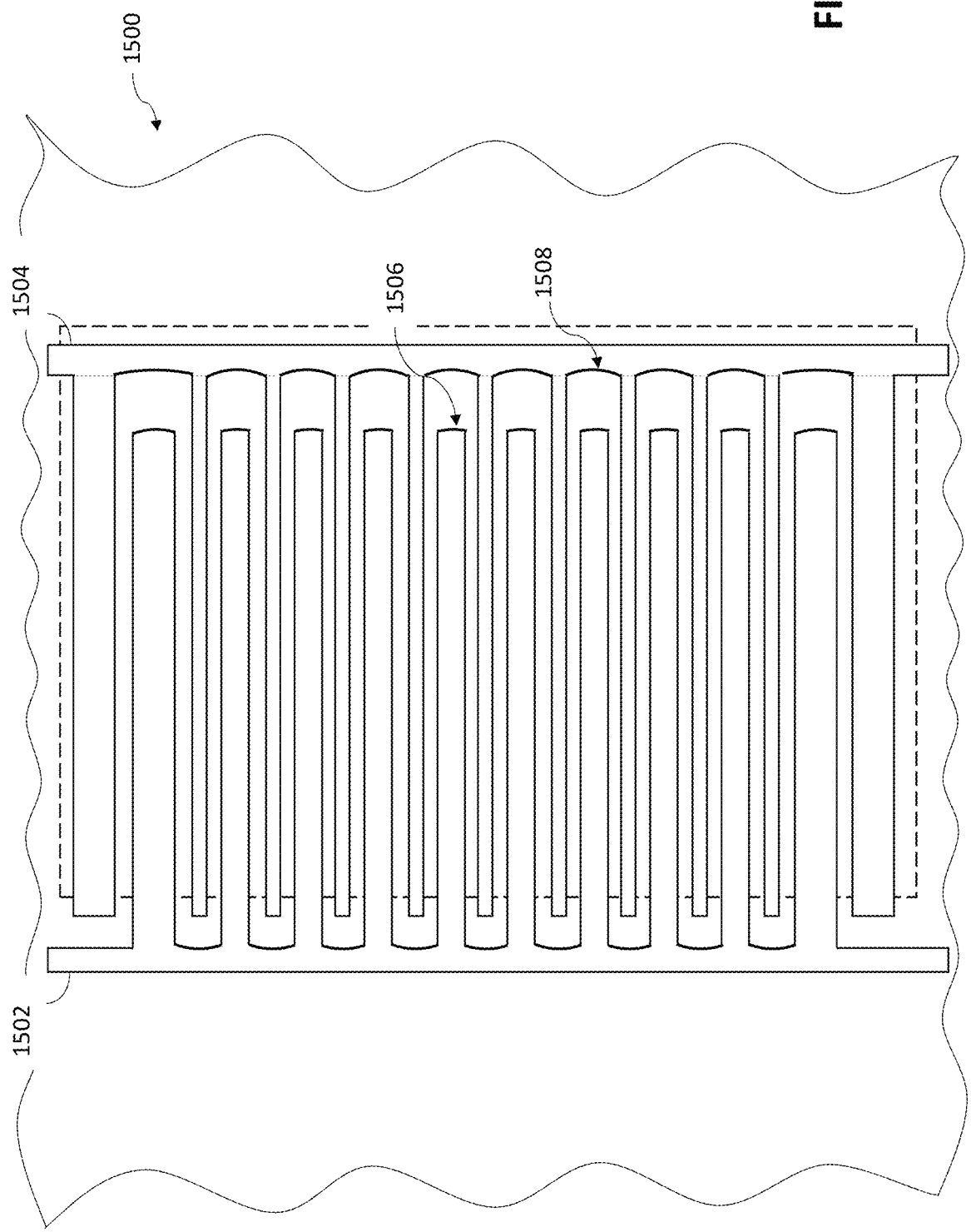
FIG. 15 is a top view schematic of a MEMS transducer with an array of beams in accordance with yet another example.

FIG. 15 depicts a top, schematic view of a transducer 1500 that includes an array of beams in accordance with yet another example. Transducer 1500 may be configured in a manner similar to transducer 1400 (FIG. 14) in one or more aspects. Transducer 1500 may differ in that the tips of the fixed-free beams 1502 are curved. Alternatively or additionally, the regions 1508 on the fixed-fixed beam array 1504 that are directly across from the tip of the fixed-free beams 1506 are also curved in profile.

In some instances, it may be useful to increase the area of the transducer in order to increase the total capacitance of the sensor and thus performance. In some examples, transducers including plates anchored on at least one side may be constructed with larger widths (e.g., extended in the direction parallel to the edge on which they are anchored on). Transducers including arrays of beams may be extended to increase the number of beams in the array. However, these configurations cause the cavity in the substrate to be proportionally extended only along one direction. In some examples, it may be useful to have a configuration in which the transducer area is increased in the direction perpendicular to the edge on which the sensing element is anchored. This may allow for an increase in sensor area along both of its planar dimensions and enable better symmetry of the cavity or hole formed in the substrate.

Figure 16:
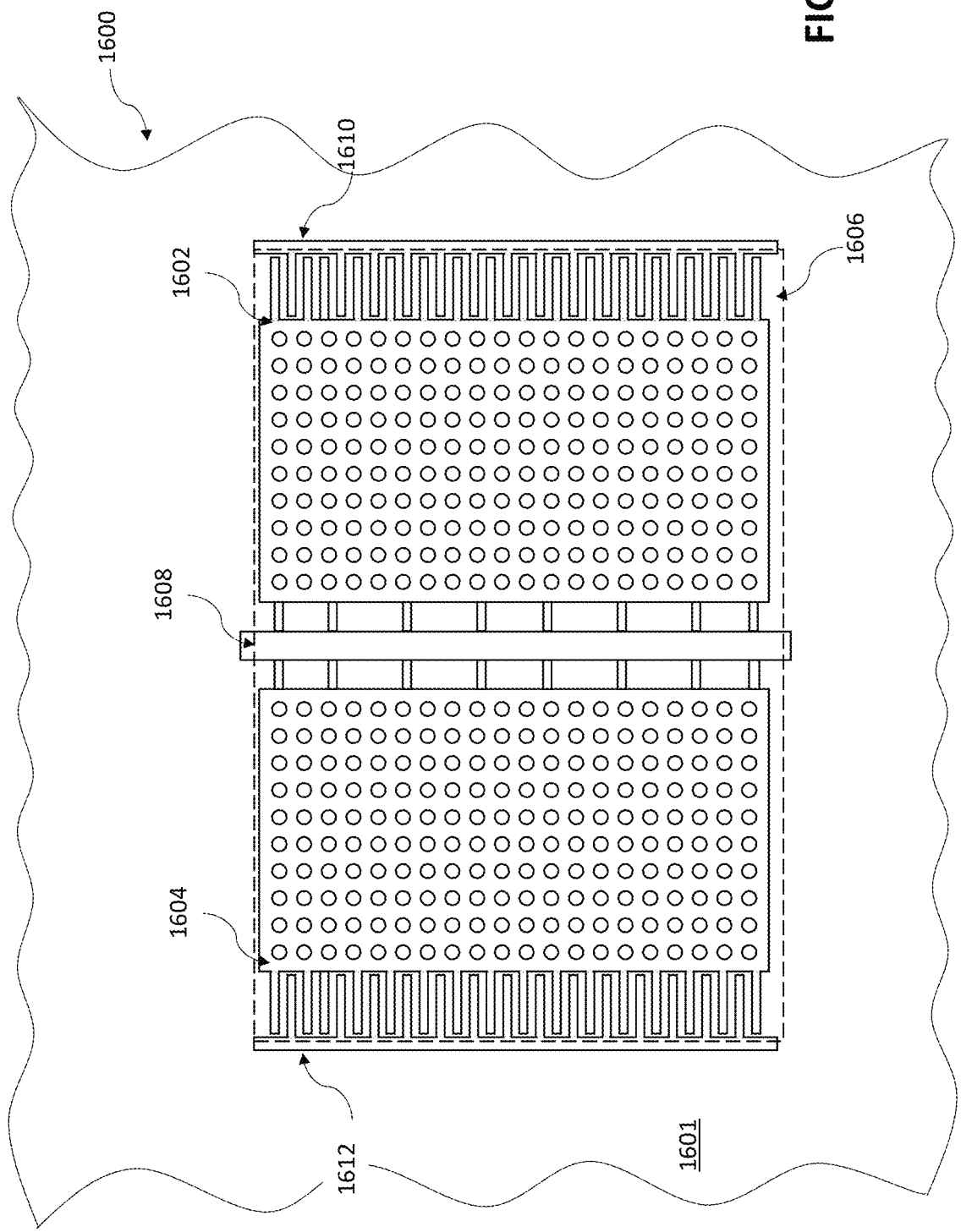
FIG. 16 is a top view schematic of a MEMS transducer with an increased area in accordance with one example.

FIG. 16 depicts a transducer 1600 including a plate-like diaphragm with an increased area in accordance with one example. Transducer 1600 includes two plate-like diaphragms 1602 and 1604 attached to a common anchor 1608 suspending over a cavity 1606 in the substrate 1601. The plate-like diaphragms 1602 and 1604 may be similar to those described in FIGS. 5-7. As the diaphragms 1602 and 1604 are excited by a sound wave, the diaphragms may move in phase with one another. Anchor 1608 is constructed such that the anchor does not move significantly relative to the motion of diaphragms 1602 and 1604 when subject to the same external stimulus. Similarly, fixed electrodes 1610 and 1612 are fixed to the substrate 1601 and do not move significantly relative to the motion of diaphragms 1602 and 1604 when subject to the same external stimulus. As diaphragms 1602 and 1604 vibrate, the diaphragms create a change in capacitance with electrodes 1610 and 1612 respectively. In one example, the anchor 1608 connects diaphragms 1602 and 1604 such that each diaphragm shares the same conductive layers. If a bias voltage is placed on fixed electrodes 1610 and 1612, then an electrical signal may be sensed from at least one conductive layer in anchor 1608 that approximates the total capacitance change seen by transducer 1600. By sensing a signal from the suspended anchor 1608, the parasitic capacitance between the sensing electrode and substrate 1601 can be minimized. In another example, at least one bias voltage may be placed on anchor 1608 and shared by diaphragms 1602 and 1604. In this case, the total capacitance change seen by transducer 1600 can be sensed by electrically connecting fixed electrodes 1610 and 1612 either using a conductive trace above the substrate 1601 or externally to the transducer 1600. The edge of the cavity, or deep reactive ion etch (DRIE) hole, may be placed at the edge of electrodes 1610 and 1612 such that an undercutting during the DRIE process will help to reduce parasitic capacitances between the electrodes 1610 and 1612 and the substrate. In yet another example, the transducer 1600 may include a first output corresponding to the capacitance change seen between diaphragm 1602 and fixed electrode 1610 and a second output corresponding to the capacitance change seen between diaphragm 1604 and fixed electrode 1612. This may be useful in examples where the transducer 1600 is constructed in such a way that diaphragms 1602 and 1604 move out-of-phase relative to one another.

Figure 17:
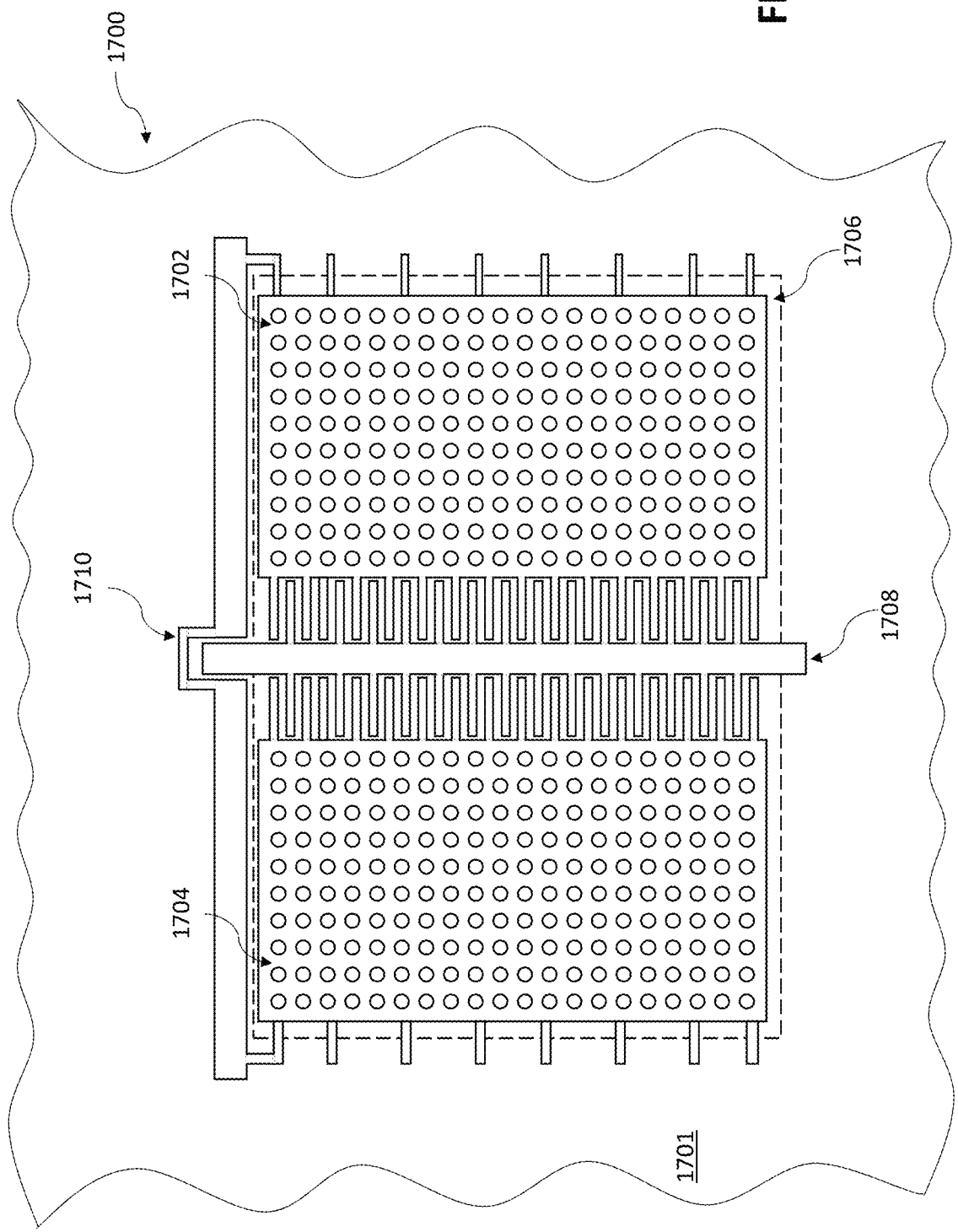
FIG. 17 is a top view schematic of a MEMS transducer with an increased area in accordance with another example.

FIG. 17 depicts a top, schematic view of a transducer 1700 including a plate-like diaphragm with an increased area in accordance with another example. Transducer 1700 is similar to transducer 1600 except with the diaphragms inverted. In transducer 1700, the plate-like diaphragms 1702 and 1704 are attached directly to the substrate 1701 and suspended over the cavity 1706. The fingers of the diaphragm 1702 and 1704 are positioned at the center of the cavity 1706 and interdigitated with fixed fingers, or electrodes, of the suspended anchor 1708. Anchor 1708 is configured such that the anchor does not move significantly relative to the motion of diaphragms 1702 and 1704 when subject to the same external stimulus. In one example, a conductive trace 1710 may connect diaphragms 1702 and 1704 such that each diaphragm shares the same conductive layers. One or more bias voltages may be placed on diaphragms 1702 and 1704 and an electrical signal may be sensed from at least one conductive layer in anchor 1708 that approximates the total capacitance change seen by transducer 1700. By sensing the signal change from the suspended anchor 1708, the parasitic capacitance between the sensing electrode and substrate 1701 can be minimized. In another example, one or more bias voltages may be placed on one or more conductive layers of anchor 1708. In this case, the total capacitance change seen by transducer 1700 can be sensed by at least one conductive layer in 1702, 1704, or 1710. In yet another example, conductive trace 1710 may be removed such that the sensor 1700 includes a first output corresponding to the capacitance change seen between diaphragm 1702 and fixed electrode 1708 and a second output corresponding to the capacitance change seen between diaphragm 1704 and fixed electrode 1708.

Figure 18:
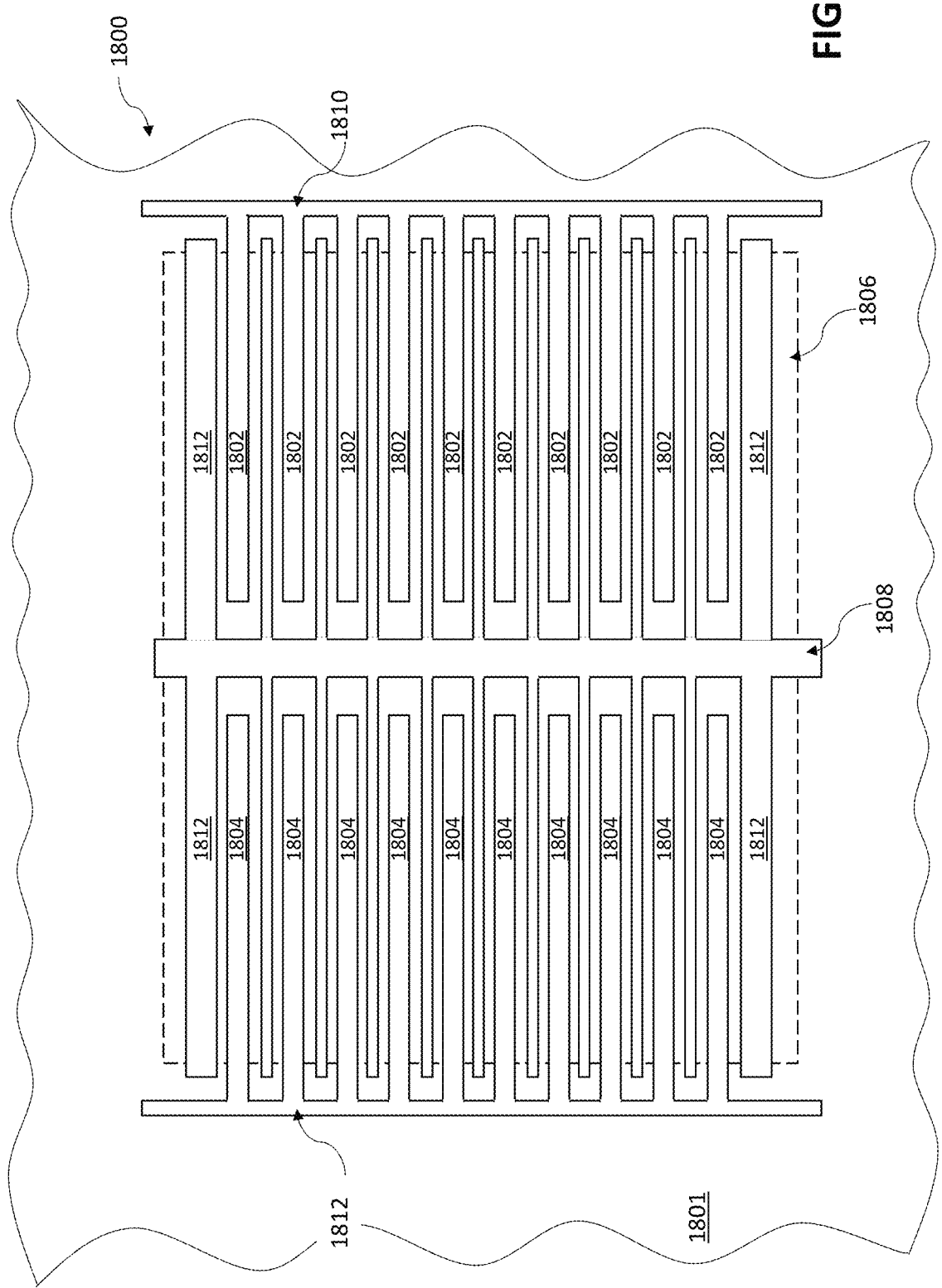
FIG. 18 is a top view schematic of a MEMS transducer with an increased area in accordance with yet another example.

FIG. 18 depicts a top, schematic view of a transducer 1800 including an array of beams with an increased area is depicted in accordance with one example. Transducer 1800 includes two sets of fixed-free beams 1802 and 1804 suspended over cavity 1806 and anchored to substrate 1801. The fixed-free beams 1802 are connected via conductive trace 1810 and the fixed-free beams 1804 are connected via the conductive trace 1812. The fixed-free beams 1802 and 1804 are interdigitated between fixed-fixed beams connected to the anchor 1808 and suspended over the cavity 1806. In some examples, the width of fixed-free beams 1802 and/or 1804 may be greater than or less than the width of the fixed-fixed beams. The fixed-fixed beam array has a set of first and last beams 1814. In some examples, the width of beams 1814 may be greater than the other fixed-fixed beams and/or the fixed-free beams 1802 and 1804. In other examples, the length, width, and/or thickness of at least one of the fixed-free beams 1802 may be different than at least one of the fixed-free beams 1804. The beam arrays of transducer 1800 may be similar to those described in FIG. 8-15.

Anchor 1808 and its associated fixed-fixed beams are configured such that they do not move significantly relative to the motion of fixed-free beams 1802 and 1804 when subject to the same external stimulus. As the fixed-free beams 1802 and 1804 vibrate, the beams create a change in capacitance with the fixed-fixed beams anchored to 1808 and the substrate. In one example, one or more bias voltages are placed on the fixed-fixed beams and an electrical signal is sensed from at least one of the conductive layers in 1810 and/or 1812. In another example, one or more bias voltages are placed on at least one conductive layer of 1810 and/or 1812 and an electrical signal is sensed from at least one conductive layer in the fixed-fixed beams 1808. By sensing off the suspended anchor 1808, the parasitic capacitance between the sensing electrode and substrate can be minimized.

Figure 19:
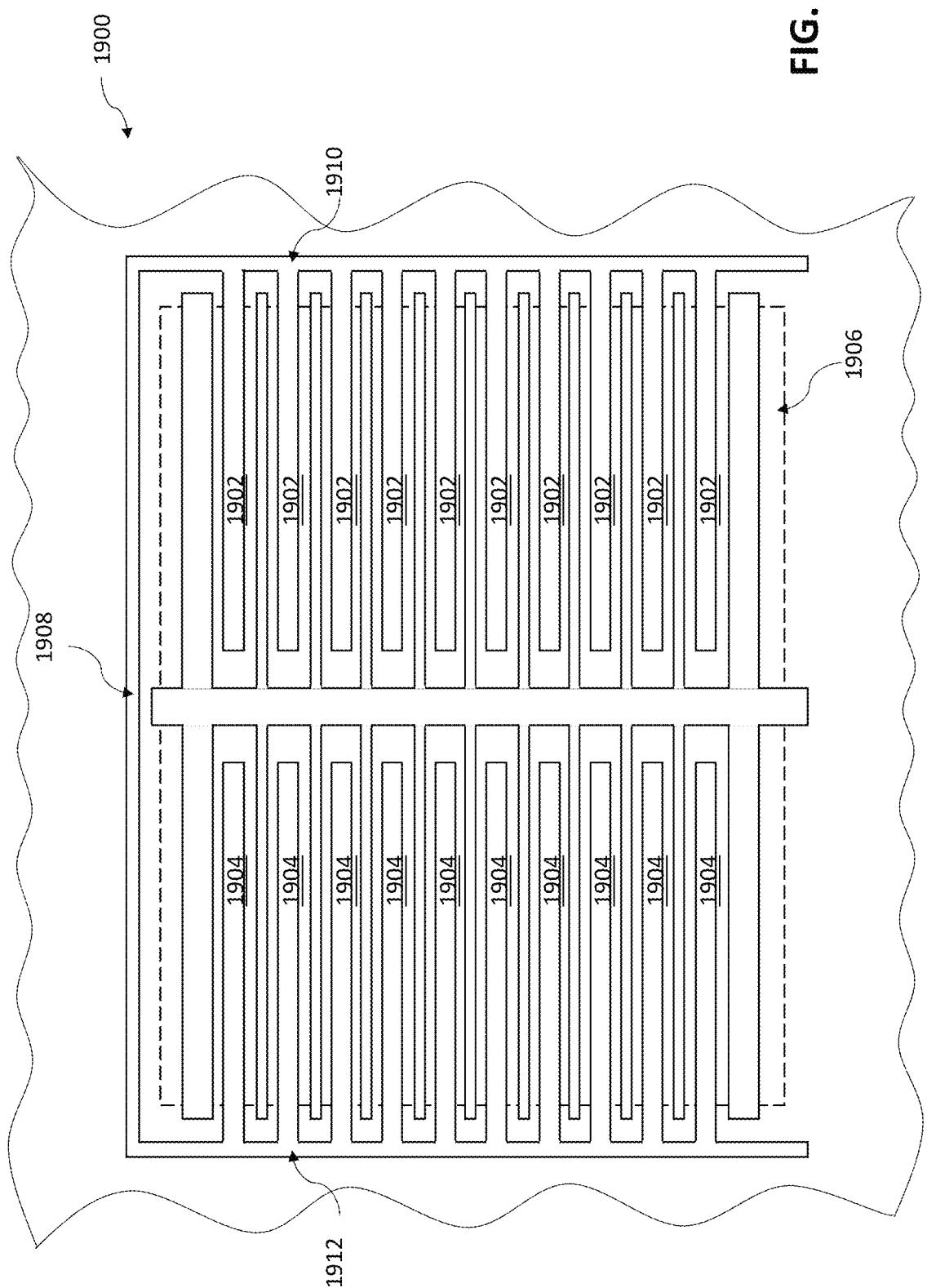
FIG. 19 is a top view schematic of a MEMS transducer with an increased area in accordance with yet another example.

In some examples, it may be useful to electrically connect the conductive traces 1810 and 1812 so the motion of fixed-free beams can be sensed using a single external connection. FIG. 19 depicts one such embodiment. Transducer 1900, similar to transducer 1800, includes at least two sets of fixed-free beams 1902 and 1904 suspended over the cavity 1906 and connected to conductive traces 1910 and 1912 respectively. Conductive traces 1910 and 1912 are further connected by conductive trace 1908 such that fixed-free beams 1902 and 1904 see the same electric potential.

As the area of the MEMS transducer is increased, the area of the cavity etched into the substrate increases accordingly. In some instances, it may be useful to etch multiple, smaller cavities in the substrate rather than one larger cavity. This may also allow for the creation of transducers covering more area without an excessively long suspended structures such as fixed anchors.

Figure 20:
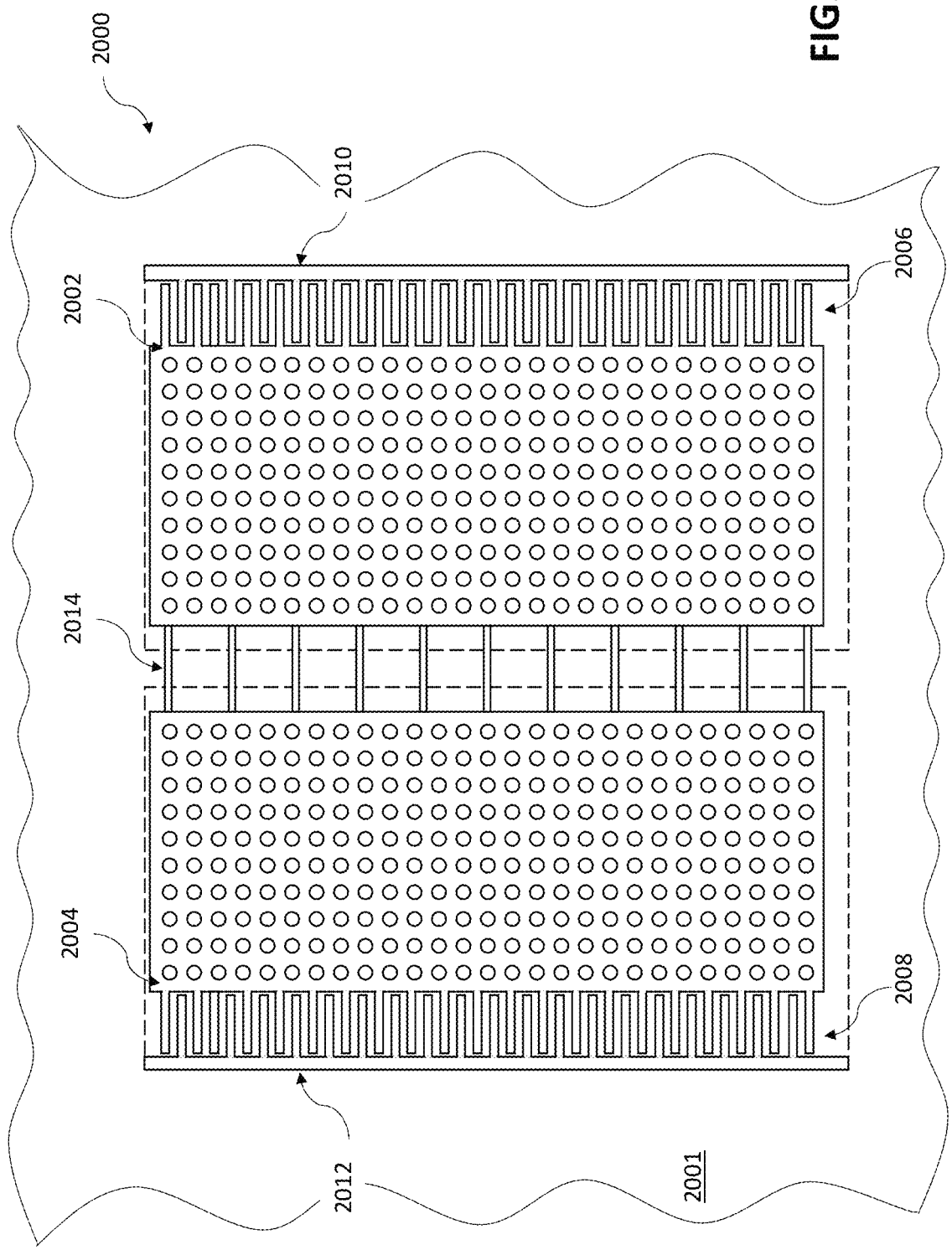
FIG. 20 is a top view schematic of a MEMS transducer with multiple cavities in accordance with one example.

FIG. 20 depicts a transducer 2000 that includes a plate-like diaphragm with multiple cavities in accordance with one example. Transducer 2000 includes two plate-like diaphragms 2002 and 2004 connected by anchors 2014. The plate-like diaphragms 2002 and 2004 may be similar to those described in FIGS. 5-7. The transducer 2000 includes a first cavity 2006 through the substrate 2001 over which diaphragm 2002 is suspended and a second cavity 2008 through the substrate 2001 over which diaphragm 2004 is suspended. The anchors 2014 connecting diaphragms 2002 and 2004 are also fixed to the substrate 2001 of transducer 2000. As the diaphragms 2002 and 2004 are excited by a sound wave, the diaphragms vibrate and move in phase with one another. Fixed fingers, or electrodes, 2010 and 2012 are fixed to the substrate 2001 and do not move significantly relative to the motion of diaphragms 2002 and 2004 when subject to the same external stimulus. As diaphragms 2002 and 2004 vibrate, the diaphragms create a change in capacitance with electrodes 2010 and 2012 respectively. In one example, the anchors 2014 connect diaphragms 2002 and 2004 such that each diaphragm shares the same conductive layers. If a bias voltage is placed on fixed electrodes 2010 and 2012, then an electrical signal may be sensed from at least one conductive layer in anchor 2014 that approximates the total capacitance change seen by transducer 2000. In another example, at least one bias voltage may be placed on a conductive layer in anchors 2014 and shared by diaphragms 2002 and 2004. In this case, the total capacitance change seen by sensor 2000 can be sensed by electrically connecting fixed electrodes 2010 and 2012. In yet another example, the transducer 2000 may include a first output corresponding to the capacitance change seen between diaphragm 2002 and fixed electrode 2010 and a second output corresponding to the capacitance change seen between diaphragm 2004 and fixed electrode 2012.

In some examples, the first and second cavity 2006 and 2008 may have equal dimensions. In other examples, the first and second cavity 2006 and 2008 may have different dimensions. The first and second cavity 2006 and 2008 may have any orientation relative to one another. For example, they may be placed horizontally, vertically, or diagonally from one another. The first and second cavity 2006 and 2008 may also be offset from one another such that the top of cavity 2006 is above or below the top of a horizontally placed cavity 2008. Similarly, the left edge of cavity 2006 maybe be placed to the left or right of the left edge of a vertically placed cavity 2008. Rather than having two diaphragms 2002 and 2004 connected by anchors 2014, transducer 2000 may include separate diaphragms individually suspended over the cavities 2006 and 2008. In some examples, these diaphragms may resemble those described in FIGS. 16 and 17. These diaphragms may be connected with an additional conductive trace or a connection external to the transducer 2000. In some examples, transducer 2000 may include more than two cavities. The more than two cavities may be positioned in any arrangement relative to one another. For example, when transducer 2000 includes four cavities, the four cavities may be positioned to form the shape of a horizontal line, vertical line, rectangle, or cross.

Figure 21:
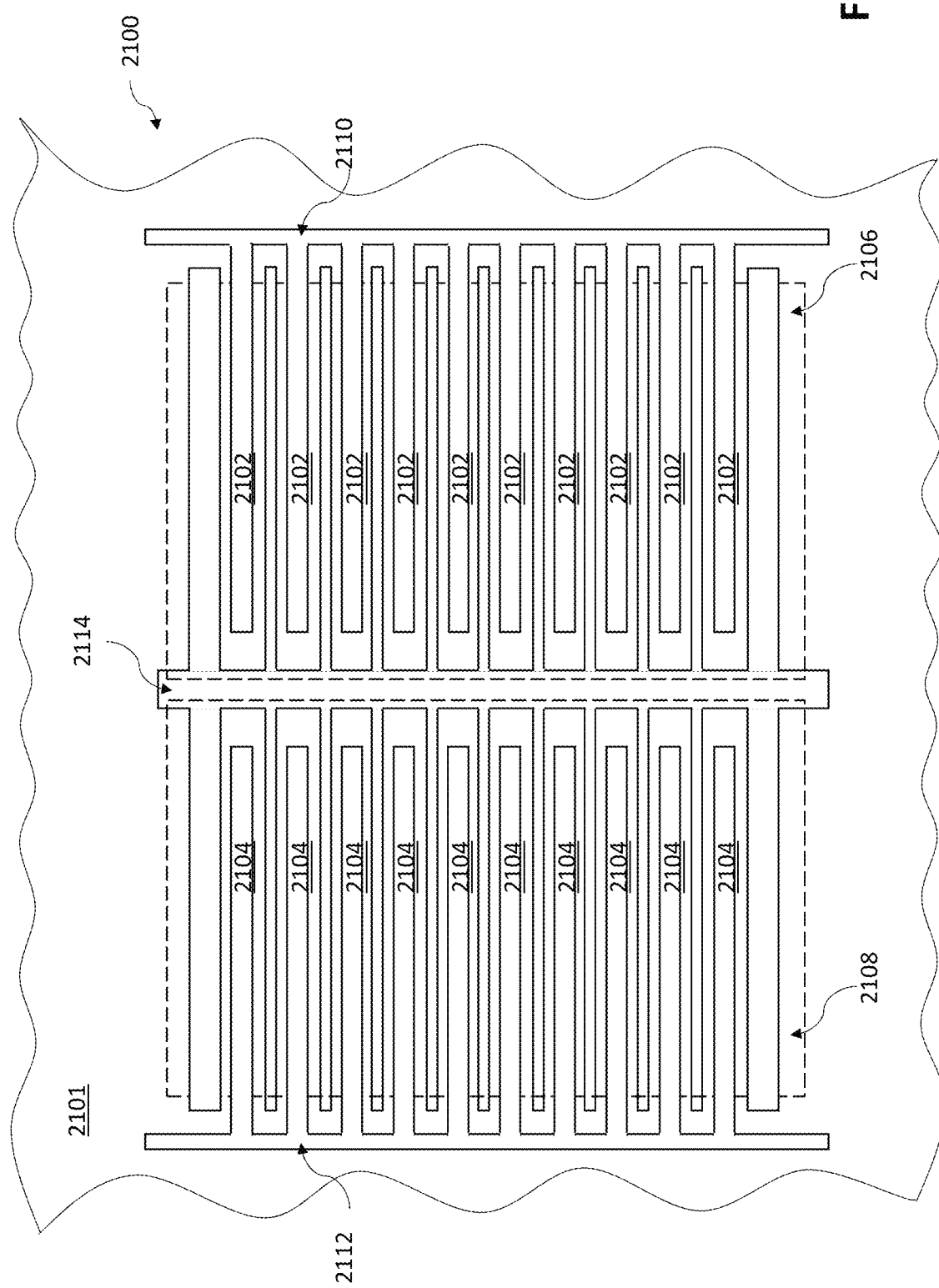
FIG. 21 is a top view schematic of a MEMS transducer with multiple cavities in accordance with another example.

FIG. 21 depicts a top, schematic view of a transducer 2100 including an array of beams with multiple cavities in accordance with one example. Transducer 2100 includes two arrays of fixed-free beams 2102 and 2104. Fixed-free beams 2102 are connected through trace 2110 and fixed-free beams 2104 are connected through trace 2112. The fixed-free beams are interdigitated with fixed-fixed beams connected to anchor 2114. The array of beams may be similar to those described in FIG. 8-15. The sensor 2100 includes a first cavity 2106 through the substrate 2101 over which fixed-free beams 2102 are suspended and a second cavity 2108 through the substrate 2101 over which fixed-free beams 2104 are suspended. The anchor 2114 connecting the fixed-fixed beams may be partially or completely fixed to the substrate 2101 of transducer 2100. As the fixed-free beams 2102 and 2104 are excited by a sound wave, the beams may vibrate and move in phase with one another. The fixed-fixed beams connected to anchor 2114 are fixed to the substrate 2101 and do not move significantly relative to the motion of fixed-free beams 2102 and 2104 when subject to the same external stimulus. As fixed-free beams 2102 and 2104 vibrate, they create a change in capacitance with the fixed-fixed beams. An electrical signal may be sensed by any of the methods described in the previous examples.

The first cavity and the second cavity 2106 and 2108 may have equal or different dimensions and have any orientation relative to one another as described in FIG. 20. Rather than having one array of fixed-fixed beams connected to anchor 2114, transducer 2100 may include separate fixed-fixed beam arrays individually suspended over the cavities 2106 and 2108. In some examples, each cavity 2106 and 2108 may include an array of beams that resemble those described in FIG. 18-19. These arrays of beams may be connected with additional conductive traces or connections external to the transducer 2100. In some examples, transducer 2100 may include more than two cavities placed in any orientation as described in FIG. 20.

Figure 22:
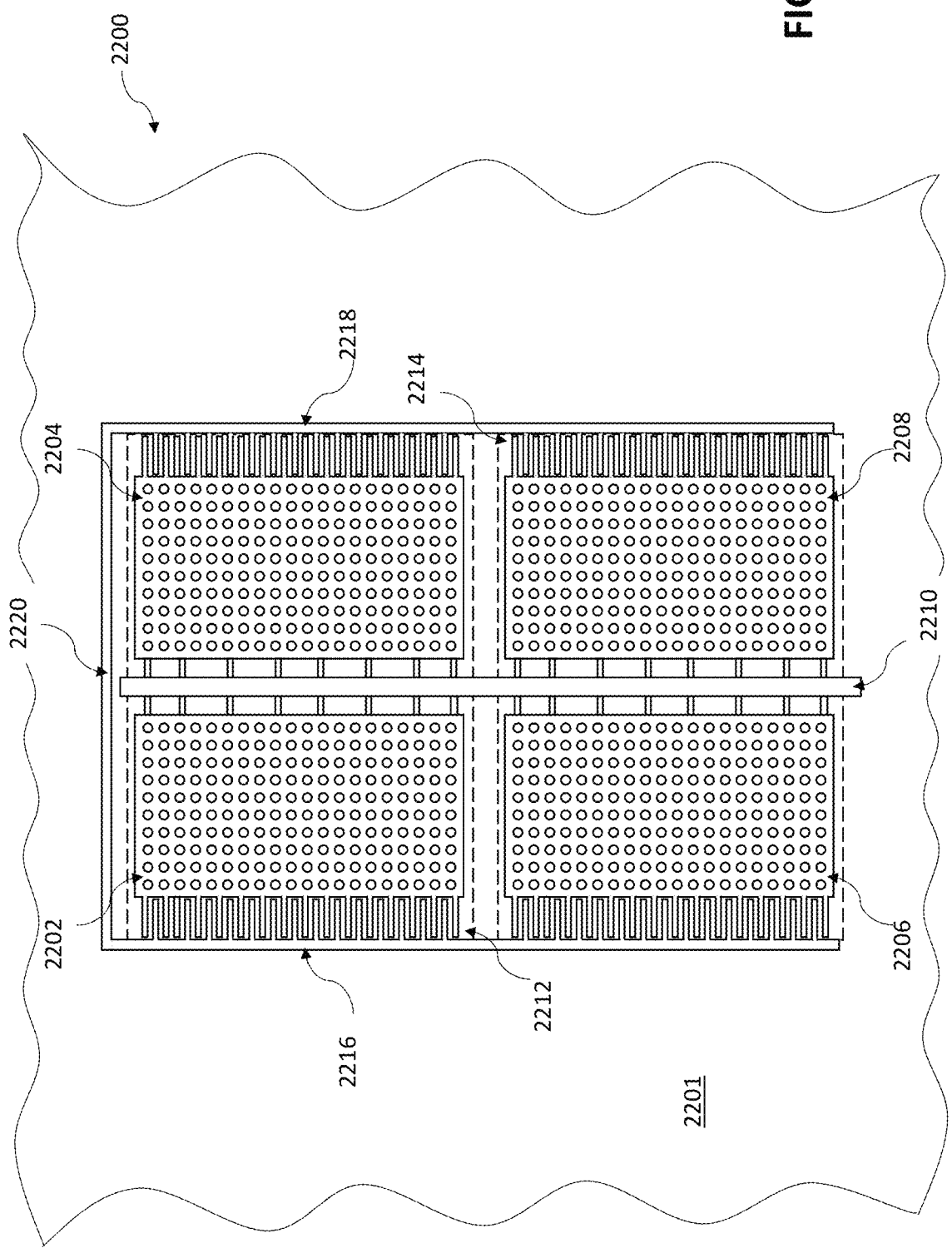
FIG. 22 is a top view schematic of a MEMS transducer with multiple cavities in accordance with yet another example.

FIG. 22 depicts a top, schematic view of a transducer 2200 including a plate-like diaphragm with multiple cavities in accordance with another example. Transducer 2200 includes four plate-like diaphragms 2202, 2204, 2206, and 2208 connected to anchor 2210. The plate-like diaphragms 2202, 2204, 2206, and 2208 may be similar to those described in FIGS. 7-9. The transducer 2200 includes a first cavity 2212 through the substrate 2201 over which diaphragms 2202 and 2204 are suspended and a second cavity 2214 through the substrate 2201 over which diaphragms 2206 and 2208 are suspended. At least one part of the anchor 2210 connecting diaphragms 2202, 2204, 2206, and 2208 may be suspended over at least one cavity 2212 and/or 2214.

At least one part of the anchor 2210 may also be fixed to the substrate 2201 of transducer 2200. In some examples, the anchor 2210 may include multiple anchors connected electrically or mechanically. When excited by the same external stimulus, the diaphragms 2202, 2204, 2206, and 2208 may move in phase with one another. Electrodes 2216 and 2218 are fixed to the substrate and do not move significantly relative to the diaphragms 2202, 2204, 2206, and 2208 when subject to the same external stimulus. Electrodes 2216 and 2218 may be further connected through a conductive trace 2220. As diaphragms 2202, 2204, 2206, and 2208 vibrate, the diaphragms create a change in capacitance with electrodes 2216 and 2218. In one example, the anchor 2210 connects diaphragms 2202, 2204, 2206, and 2208 such that each diaphragm shares the same conductive layers. An electrical signal may be sensed by any of the methods described in the previous examples. The first and second cavities 2206 and 2208 may have equal or different dimensions and have any orientation relative to one another as described previously. In some examples, a transducer such those described in FIGS. 16, 17, and 20 may be suspended above cavity 2212 and/or cavity 2214. In some examples, transducer 2200 may include more than two cavities. The more than two cavities may be positioned in any arrangement relative to one another as described in connection with previous figures.

Figure 23:
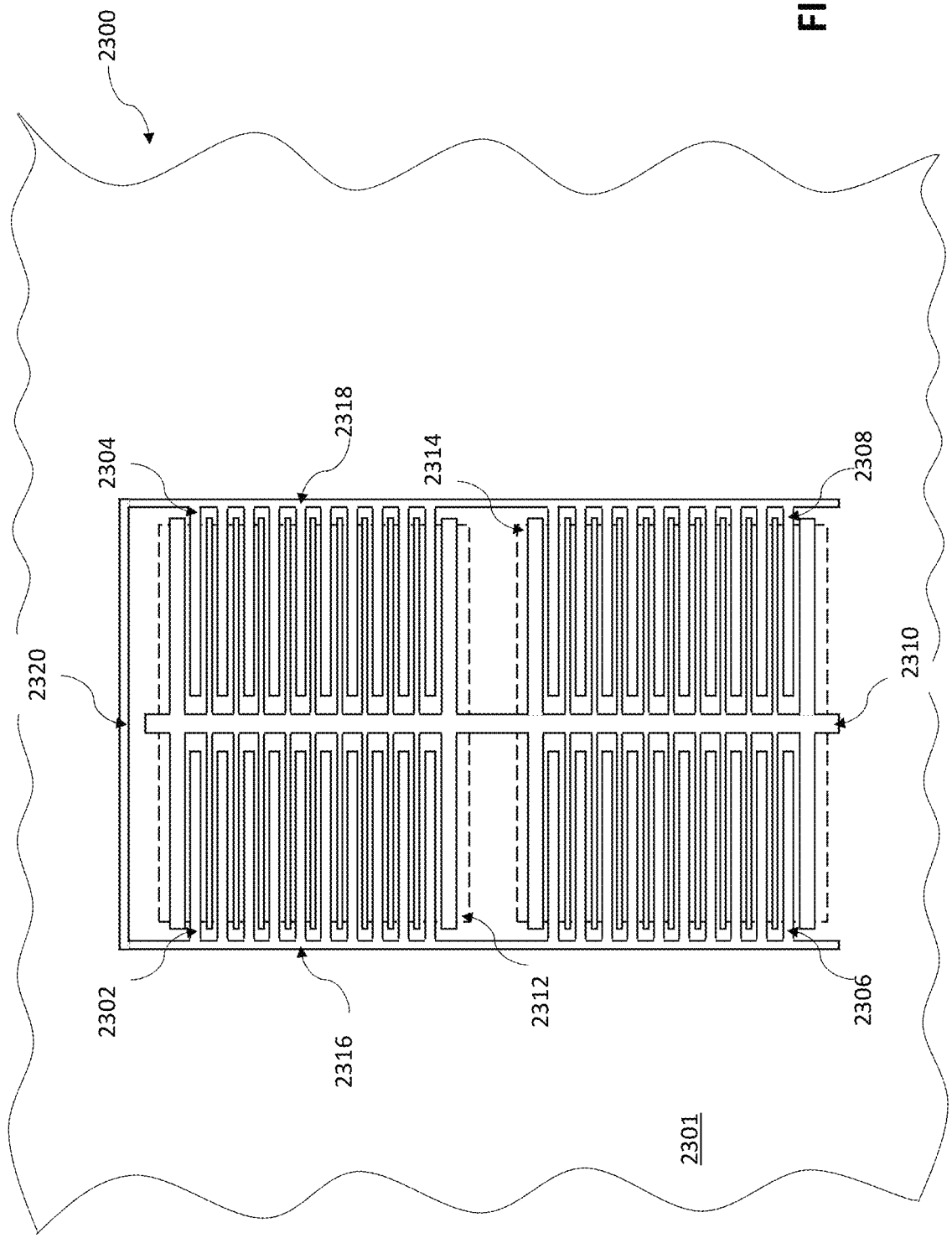
FIG. 23 is a top view schematic of a MEMS transducer with multiple cavities in accordance with yet another example.

FIG. 23 depicts a top, schematic view of a transducer 2300 including an array of beams with multiple cavities in accordance with another example. Transducer 2300 includes four arrays of fixed-free beams 2302, 2304, 2306, and 2308 fixed to a substrate 2301. The beam arrays 2302, 2304, 2306, and 2308 may be similar to those described in FIGS. 8-15. The transducer 2300 includes a first cavity 2312 through the substrate 2301 over which the fixed-free beam arrays 2302 and 2304 are suspended and a second cavity 2314 through the substrate 2301 over which the fixed-free beam arrays 2306 and 2308 are suspended. The fixed-free beams 2302, 2304, 2306, and 2308 are interdigitated with fixed-fixed beams connected to the anchor 2310. At least one part of the anchor 2310 is suspended over at least one of the cavities 2312 and/or 2314. At least one part of the anchor 2310 may also be fixed to the substrate of sensor 2300. In some examples, the anchor 2310 may include multiple anchors connected electrically or mechanically. When excited by the same external stimulus, the fixed-free beams 2302, 2304, 2306, and 2308 may move in phase with one another. Electrodes 2316 and 2318 are fixed to the substrate 2301 and connected to the fixed-free beams 2302, 2304, 2306, and 2308. Electrodes 2316 and 2318 may be further connected through a conductive trace 2320. The fixed-fixed beams and anchor 2310 do not move significantly relative to the motion of fixed-free beams 2302, 2304, 2306, and 2308 when subject to the same external stimulus. As fixed-free beams 2302, 2304, 2306, and 2308 vibrate, they create a change in capacitance with the fixed-fixed beams. In one example, the anchor 2310 connects the fixed-fixed beams such that they share the same conductive layers. An electrical signal may be sensed by any of the methods described in the previous examples. The first and second cavities 2306 and 2308 may have equal or different dimensions and have any orientation relative to one another as described previously. In some examples, a transducer such those described in FIGS. 18, 19, and 21 may be suspended above cavity 2312 and/or cavity 2314. In some examples, transducer 2300 may include more than two cavities. The more than two cavities may be positioned in any arrangement relative to one another as previously described.

Examples of MEMS transducers having multiple deflected electrodes are now described. In some cases, the electrodes may be deflected out of a plane in which anchored portions of the electrodes are disposed. As described above, the deflection may be a resting deflection, e.g., before interaction with an external stimulus. The deflection may or may not be after application of a bias voltage to one of the electrodes. Various configurations and arrangements of such deflected electrodes are described.

The examples have a number of aspects in common with one or more of the above-described examples. For instance, in one aspect, the examples use a capacitive sensing mechanism that deviates from traditional parallel plate sensing architectures employed by traditional MEMS sensors. In some cases, the electrodes are interdigitated, or positioned side-by-side, such that there is no vertical (e.g., perpendicular to the plane of the substrate supporting the moving element) overlap between the electrodes (e.g., no portion of an electrode has a portion of another electrode directly above or below it) as seen with many parallel plate sensing architectures employing the use of a backplate above or below the moving element. In some cases, one or more of the electrodes may be initially deflected relative to another. In this case, the capacitance established between multiple electrodes may have a contribution in part due to fringe capacitance. The initial deflection of one or more of the electrodes may be large compared to the gaps typically seen between MEMS sensors with parallel plate electrodes.

As described above, the transducers described below may be useful in a wide variety of microphone applications and contexts, including, for instance, various consumer electronic devices, automotive vehicles, and measurement microphones. The transducers described below are also useful in connection with accelerometers, gyroscopes, inertial sensors, pressure sensors, gas sensors, etc. In these examples, as the sensor experiences a vibratory event (e.g., an acceleration), the transducer vibrates, and the signal captured by the sensor then serves as an approximation of the motion of the sensor.

Figure 24:
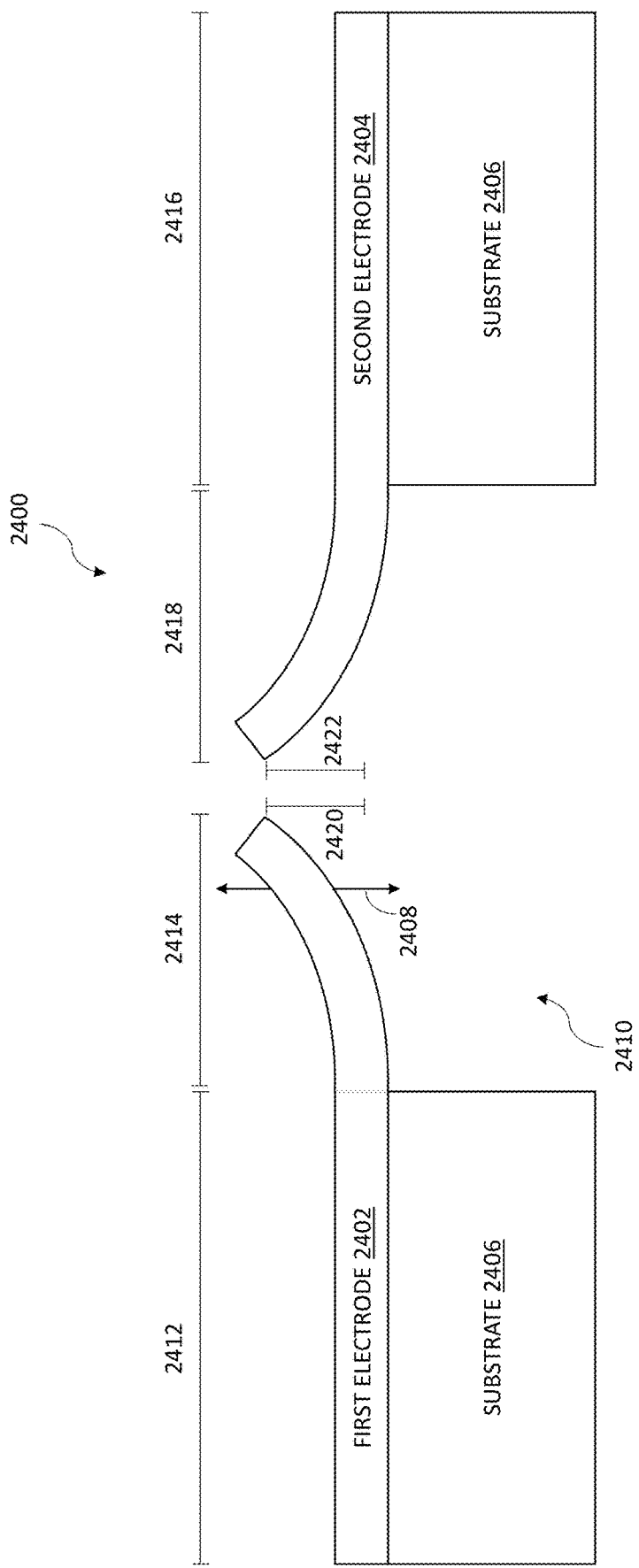
FIG. 24 is a cross-sectional (or side), schematic view of a MEMS transducer with a pair of deflected electrodes in accordance with one example

Turning now to FIG. 24, a cross-sectional view of a MEMS transducer 2400 in accordance with one example is depicted. The MEMS transducer 2400 includes a first electrode 2402 a second electrode 2404 supported by a substrate 2406. The first electrode 2402 is anchored on at least one side and free to vibrate along the direction 2408 perpendicular to the plane of the substrate 2406 and the first electrode's length. The substrate 2406 has a cavity 2410, which couples the first electrode 2402 and the second electrode 2404 to the external air. The second electrode 2404 is anchored on at least one side. In some cases, the second electrode 2404 may be constructed such that it exhibits no, or reduced, motion along direction 2408 relative to the first electrode when subject to the same external stimulus (e.g., a sound wave). Thus, the position of the first electrode 2402 along the direction 2408 relative to the second electrode 2804 changes in response to acoustic stimulus along direction 2408. In this case, the first electrode 2402 is considered a moving electrode, and the second electrode 2404 is considered a fixed electrode. In some examples, the thickness of the first electrode 2402 may be less than 2 microns (um) or less than 3 um. Alternatively or additionally, the first electrode 2402 may have an acoustic impedance that is approximately equal to the acoustic impedance of the surrounding air.

The first electrode 2402 and second electrode 2404 have at least one conductive layer each such that a capacitance is established between them. Unlike parallel plate capacitors where the two electrodes are typically positioned above one another, the first electrode 2402 is positioned to the side of the second electrode 2404. The electrodes 2402 and 2404 are said to be side-by-side. The second electrode 2404 is depicted to the right of the first electrode 2402 in FIG. 24. At least one part of the second electrode 2404 may be positioned in front of or behind the first electrode 2402.

The first electrode 2402 includes a number of portions. The first electrode 2402 has a first portion 2412 that is anchored, or supported by, the substrate 2406 and a second portion 2414 that extends outwards from the first portion 2412. The second electrode 2404 also has a first portion 2416 that is anchored, or supported by, the substrate 2406 and a second portion 2418 that extends outwards from the first portion 2416. The second portions 2414 and 2418 of the first electrode 2402 and second electrode 2404 respectively define a gap between the first and second electrode to establish a capacitance indicative of vibrational movement. Other portions of the first electrode 2402 and second electrode 2404 may contribute to the capacitance, including, for instance, the first portions 2412 and 2416. Thus, and as shown in connection with a number of examples described herein, the gap may be considered to establish a capacitance regardless of the extent to which other portions of the first electrode 2402 and second electrode 2404 also contribute to the capacitance. In some cases, the length of the first portions 2412 and 2416 may be between 5 um to 50 um. The length of the second portions 2414 and 2418 may be between 50 um to about 500 um, but other amounts may be used. In some cases, the lengths of the second portions 2414 and 2418 may not be equal. In other cases, the lengths of the second portions 2414 and 2418 may be equal.

The second portion 2414 of the first electrode 2402 has a resting, warping, or other deflection 2420 relative to the first portion 2412. In this case, the deflection is measured or defined relative to a midpoint of the electrode 2402. The deflection may be defined relative to any non-deflected portion of the electrode in other cases, such as a lower or bottom surface of the non-deflected portion. Similarly, the second portion 2418 of the second electrode 2404 has a resting, warping, or other deflection 2422 relative to the first portion 2416. In some cases, the resting deflections 2420 and 2422 may arise from warping of the first electrode 2402 and second electrode 2404 during fabrication. When the transducer 2400 is not subject to any sound and is at equilibrium, the first electrode 2402 and second electrode 2404 are offset by deflection 2420 and 2422 respectively. The resting deflections may correspond with the position attained after application of a bias voltage, but without external excitation. In some cases, the initial deflections 2420 and 2422 may be different. In other cases, the initial deflections 2420 and 2422 may be approximately equal. For example, if the length of the first electrode 2402 and the second electrode 2404 are different, the resting deflections 2420 and 2422 may be different. The electrode with a longer length may have a larger resting deflection. If the length of the first electrode 2402 and the second electrode 2404 are the same, the initial deflections 2420 and 2422 may be approximately equal. In some examples, the initial deflections 2420 and 2422 may fall in a range from about 5 um to about 50 um, but other amounts may be used. The initial deflections may be such that the second portions 2414 and 2418 of the first and second electrodes 2402 and 2404 are above the first portions 2412 and 2416. In such an example, the first and second electrodes 2402 and 2404 may be under tensile stress.

A capacitance is formed between the first electrode 2402 and the second electrode 2404. As the first electrode 2402 experiences motion along the direction 2408, the capacitance between the first electrode 2402 and second electrode 2404 may change. As the first electrode 2402 approaches the second electrode 2404, the capacitance increases. As the first electrode 2402 moves away from the second electrode 2404, the capacitance decreases. The changes in capacitance between the first electrode 2402 and the second electrode 2404 can then be converted into an electronic signal that represents the motion of the first electrode 2402.

A fixed bias voltage may be placed on one of the electrodes 2402 or 2404. As the first electrode 2402 moves along direction 2408, this may result in a change in the charge and/or voltage seen at the electrode 2402 or 2404 on which there is no bias voltage placed. In one example, a bias voltage is placed on the first electrode 2402 and the second electrode 2404 is connected to a voltage amplifier that holds the charge on the second electrode constant and amplifies the voltage change seen on the second electrode as the first electrode vibrates. The second electrode 2404 may be instead connected to a charge amplifier that holds the voltage on the second electrode constant and amplifies the charge change seen at the second electrode as the first electrode 2402 vibrates. In another example, a bias voltage is placed on the second electrode 2402 and the first electrode 2402 is connected to a voltage amplifier. In yet another example, the first electrode 2402 may be instead connected to a charge amplifier. The bias voltage used may have a positive or negative value. The bias voltage may further have a DC and/or an AC component. In some examples, as a bias voltage is placed on electrode 2402 or 2404, the initial deflections 2420 and/or 2422 may reflect the equilibrium position attained via application of the bias voltage (e.g., the deflection may increase or decrease relative to the first portions 2412 and 2416 of the electrodes 2402 and 2404). The initial deflection 2420 and 2422 experienced may thus be dependent on the amplitude of the bias voltage and/or mechanical properties of the electrodes 2402 and 2404. In some examples, a bias voltage between 1V-50V may be used.

The first electrode 2402 may have a length greater than its width and/or thickness. The length of each electrode may correspond with the dimension in which the electrode projects from an anchor point, and the dimension in which the gap is defined. Additionally, the first electrode 2402 may have a width similar to or greater than its thickness.

In some examples, the substrate 2406 may be composed of, or otherwise include, silicon, glass, or other material. The first electrode 2402 and second electrode 2404 may include one or multiple layers including any combination of silicon, oxide, nitride, or a polymer. For example, the first electrode 2402 and/or second electrode 2404 may be a single layer composed of, or otherwise including, silicon, doped silicon, polysilicon, amorphous silicon, or include a metal such as aluminum, copper, gold, or tungsten. In other examples, the first electrode 2402 and/or second electrode 2404 may include multiple layers, such as three layers. The three layers of the first and second electrodes 2402 and 2404 may be composed of, or otherwise include, polysilicon, nitride, and polysilicon respectively. In other examples, the first and second electrodes 2402 and 2404 may be composed of, or otherwise include, nitride, polysilicon, and nitride, respectively. In some examples, the first electrode layers and second electrode layers are deposited during the same manufacturing steps. In one example, the first electrode 2402 and second electrode 2404 may have a thickness falling in a range from about 50 nm to about 2000 nm, but other thicknesses may be used. The thickness of the first electrode 2402 and the second electrode 2404 may be the same or different.

Figure 25:
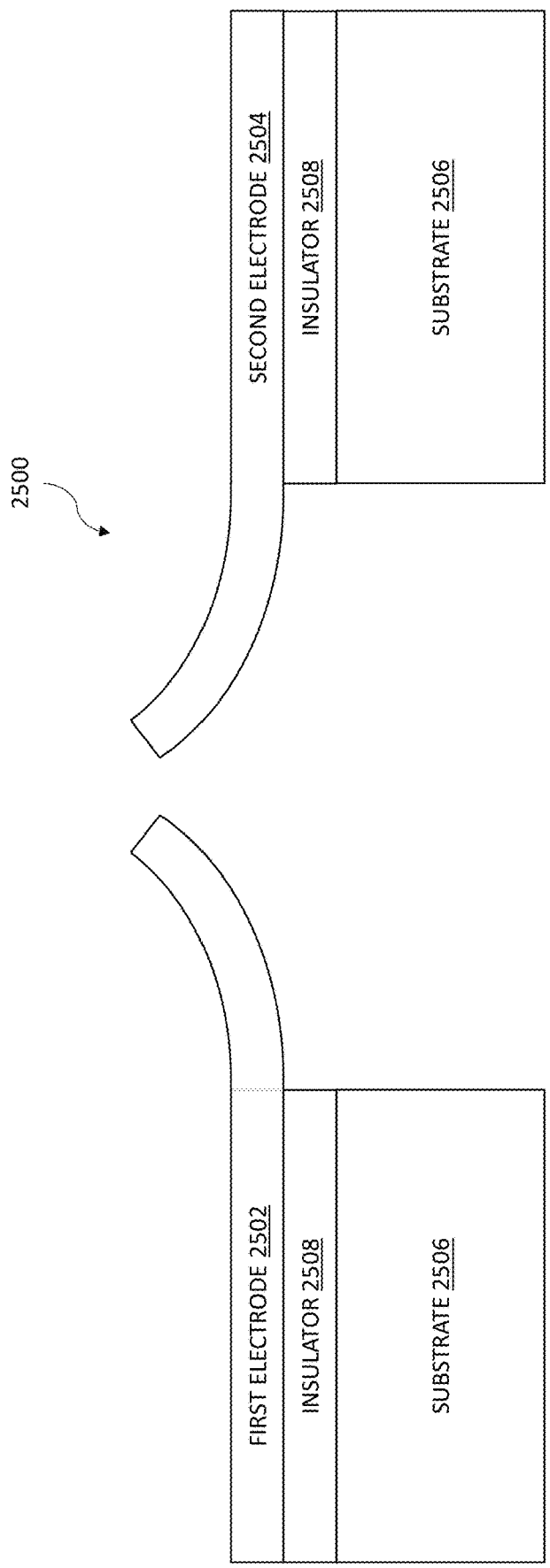
FIG. 25 is a cross-sectional (or side), schematic view of a MEMS transducer with deflected electrodes spaced from a substrate by an insulator layer in accordance with another example.

In some cases, an insulating layer may be placed between the electrodes and substrate. FIG. 25 depicts a cross-sectional or side view of one such transducer 2500 in accordance with one example. Transducer 2500 includes a first electrode 2502 and second electrode 2504 supported by a substrate 2506 through insulator 2508. The insulator 2508 ensures that there is no electrical connection between the first and second electrodes 2502 and 2504 and the substrate 2506 and may also act as an etch stop during the manufacturing process. The insulator 2508 may include one or multiple layers including any combination of silicon, oxide, nitride, or a polymer. For example, insulator 2508 may be composed of, or otherwise include, a thermal oxide.

Figure 26:
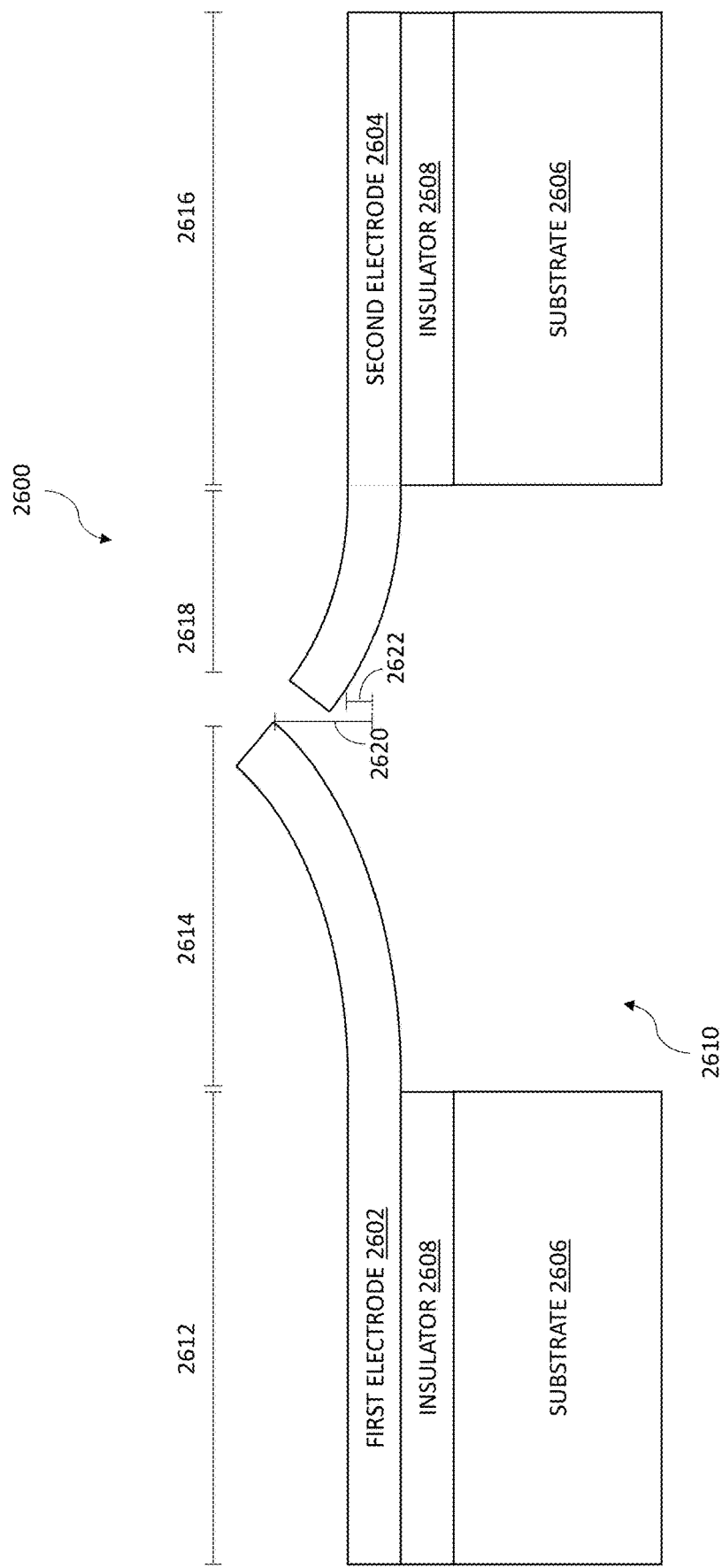
FIG. 26 is a cross-sectional (or side), schematic view of a MEMS transducer with deflected electrodes of varying lengths in accordance with yet another example.

FIG. 26 depicts a cross-sectional view of a transducer 2600 in accordance with another example. Transducer 2600 includes a first electrode 2602 and second electrode 2604 supported by a substrate 2606 through insulator 2608. The substrate 2606 has a cavity 2610. The first electrode 2602 has a first portion 2612 that is anchored, or supported by, the substrate 2606 and a second portion 2614 that extends outwards from the first portion 2612. The second electrode 2604 also has a first portion 2616 that is anchored, or supported by, the substrate 2606 and a second portion 2618 that extends outwards from the first portion 2616. The second portion 2614 of the first electrode 2602 has a resting deflection 2620 relative to its first portion 2612. The second portion 2618 of the second electrode 2604 has a resting deflection 2622 relative to its first portion 2616.

The length of the second portion 2614 of the first electrode 2602 is greater than the length of the second portion 2618 of the second electrode 2604. Consequently, the resting deflection 2620 may be greater than the resting deflection 2622.

Figure 27:
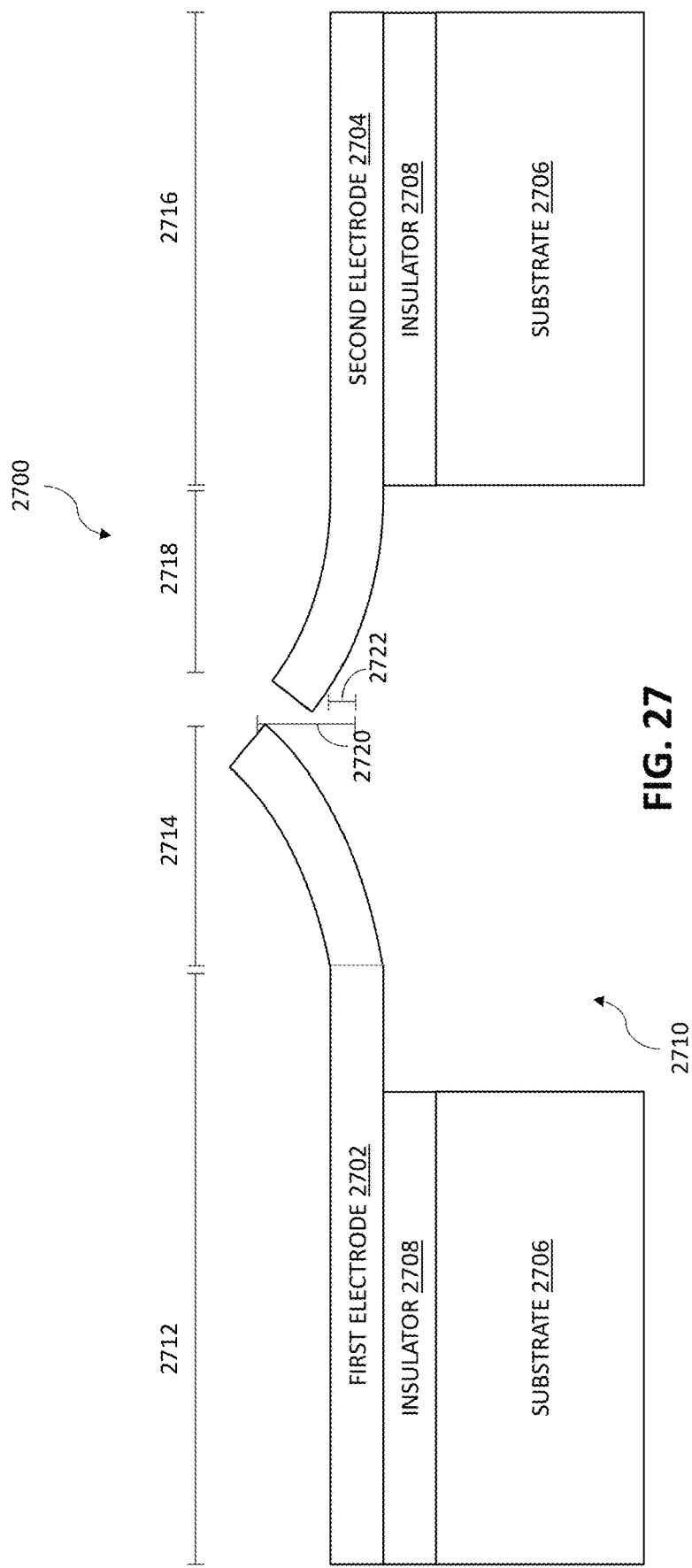
FIG. 27 is a cross-sectional (or side), schematic view of a MEMS transducer with deflected electrodes of varying configuration in accordance with yet another example.

FIG. 27 depicts a cross-sectional view of a transducer 2700 in accordance with yet another example. Transducer 2700 includes a first electrode 2702 and second electrode 2704 supported by a substrate 2706 through insulator 2708. The substrate 2706 has a cavity 2710. The first electrode 2702 has a first portion 2712 that is anchored, or supported by, the substrate 2706 and a second portion 2714 that extends outwards from the first portion 2712. The second electrode 2704 also has a first portion 2716 that is anchored, or supported by, the substrate 2706 and a second portion 2718 that extends outwards from the first portion 2716. The second portion 2714 of the first electrode 2702 has a resting deflection 2720 relative to its first portion 2712. The second portion 2718 of the second electrode 2704 has a resting deflection 2722 relative to its first portion 2716.

The first portion 2712 of the first electrode 2702 is cantilevered such that it extends outward from the substrate 2706 by which it is supported and is partially suspended over cavity 2710. An external stimulus, such as a sound wave, may excite the first portion of the first electrode 2712 and cause it to vibrate relative to the first portion of the second electrode 2716. The first portion of the first electrode 2712 may or may not have a resting deflection relative to the first portion of the second electrode 2716. The second portion of the first electrode 2714 has a resting deflection relative to the first portion 2712. In some examples, the first portion 2712 may be constructed to increase the response of the transducer 2700 to an external sound wave while the second portion 2714 may be constructed to increase the capacitance of transducer 2700. For example, the first portion 2712 may include an array of connected beams or a porous plate and the second portion 2714 may include capacitive fingers.

In some examples, the first portion of the second electrode 2716 may additionally or alternatively be cantilevered such that it extends outward from the substrate 2706 by which it is supported. The first portion may still be made relatively stiff such that it does not move significantly relative to the first electrode when subject to external stimulus such as a sound wave.

Figure 28:
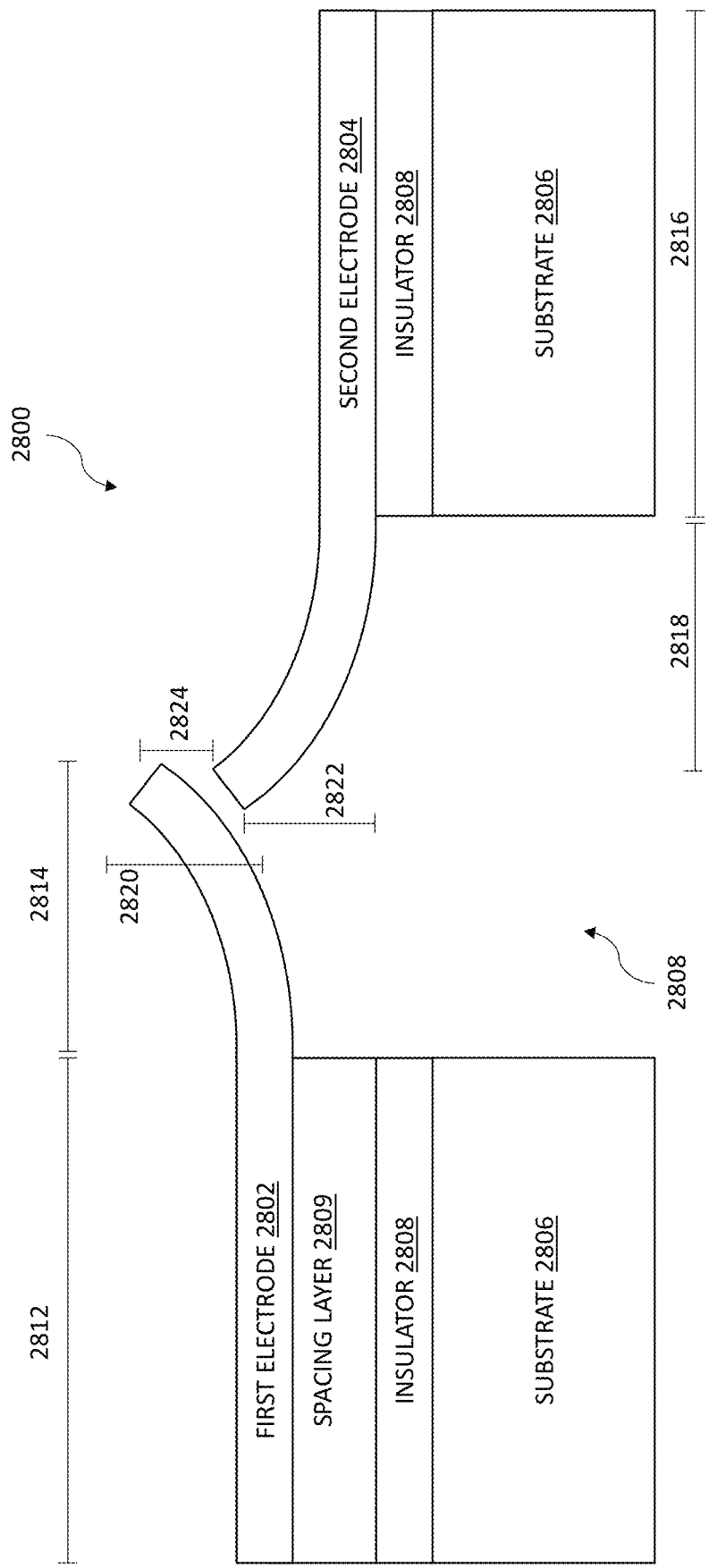
FIG. 28 is a cross-sectional (or side), schematic view of a MEMS transducer with deflected electrodes anchored at different heights in accordance with yet another example.

FIG. 28 depicts a cross-sectional view of a transducer 2800 in accordance with yet another example. Transducer 2800 includes a first electrode 2802 and second electrode 2804 supported by a substrate 2806 through insulator 2808. First electrode 2808 is further supported by the substrate 2806 through spacing layer 2809. The spacing layer 2809 may be conductive or nonconductive. The substrate 2806 has a cavity 2810 which couples the first and/or second electrodes 2802 and/or 2804 to the ambient air. The first electrode 2802 has a first portion 2812 that is anchored, or supported by, the substrate 2806 and a second portion 2814 that extends outwards from the first portion 2812. The second electrode 2804 also has a first portion 2816 that is anchored, or supported by, the substrate 2806 and a second portion 2818 that extends outwards from the first portion 2816. The second portion of the first electrode 2814 has a resting deflection 2820 relative to its first portion 2812. The second portion of the second electrode 2818 has a resting deflection 2822 relative to its first portion 2816.

The spacing layer 2809 has a thickness such that the gap 2824 between the tip of the first electrode 2802 (e.g., the free end of the second portion 2814) and the tip of the second electrode 2804 (e.g., the free end of the second portion 2818) is greater than if the spacing layer were not present. In some examples where the spacing layer 2809 is sufficiently thick, the resting deflections 2820 and/or 2822 may be zero such that the second portions 2814 and/or 2818 do not have a resting deflection relative to the first portions 2812 and 2816 respectively.

Figure 29A:
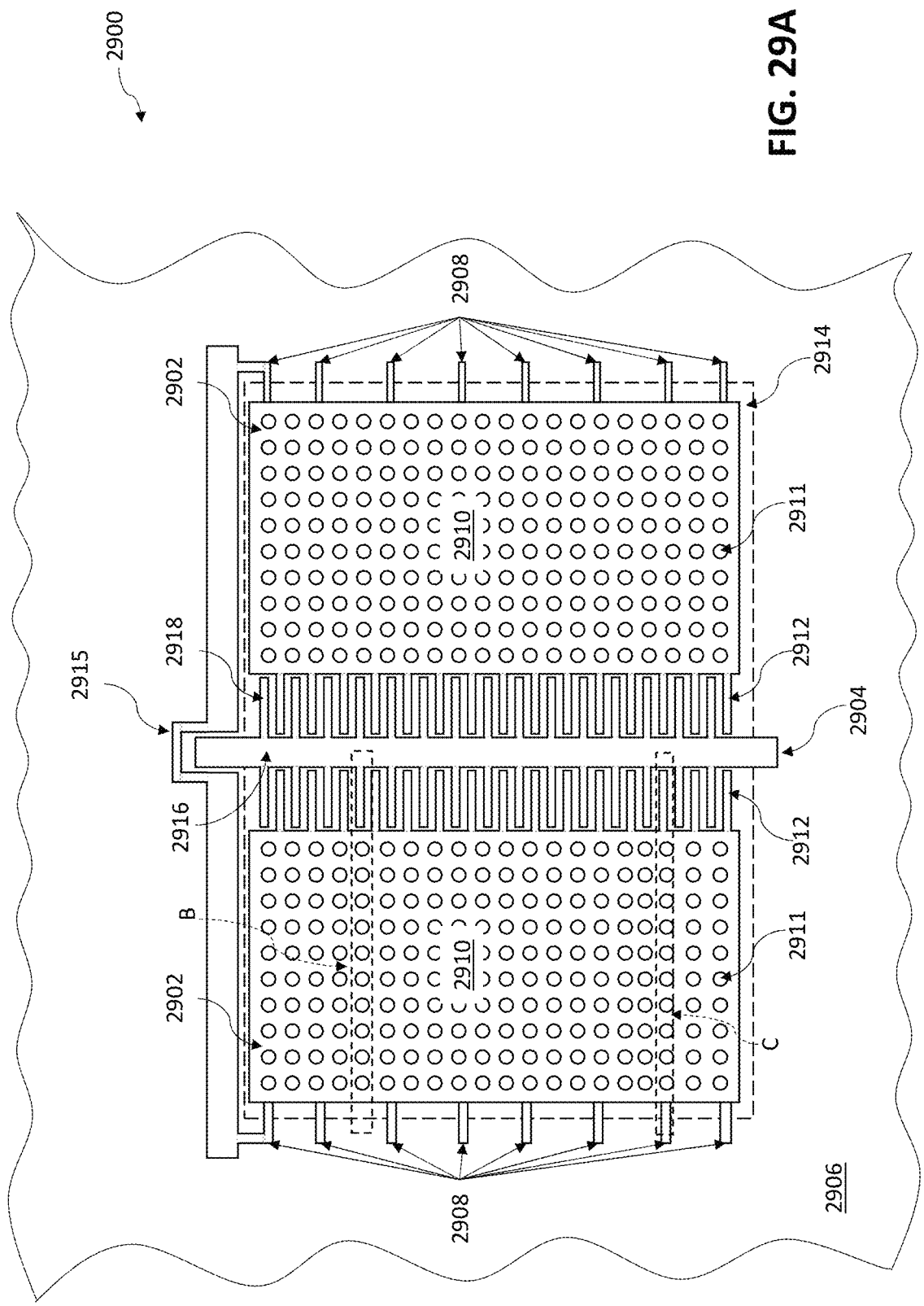
FIG. 29A is a top, schematic view of a MEMS transducer with plate-shaped and finger-shaped deflected electrodes in accordance with one example.

FIGS. 29A-29C show an example of a transducer 2900 in which the electrodes are cantilevered (e.g., it is anchored on only one end). FIG. 29A depicts a top view of the transducer 2900. The transducer 2900 includes a first electrode having plate-like structures 2902 and a second electrode having capacitive fingers 2904. The first electrode 2902 and second electrode 2904 are supported by substrate 2906. The first electrode 2902 includes a first portion, or tabs, 2908 that are anchored to the substrate 2906. The first electrode further includes a second portion 2910 that extends outwards from the first portion 2908 and is suspended above cavity 2914 in the substrate 2906. The second portion 2910 has a resting deflection relative to the first portion 2908. In some examples, the second portion 2910 may include a porous plate, or a plate-like structure with holes and/or capacitive fingers. For example, the second portion 2910 may have capacitive fingers 2912 that extend from the outer perimeter of the porous plate with holes 2911. Both the porous plate 2910 and the fingers 2912 may be warped as described herein.

The substrate 2906 may have one or more cavities to couple the plates 2910 to the ambient air. When subject to an external stimulus, such as a sound wave, the first electrode 2902 may vibrate. In some examples, the second portion of the first electrode 2910 may include one or more porous plates. For example, the second portion 2910 may include two porous plates electrically connected through trace 2915. In other examples, the second portion 2910 may include four porous plates. In yet other examples, the porous plate may instead be or include an array of cantilever beams with gaps in between each respective beam. The gaps between the cantilever beams may approximate, or serve a similar purpose as, the holes 2911. The beams in the array may or may not be mechanically coupled (e.g., like a grill). In some examples, the second portion of the first electrode 2910 may not include capacitive fingers 2912.

In other examples, the second portion 2910 may include a solid plate, without holes. The plate may or may not have capacitive fingers along the edge.

The second electrode 2904 of transducer 2900 may include a first portion 2916 and a second portion 2918. The first portion may be anchored to the substrate 2906 and may be partially suspended over the cavity 2914. The second portion 2918 may include capacitive fingers that extend outward from the first portion 2916. The first portion 2916, may be constructed such that the first portion is relatively flat. For example, the first portion 2916 may be a beam that is anchored on both of its opposing ends. The second portion 2918 having capacitive fingers may have a resting deflection relative to the first portion 2916.

The capacitive fingers of the second portion of the first electrode 2912 may be interdigitated with respect to the capacitive fingers of the second portion of the second electrode 2918. In some examples, the resting deflection of the second portion of the first electrode 2910 may be greater than the resting deflection of the second portion of the second electrode 2918. The second portion of the second electrode 2918 may be constructed such that it is relatively stiff and does not move significantly compared to the motion of the second portion of the first electrode 2912 when subject to the same external stimulus. In some examples, the second portion of the first electrode 2910 having a porous or nonporous plate and capacitive fingers may have a length between 100 um to 750 um, though other lengths may be used. The second portion of the second electrode 2918 having capacitive fingers may have a length between 50 um to 500 um, though other lengths may be used.

FIG. 29B depicts a side view of a portion B of the transducer 2900 identified in FIG. 29A. The first electrode 2902 and second electrode 2904 of transducer 2900 are supported by a substrate 2906 through insulator 2907. The substrate 2906 has a cavity 2914 which couples the electrodes 2902 and 2904 to the ambient air. The first electrode 2902 has a first portion 2908 that is anchored, or supported by, the substrate 2906 and a second portion 2910 (e.g., porous plate) that extends outwards from the first portion. The second portion 2910 may contain holes 2911 as shown. The second electrode 2904 also has a first portion 2916 that is anchored, or supported by, the substrate 2906 a second portion 2918 that extends outwards from the first portion with a resting deflection 2922 relative to its first portion 2916. In some cases, the first portion of the first electrode 2908 may be partially suspended over cavity 2914.

FIG. 29C depicts a side view of a portion C of the transducer 2900 identified in FIG. 29A. The second portion 2910 of the first electrode 2902 contains holes 2911 and a capacitive finger 2912 at the tip of its free end. The finger 2912 may establish a capacitance with the first portion 2916 and second portion 2918 of the second electrode 2904. The second portion of the first electrode 2910 has a resting deflection 2926 relative to the first portion 2908 and the finger 2912 extends all the way to the first portion of the second electrode 2916.

In some examples, the second portion 2910 may not contain holes 2911. The second portion 2910 may be nonporous.

The side views of FIGS. 29B and 29C are simplified for ease in illustration. One or more features depicted in the figures may not be drawn to scale. For instance, the length of the suspended portion 2910 may be much longer than shown (e.g., relative to other portions, such as the portion 2918). The relative amount of deflection depicted in FIGS. 29B and 29C may also not be depicted to scale. The amount of deflection exhibited by the portion 2910 (e.g., the porous plate) is shown in FIG. 29B for ease in illustration, and is not deflected more than the finger 2912 shown in FIG. 29C. Also, the number of holes 2911 has been reduced (e.g., relative to the depiction in FIG. 29A) for ease in illustration.

Figure 30:
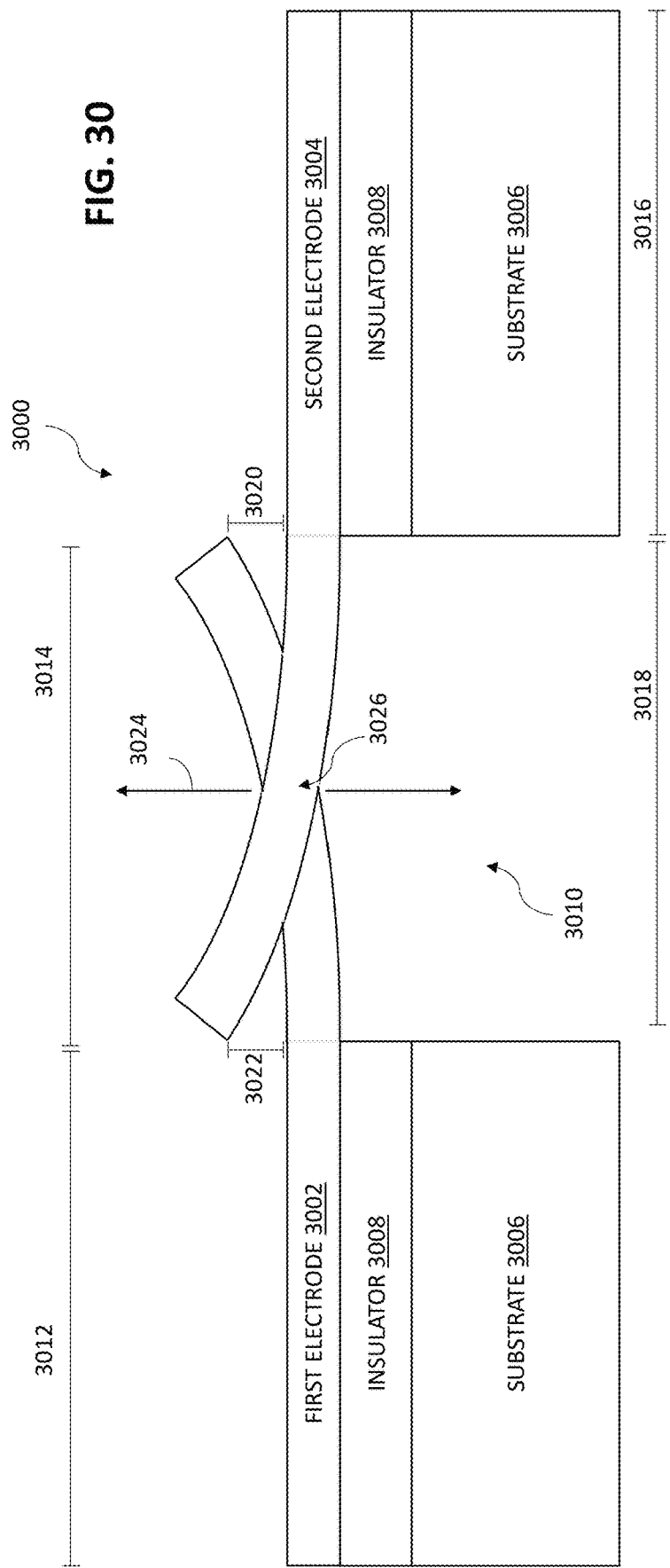
FIG. 30 is a cross-sectional, schematic view of a MEMS transducer with crossing deflected electrodes in accordance with yet another example.

FIG. 30 depicts a cross-sectional view of a transducer 3000 in accordance with yet another example. Transducer 3000 includes a first electrode 3002 and second electrode 3004 supported by a substrate 3006 through insulator 3008. The substrate 3006 has a cavity 3010 which couples the first and second electrodes 3002 and 3004 to the ambient air. The first electrode 3002 has a first portion 3012 that is anchored, or supported by, the substrate 3006 and a second portion 3014 that extends outwards from the first portion 3012. The second electrode 3004 also has a first portion 3016 that is anchored, or supported by, the substrate 3006 and a second portion 3018 that extends outwards from the first portion 3016. The second portion 3014 of the first electrode 3002 has a resting deflection 3020 relative to its first portion 3012. The second portion 3018 of the second electrode 3004 has a resting deflection 3022 relative to its first portion 3016.

The first and second electrodes 3002 and 3004 are configured such that they both move along direction 3024 when subject to an external stimulus. Therefore, both electrodes 3002 and 3004 are said to be moving electrodes. In some cases, the first and second electrodes 3002 and 3004 move approximately the same amount for the same external stimulus. In other cases, the first and second electrodes 3002 and 3004 move a different amount for the same external stimulus.

The first moving electrode 3002 has a resting deflection 3020 and the second moving electrode 3004 has a resting deflection 3022 such that the electrodes have a region of overlap 3026 at which they cross one another. There exists an air gap not shown between the electrodes 3002 and 3004 such that they do not collide with one another and are free to move independently. The electrodes 3002 and 3004 may include multiple electrodes (e.g., cantilever beams or capacitive fingers) that are interdigitated with one another. The electrodes 3002 and 3004 include at least one conductive layer such that a capacitance is established between them. As the electrodes 3002 and 3004 move away from the substrate 3006, the overlap area 3026, and thus capacitance, decreases. As the electrodes 3002 and 3004 move closer to the substrate 3006, the overlap area 3026, and thus capacitance, increases. The changing capacitance can then be converted into an electronic signal with those methods described by FIG. 1. During normal operation (e.g., the linear regime of operation), the overlap area 3026 may be less than the total surface area of the second portions 3014 and 3018 that face one another. In other words, the second portions of the electrodes 3014 and 3018 always maintain some deflection relative to the first portions 3012 and 3016 during operation. In some cases, the deflection of the second portions 3014 and 3018 never becomes zero, or below the first portions 3012 and 3016, during operation. In other words, during operation of the transducer 3000, the overlap area 3026 is never the same for two different acoustic stimuli (i.e., for two sound waves of different frequency and/or sound pressure level) in some examples.

The resting deflection of the first moving electrode 3020 and the resting deflection of the second moving electrode 3022 may be equal in magnitude or different. In some examples, the resting deflections 3020 and/or 3022 for each of second portions 3014 and 3018 may monotonically increase as they extend further away from the substrate 3006. In other examples, the resting deflections 3020 and/or 3022 for each of second portions 3014 and 3018 may decrease as they extend further away from the substrate 3006. In some examples, the resting deflections 3020 and 3022 may be in opposing directions. In some examples, the first electrode 3002 is identical and opposite facing to the second electrode 3004. In other examples, the first electrode 3002 may have a different length, width, thickness, or altogether different design than the second electrode 3004.

Figure 31:
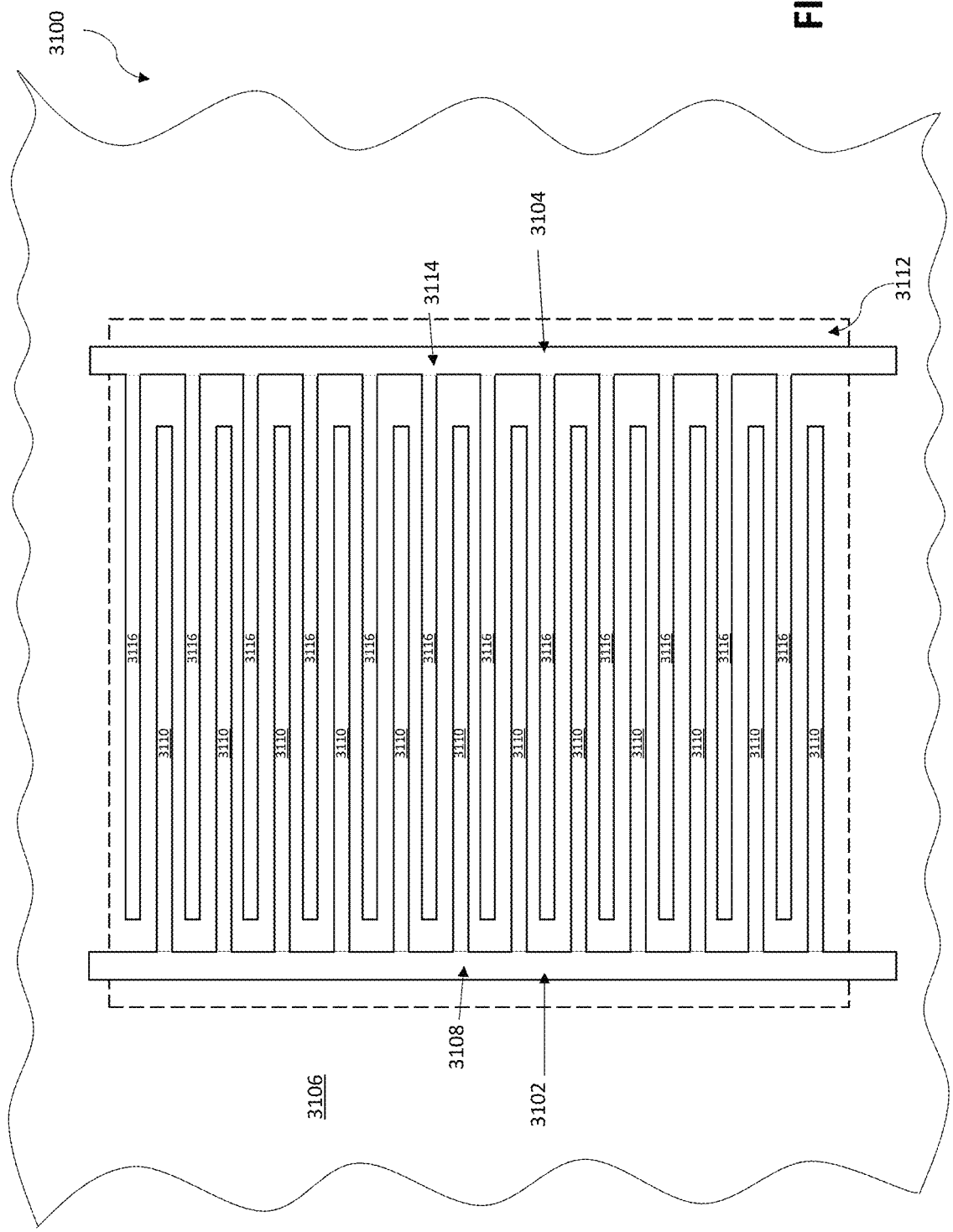
FIG. 31 is a top, schematic view of a MEMS transducer with interdigitated, deflected electrodes in accordance with yet another example.

FIG. 31 depicts a transducer 3100 in accordance with one example. The first electrode 3102 and second electrode 3104 of transducer 3100 are an array of opposite facing cantilevers supported by substrate 3106. The first electrode 3102 has a first portion 3108 that is anchored to substrate 3106 and a second portion 3110 that extends outward from the first portion. The second portion 3110 is cantilevered such that it is attached on one end to the first portion 3108 and free to move on the opposing end. The second portion 3110 is suspended over a cavity 3112 in the substrate 3106. The second electrode 3104 has a first portion 3114 that is anchored to substrate 3106 and a second portion 3116 that extends outward from the first portion and suspended over cavity 3112. The second portion 3116 is cantilevered such that it is attached on one end to the first portion 3108 and free to move on the opposing end. Each of the second portions 3110 and 3116 have a resting deflection as described in FIG. 8. As an acoustic stimulus excites the second portions of the cantilever arrays 3110 and 3116, the second portions move synchronously such that the overlap region between the two sets of cantilevers, and thus capacitance, oscillates with the stimulus. A bias voltage may be placed on either electrode 3102 or 3104 while the other is connected to an amplifier. Either of the electrodes 3102 or 3104 may differ from one another in dimensions or design. Electrodes 3102 and/or 3104 may be replaced with any electrode design that is constructed such that the electrode moves in response to the acoustic stimulus and has a second portion with a resting deflection relative to its first portion.

Figure 32:
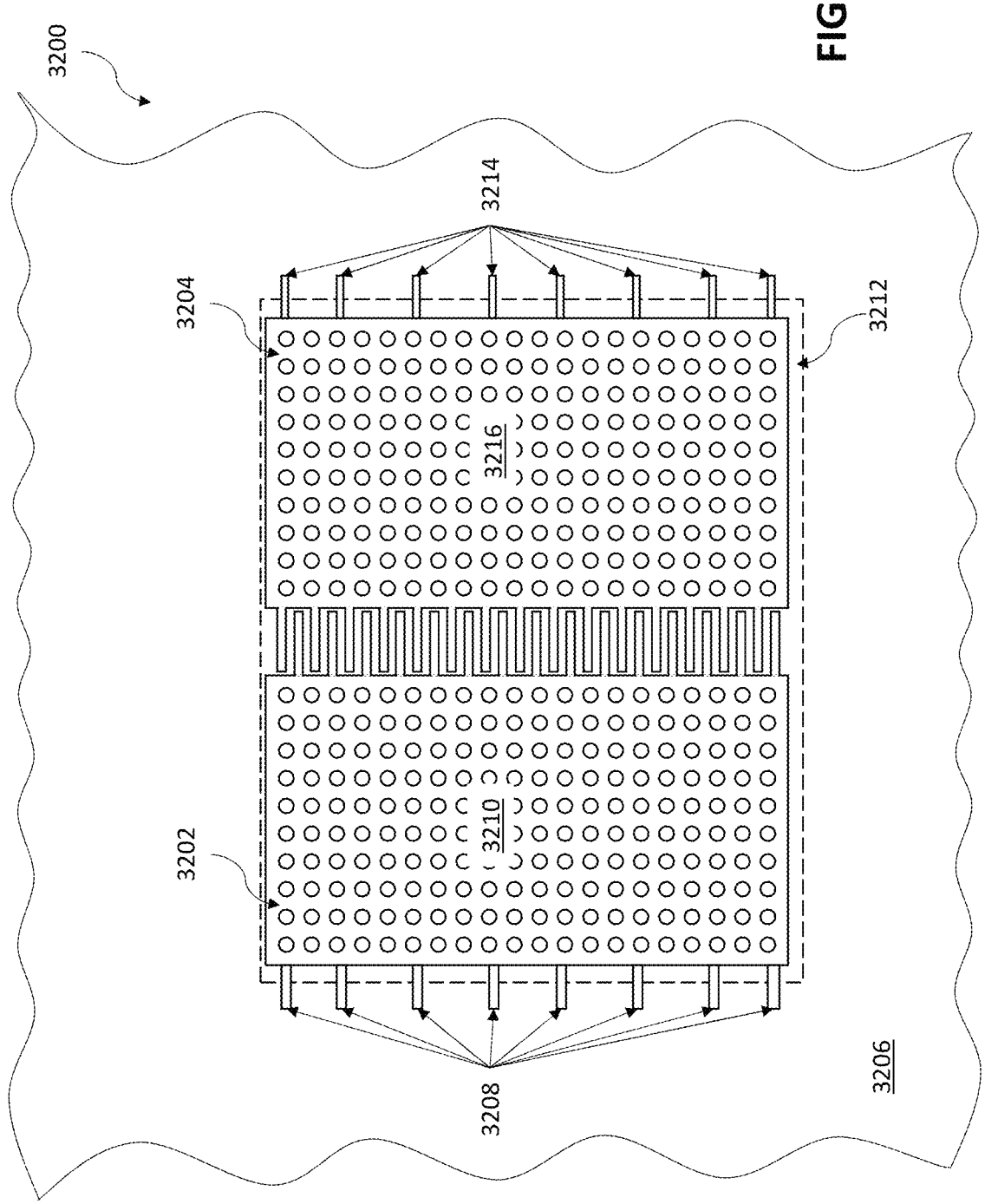
FIG. 32 is a top, schematic view of a MEMS transducer with diaphragm-shaped, deflected electrodes in accordance with yet another example.

FIG. 32 depicts a transducer 3200 in accordance with another example. The transducer 3200 includes two opposite facing electrodes 3202 and 3204 that are constructed as plate-like diaphragms and supported by the surrounding substrate 3206. The first electrode 3202 has a first portion 3208 that is anchored to substrate 3206 and a second portion 3210 that extends outward from the first portion and is suspended over cavity 3212. The second portion 3210 includes a porous plate with capacitive fingers that extend outward from the free end of the plate. The second electrode 3204 has a first portion 3214 that is anchored to substrate 3206 and a second portion 3216 that extends outward from the first portion and is suspended over cavity 3212. The second portion 3216 includes a porous plate with capacitive fingers that extend outward from the free end of the plate. Each of the second portions 3210 and 3216 have resting deflections as described in FIG. 8. The capacitive fingers of electrodes 3202 and 3204 are interdigitated with one another such that a capacitance exists between the two electrodes. As an acoustic stimulus excites the electrodes 3202 and 3204, the electrodes move synchronously such that the overlap region between the capacitive fingers of the second portions 3210 and 3216, and thus capacitance, oscillates with the excitation. A bias voltage may be placed on either electrode 3202 or 3204 while the other is connected to an amplifier.

In some examples, the electrodes 3202 and 3204 are identical to one another. In other examples, the electrodes 3202 and 3204 are different. For example, electrode 3202 may have a different length, width, thickness, and/or anchors than electrode 3204 such that they have a different resonant frequency from one another. The hole size and/or spacing of the porous plates in the second portion 3210 may be different than that of the porous plate in the second portion 3216. In another example, the capacitive fingers of the second portion 3210 may be a different length than the capacitive fingers of the second portion 3216. One of the electrodes 3202 or 3204 may be replaced with an array of fixed-free cantilever beams altogether.

In other examples, the plates including the first electrode 3202 and the second electrode 3204 may not be porous.

In any one or more of the above figures in which the top, schematic view does not specify whether the fixed and moving electrodes are flat or planar (e.g., disposed in a same plane), the plate-like diaphragms and fixed-free beams may have an initial or otherwise resting deflection relative to the fixed electrodes, as depicted in and described in connection with FIG. 2. The resting deflection may correspond with the position attained after application of a bias voltage, but without excitation by the external medium. The profile of curvature of the moving electrodes may take any shape so long as the free end of the moving electrodes are deflected above or below the fixed electrode. Any method of biasing and sensing the electrodes may be used, as described in connection with FIGS. 2-4. The transducers depicted in the top views may incorporate any one or more features of the MEMS transducers described herein in connection with other examples, including, for instance, those described in connection with any of the other examples depicted in cross-sectional or side views.

Described above are transducers configured to sense sound and other oscillatory stimuli. The transducers include a moveable electrode that may be disposed beside a fixed electrode. The moveable electrode has a cantilevered portion (e.g., a tip) with an initial deflection. During operation, the tip or other portion of the cantilevered electrode may not reach or cross the fixed electrode. Each electrode may include any number of connected structures (e.g., anchors, plates, fingers, beams, etc.) held at the same potential. In some cases, the fixed electrode may be biased and the cantilevered electrode is connected to an amplifier as a sense electrode. In other cases, the cantilevered electrode is biased and the fixed electrode is connected to an amplifier.

In the preceding examples, the MEMS transducer includes one or more moving electrodes and one or more fixed electrodes. In other cases, the transducers may again include side-by-side electrodes but with one or more moving electrodes replacing the fixed electrodes of the previous examples.

As described above, the cantilevered electrode includes a porous plate in some cases. The porous plate may have fingers extending outward, along one or more sides of the perimeter. Alternatively, the cantilevered electrode may include an array of beams (e.g., fixed-free beams).

During operation, the moving electrodes may not change the direction in which the electrodes are deflected. For instance, the moving electrodes remain deflected up or deflected downward. The moving electrodes may be or otherwise include opposing plates or opposing fixed-free beams As described above, in accordance with another aspect of the disclosure, the disclosed transducers include a conductive layer patterned to define a plurality of electrodes. Both (or all) of the electrodes may be formed from the patterning of the conductive layer. The conductive layer may be one layer in a stack of layers configured to form and/or support the electrodes. The same conductive layer may be used for both the moving and fixed electrodes described herein. In some cases, the conductive layer may be composed of, or otherwise include, polysilicon. Alternatively or additionally, the conductive layer may be or include multiple (e.g., three) layers, such as a polysilicon layer, an insulator (i.e. a nitride layer), and a polysilicon layer. In such cases, the two polysilicon layers of the moving electrode may be held at the same potential, and the two polysilicon layers of the fixed electrode may be held at the same potential.

Described above are a number of examples of MEMS transducers having one or more pairs of electrodes. Each electrode pair is configured as a bias electrode-sense electrode pair. Either one of the electrodes may thus be configured as a bias electrode. The other electrode of the pair is accordingly configured as a sense electrode. As described above, in each of the examples, a moveable electrode of the electrode pair is configured for vibrational movement in a first direction (e.g., a vertical direction) during excitation of the moveable electrode. Also as described above, in each of the examples, the first direction is perpendicular to a second direction (e.g., a horizontal direction) in which the electrode pair are spaced apart from one another by a gap. In each of the examples, the moveable electrode has a cantilevered end that is warped along the first direction (e.g., upward or downward). In some cases, both electrodes of the pair exhibit such resting deflection.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A microelectromechanical system (MEMS) transducer comprising:
    a substrate; and
    a pair of electrodes supported by the substrate, the pair of electrodes being configured as a bias electrode-sense electrode couple;
    wherein:
        a moveable electrode of the pair of electrodes is configured for vibrational movement in a first direction during excitation of the moveable electrode;
        the pair of electrodes are spaced apart from one another by a gap in a second direction perpendicular to the first direction;
        the moveable electrode comprises a cantilevered end, the cantilevered end being warped to exhibit a resting deflection along the first direction; and
        the resting deflection is greater than a thickness of a fixed electrode of the pair of electrodes.

2. The MEMS transducer of claim 1, wherein the fixed electrode of the pair of electrodes has a cantilevered end, the cantilevered end being warped to exhibit a resting deflection along the first direction.

3. The MEMS transducer of claim 1, wherein the resting deflection is such that the cantilevered end does not reach or cross a midpoint of the fixed electrode of the pair of electrodes during operation in a linear regime.

4. The MEMS transducer of claim 1, wherein:
    each electrode of the pair of electrodes comprises a respective set of comb fingers, the respective sets of comb fingers being interleaved in a side-by-side arrangement;
    the side-by-side arrangement establishes the gap; and
    the resting deflection is greater than the gap.

5. The MEMS transducer of claim 1, wherein the moveable electrode comprises a porous plate.

6. The MEMS transducer of claim 1, wherein:
    each electrode of the pair of electrodes comprises a respective set of spaced apart beams, the respective sets of spaced apart beams being disposed in an alternating arrangement; and
    the alternating arrangement establishes the gap; and
    the resting deflection is greater than the gap.

7. The MEMS transducer of claim 1, wherein the resting deflection is greater than the vibrational movement of the moveable electrode.

8. The MEMS transducer of claim 1, wherein the resting deflection corresponds with an equilibrium position attained via application of a bias voltage between the pair of electrodes.

9. The MEMS transducer of claim 1, further comprising a conductive layer supported by the substrate, the conductive layer being patterned to define the pair of electrodes such that the pair of electrodes have the same thickness.

10. The MEMS transducer of claim 1, wherein a further electrode of the pair of electrodes is sufficiently shorter than the moveable electrode in the second direction such that the further electrode is effectively not moveable during the excitation of the moveable electrode.

11. The MEMS transducer of claim 1, wherein the resting deflection falls in a range from about 5 μm to about 50 μm.

12. A microelectromechanical system (MEMS) transducer comprising:
    a substrate; and
    a conductive layer supported by the substrate;
    wherein:
        the conductive layer comprises a pair of electrodes disposed alongside one another, the pair of electrodes being configured as a bias electrode-sense electrode couple;
        a moveable electrode of the pair of electrodes is configured for vibrational movement in a direction perpendicular to a planar portion of the conductive layer during excitation of the moveable electrode;
        the moveable electrode comprises a cantilevered end, the cantilevered end being warped to exhibit a resting deflection relative to the planar portion; and
        the resting deflection is greater than a thickness of the conductive layer.

13. The MEMS transducer of claim 12, wherein a fixed electrode of the pair of electrodes has a cantilevered end, the cantilevered end being warped to exhibit a resting deflection along the first direction.

14. The MEMS transducer of claim 12, wherein the pair of electrodes have the same thickness.

15. The MEMS transducer of claim 12, wherein:
    each electrode of the pair of electrodes comprises a respective set of comb fingers, the respective sets of comb fingers being interleaved in a side-by-side arrangement;
    the side-by-side arrangement establishes a gap between the pair of electrodes; and
    the resting deflection is greater than the gap.

16. The MEMS transducer of claim 12, wherein the planar portion of the moveable electrode comprises a porous plate.

17. The MEMS transducer of claim 12, further comprising first and second insulator layers, the conductive layer being disposed between the first and second insulator layers.

18. The MEMS transducer of claim 12, wherein a further electrode of the pair of electrodes is sufficiently shorter than the moveable electrode such that the further electrode is effectively not moveable during the excitation of the moveable electrode.

19. The MEMS transducer of claim 12, wherein the resting deflection falls in a range from about 5 μm to about 50 μm.

20. A microelectromechanical system (MEMS) transducer comprising:
a substrate; and
a pair of electrodes supported by the substrate, the pair of electrodes being configured as a bias electrode-sense electrode couple;
wherein:
 a moveable electrode of the pair of electrodes is configured for vibrational movement in a first direction during excitation of the moveable electrode;
 a further electrode of the pair of electrodes is spaced apart from the moveable electrode by a gap in a second direction perpendicular to the first direction;
 each of the pair of electrodes comprises a cantilevered end, the cantilevered end being warped to exhibit a resting deflection along the first direction; and
 the resting deflection is greater than a thickness of the further electrode.

21. The MEMS transducer of claim 20, wherein the resting deflection falls in a range from about 5 μm to about 50 μm.

22. The MEMS transducer of claim 20, wherein the resting deflections of the pair of electrodes are different.

23. The MEMS transducer of claim 20, wherein the resting deflection of the moveable electrode is such that the cantilevered end of the moveable electrode does not reach or cross a midpoint of the further electrode of the pair of electrodes during operation in a linear regime.

24. The MEMS transducer of claim 20, wherein:
each electrode of the pair of electrodes comprises a respective set of comb fingers, the respective sets of comb fingers being interleaved in a side-by-side arrangement;
the side-by-side arrangement establishes the gap; and
the resting deflection is greater than the gap.

25. The MEMS transducer of claim 20, wherein the moveable electrode comprises a porous plate.

26. The MEMS transducer of claim 20, wherein the further electrode is sufficiently shorter than the moveable electrode in the second direction such that the further electrode is effectively not moveable during the excitation of the moveable electrode.

27. The MEMS transducer of claim 20, wherein the resting deflections are greater than the vibrational movement of the moveable electrode.

28. A microelectromechanical system (MEMS) transducer comprising:
a substrate; and
a pair of electrodes supported by the substrate, the pair of electrodes being configured as a bias electrode-sense electrode couple for the measurement;
wherein:
 a moveable electrode of the pair of electrodes is configured for vibrational movement in a first direction during excitation of the moveable electrode;
 a further electrode of the pair of electrodes is spaced apart from the moveable electrode by a gap in a second direction perpendicular to the first direction;
 the moveable electrode comprises a cantilevered end, the cantilevered end being warped to exhibit a resting deflection along the first direction;
 the further electrode is shorter than the moveable electrode in the second direction; and
 the resting deflection is greater than a thickness of the further electrode of the pair of electrodes.

29. The MEMS transducer of claim 28, wherein:
each electrode of the pair of electrodes comprises a respective set of comb fingers;
the respective sets of comb fingers being interleaved in a side-by-side arrangement;
the moveable electrode comprises a porous plate;
the side-by-side arrangement establishes the gap; and
the resting deflection is greater than the gap.

30. The MEMS transducer of claim 28, wherein:
the resting deflection is greater than the vibrational movement of the moveable electrode; and
the further electrode is sufficiently short such that the further electrode is effectively not moveable during the excitation of the moveable electrode.

* * * * *